(12) United States Patent
Miyashita

(10) Patent No.: US 6,288,610 B1
(45) Date of Patent: Sep. 11, 2001

(54) METHOD AND APPARATUS FOR CORRECTING SIGNALS, APPARATUS FOR COMPENSATING FOR DISTORTION, APPARATUS FOR PREPARING DISTORTION COMPENSATING DATA, AND TRANSMITTER

(75) Inventor: Takumi Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/324,044

(22) Filed: Jun. 2, 1999

Related U.S. Application Data

(63) Continuation-in-part of application No. 09/044,231, filed on Mar. 19, 1998, now abandoned.

(30) Foreign Application Priority Data

Aug. 7, 1998 (JP) .................................. 10-224407

(51) Int. Cl.[7] .................................. H03F 1/26; H03F 1/30
(52) U.S. Cl. ......................... 330/149; 375/296; 375/297
(58) Field of Search ............................ 330/149; 375/296, 375/297

(56) References Cited

U.S. PATENT DOCUMENTS 4,882,547 * 11/1989 Katz ...................................... 330/149
5,023,565 * 6/1991 Lieu ...................................... 330/151

OTHER PUBLICATIONS

Electronics Letters. Apr. 25, 1991, vol. 27, pp. 762–764 "Linearised High–Efficiency Power Amplifier for PCN".

IEEE MTT–S Digest WE3F–7. 0–7803–3246–6/96 (pp. 835–838) "Adaptive Digital Predistorter for Power Amplifiers with Real Time Modeling of Memoryless Complex Gains".

* cited by examiner

Primary Examiner—Michael B Shingleton
(74) Attorney, Agent, or Firm—Armstrong, Westerman, Hattori, McLeland & Naughton LLP

(57) ABSTRACT

An apparatus for correcting signals includes a unit for estimating distortion characteristics in high-frequency circuit portion which estimates distortion characteristics of a high-frequency circuit portion concerning amplitude distortion or phase distortion impairing linearity. The apparatus further includes an input signal processor for applying an amplitude distortion correcting function or phase distortion concerning function, which is calculated on the basis of the result of estimating the distortion characteristics, to an input signal such as low-pass signals.

30 Claims, 29 Drawing Sheets

METHOD AND APPARATUS FOR CORRECTING SIGNALS, APPARATUS FOR COMPENSATING FOR DISTORTION, APPARATUS FOR PREPARING DISTORTION COMPENSATING DATA, AND TRANSMITTER

CROSS-REFERENCE TO RELATED APPLICATIONS

This patent application is a continuation-in-part of patent application Ser. No. 09/044,231 filed on Mar. 19, 1998 and now abandoned.

BACKGROUND OF THE INVENTION

1. Field of the Invention

The present invention relates to a method and apparatus for correcting signals used for a transmitter, an apparatus for compensating for distortion, an apparatus for preparing distortion compensation data, and a transmitter.

To be more specific, the present invention relates to a technique for correcting amplitude distortion or phase distortion impairing linearity and occurring in a high-frequency circuit employed in a transmitter or the like for a portable telephone so as to maintain linearity for the purpose of minimizing power leaking out of channels adjoining each transmission channel, when various kinds of communication are carried out by using a portable telephone, portable information equipment, and information terminal within a communication system such as a local area network (LAN), fiber-to-the-home (FTT), or the like or within a system within which communication is carried out between base stations and mobile stations.

2. Description of the Related Art

A high-frequency circuit employed in a transmitter or the like for portable telephones is required to save a frequency band occupied by each transmission channel or transmission power as much as possible. This makes it difficult to allow tolerance in the frequency band occupied by each transmission channel. A signal of a narrow frequency band must be transmitted over each communication channel for fear the spectrum of signals propagating over communication channels may expand very widely, due to distortion impairing linearity, and occurring in the high-frequency circuit included in the transmitter. For supplying high enough power for the high-frequency circuit including an amplifier to operate while maintaining good linearity, an attempt has been made to correct distortion characteristics of a high-frequency amplifier such as a microwave amplifier, which is highly required to ensure especially good linearity, or a characteristic thereof concerning the distortion impairing the linearity, by utilizing a feed-forward method.

Referring to FIG. 1, which will be described in "Brief Description of the Drawings", the configuration and operations of an apparatus for correcting signals in accordance with the prior art will be described so that problems underlying the apparatus for correcting signals can be easily understood.

FIG. 1 is a circuit block diagram showing an example of the apparatus for correcting signals utilizing the feed-forward method in accordance with the prior art. FIG. 1 schematically shows the circuitry, of the apparatus for correcting signals, that is connected to a high-frequency main amplifier 130, of which the distortion characteristics are the subject for correction, for the purpose of correcting the distortion characteristics concerning the distortion impairing the linearity of an output signal Sout relative to an input signal Sin.

The apparatus for correcting signals shown in FIG. 1 includes a first feed-forward amplifier 100 exhibiting substantially the same distortion characteristic as the main amplifier 130 and requiring little power consumption, and a second feed-forward amplifier 110 and third feed-forward amplifier 130 for almost perfectly canceling out error signal components generated by the first feed-forward amplifier 100.

To be more specific, in the apparatus for correcting signals shown in FIG. 1, the first feed-forward amplifier 100 intentionally produces a distortion signal according to the distortion impairing the linearity and likely to occur in the main amplitude 130. The distortion signal output from the first feed-forward amplifier 100 is attenuated properly by a first attenuating unit 310. A difference between a delayed input signal produced by delaying the input signal Sin by means of a first delay unit 210 and the distortion signal attenuated by the first attenuating unit 310 is calculated and amplified by a second feed-forward amplifier 110.

Furthermore, a signal output from the second feed-forward amplifier 110 is attenuated properly by a second attenuating unit 320. Thereafter, a difference between a delayed input signal produced by delaying the input signal Sin by means of a second delay unit and a distortion signal output from the second attenuating unit 210 is calculated in order to cancel out error signal components almost perfectly. Finally, the difference is amplified by a third feed-forward amplifier 120, and a signal output from the third feed-forward amplifier 120 is supplied to the main amplifier 130.

However, in this case, since it will not occur that the distortion characteristics of a main amplifier are identical to that of a feed-forward amplifier, when an attempt is made to almost perfectly cancel out error signal components generated by the feed-forward amplifier, the conditions for designing a circuit or the circuitry become complex.

Recently, the number of portable telephones or portable information equipment put to use is increasing drastically, and the density of frequencies of a spatial electromagnetic wave utilized by users becomes higher. The frequency band occupied by each communication channel tends to be restricted to a narrower band.

Furthermore, there is a tendency toward using a communication channel permitting a relatively wide frequency band for the purpose of realizing high-speed and large-capacity communication. The spectrum of signals propagating over communication channels therefore expands, whereby the number of intermodulation waves generated by the communication channels increases. Furthermore, the possibility that each communication channel is intercepted by adjoining channels increases.

Even in these circumstances, it is necessary to maintain low power consumption in a transmitter or the like incorporated in a portable telephone or portable information equipment, and to ensure a dynamic range of a transmission output that is wide enough to control transmission power so that reception power can be retained at a necessary minimum level all the time.

In consideration of the recent trends in portable telephone or portable information equipment, even when the method for correcting signals utilizing the feed-forward method in accordance with the prior art is adopted, the conditions for circuit designing or the circuitry required for almost perfectly canceling out error signal components generated by a feed-forward amplifier will become more and more complex. Besides, the scale of a circuit for correcting distortion characteristics will become larger. This poses a problem that power consumption required increases drastically.

Aside from the aforesaid method of correcting a distortion characteristic utilizing the feed-forward method, there are three methods of correcting a distortion characteristics of a high-frequency circuit in accordance with the prior art.

(1) Method Utilizing a Linearlizer

For improving linearity offered by a high-frequency circuit, distorted components which impair the linearity and occur in an amplifier whose distortion characteristics are the subject for correction, are canceled out by using a nonlinear device exhibiting nonlinearity, such as a diode. However, it is technologically difficult to design a circuit including such a nonlinear device in such a manner that the circuit exhibits the same characteristics as a circuit including an amplifier whose distortion characteristics are the subject for correction. Advanced technologies are therefore needed to design a circuit that does not need adjustment to enable modification of the conditions for circuit operations or to cope with the uncertainty in characteristics of a nonlinear device.

(2) Method Utilizing Cartesian Feedback

The linearity to be exhibited by an amplifier whose distortion characteristics are the subject for correction is improved by demodulating an output signal of the amplifier through quadrature demodulation, and feeding back a resultant signal for producing a baseband signal. In this case, the circuitry becomes rather complex.

(3) Method Utilizing a Two-dimensional Coefficient Table and a Predictor While Providing a Learning Ability While a two-dimensional coefficient table is corrected by detecting distortion impairing linearity and occurring in an amplifier, a digital signal processor (DSP) forming a predictor is used to pre-distort a baseband signal. Thus, the baseband signal is corrected. This method utilizing the two-dimensional coefficient table has been disclosed in, for example, literature on a related art entitled "Improvement of Digital Mapping Predistorters for Linearizing Transmitters" written by Qiming Ren and Ingo Wolff (IEEE MTT-S Opening Forum 2, pp.0-7803-4603-6 of 2-52 in CD-ROM, June 1997). The literature on the related art has reported a case in which adjacent channel power (ACP) is reduced by 45 dB or more. In this case, since the distortion impairing the linearity and occurring in an amplifier, should be corrected with high accuracy, the storage capacity of a memory containing the two-dimensional coefficient table gets relatively large and the number of calculations performed by the DSP becomes larger. This results in increased power consumption.

In any of the aforesaid methods of correcting a distortion characteristics of a high-frequency circuit, in accordance with the prior art, the aforesaid problems remain unsolved.

SUMMARY OF THE INVENTION

The present invention attempts to solve the foregoing problems. An object of the present invention is to provide an apparatus for correcting signals capable of, when various kinds of communication are carried out by using a portable telephone, portable information equipment, or an information terminal, reliably suppressing distortion impairing linearity and occurring in a high-frequency circuit including an amplifier and minimizing power leaking out of channels adjoining each communication channel while maintaining low power consumption and having simpler circuitry than a known apparatus, a transmitter having the apparatus for correcting signals, and a method for correcting signals to be implemented in the apparatus for correcting signals.

For solving the aforesaid problems, an apparatus for correcting signals in accordance with the present invention comprises a means for estimating distortion characteristics, in high frequency circuit portion, which estimates distortion characteristics of a high-frequency circuit portion or characteristics thereof concerning distortion impairing linearity; and an input signal processing unit for applying a distortion correcting function, calculated on the basis of the result of estimating the distortion characteristics, to a given input signal, and supplying the input signal to which the distortion correcting function is applied to the high-frequency circuit portion so that the distortion impairing the linearity, and occurring in the high-frequency circuit portion, can be corrected.

Preferably, in an apparatus for correcting signals according to the present invention, an envelope transfer function $g(x)$, whose variable x indicates an input amplitude, is calculated in order to reproduce the distortion characteristics of the high-frequency circuit portion. Based on the envelope transfer function $g(x)$, as the distortion function, an amplitude distortion correcting function $h(x)$ used to correct amplitude distortion impairing linearity, and occurring in the high-frequency circuit portion, is determined so that the relationship of $ax=g(h(x))$ where a is a constant can be established, or a phase distortion correcting function $p(x)$ used to correct phase distortion impairing linearity, and occurring in the high-frequency circuit portion, is determined so that the relationship of $c=g(p(x))$ where c is a constant can be established.

More preferably, an apparatus for correcting signals in accordance with the present invention comprises a means for estimating distortion characteristics in high-frequency circuit portion which estimates distortion characteristics of a high-frequency circuit portion concerning at least one of the amplitude distortion or the phase distortion impairing the linearity, and occurring in the high-frequency circuit portion, and an input signal processing unit for applying at least one of an amplitude distortion correcting function and phase distortion correcting function, which are calculated on the basis of the result of estimating the distortion characteristics, to a given input signal, and supplying the input signal to the high-frequency circuit portion so that at least one of the amplitude distortion or phase distortion impairing linearity, and occurring in the high-frequency circuit portion, can be corrected.

More preferably, in the apparatus for correcting signals according to the present invention, an envelope transfer function $g(x)$, whose variable x indicates an input amplitude, is calculated in order to reproduce the distortion characteristics of the high-frequency circuit portion. Based on the envelope transfer function $g(x)$, an amplitude distortion correcting function $h(x)$ used to correct the amplitude distortion impairing the linearity, and occurring in the high-frequency circuit portion, is determined so that the relationship of $ax=g(h(x))$ where a is a constant can be established, or a phase distortion correcting function $p(x)$ used to correct the phase distortion impairing the linearity, and occurring in the high-frequency circuit portion, is determined so that the relationship of $c=g(p(x))$ where c is a constant can be established.

More preferably, in an apparatus for correcting signals according to the present invention, an approximate expression of the envelope transfer function $g(x)$, whose variable x indicates an input amplitude and which reproduces the distortion characteristics of the high-frequency circuit portion, is defined as $g(x)=a_0+a_1x+g'(x)$ where $a_0$ and $a_1$ are variables and $g'(x)$ is a polynomial. The amplitude distortion correcting function is expressed as $x \times (1-g'(x)/g(x))$.

More preferably, in an apparatus for correcting signals according to the present invention, the constant $a_0$ is set to 0 (zero).

More preferably, in an apparatus for correcting signals according to the present invention, the polynomial g'(x) in the envelope transfer function $g(x)=a_0+a_1x+g'(x)$ is defined as $g'(x)=\Sigma_{i=2}^{N} a_i x^i$ where i and N are positive integers equal to or larger than 2 and $a_i$ is a constant.

More preferably, in an apparatus for correcting signals according to the present invention, only terms of odd-numbered orders of the polynomial $g'(x)=\Sigma_{i=2}^{N} a_i x^i$ are employed.

More preferably, in an apparatus for correcting signals according to the present invention, the input signal is low-pass signals passed by low-pass filters defined on the basis of the result of estimating the distortion characteristics. Frequencies relevant to the phase distortion correcting function p(x) to be applied to the low-pass signals are raised in order to produce an intermediate-frequency or high-frequency signal for the purpose of correcting the phase distortion impairing the linearity, and occurring in the high-frequency circuit portion.

More preferably, in an apparatus for correcting signals according to the present invention, when frequencies relevant to the phase distortion correcting function p(x) to be applied to the input signal are raised by performing digital modulation, signals passed by transmission filters exhibiting root Nyquist characteristics are used as the input signal.

More preferably, in an apparatus for correcting signals according to the present invention, when frequencies relevant to the phase distortion correcting function p(x) to be applied to the input signal are raised by performing quadrature modulation, a real-part signal and an imaginary-part signal constituting a complex-number signal and passed by low-pass filters, that exhibit root Nyquist characteristics and are defined on the basis of the result of estimating the distortion characteristics, are used as the input signal.

More preferably, in an apparatus for correcting signals according to the present invention, the input signal is low-pass signals passed by low-pass filters defined on the basis of the result of estimating the distortion characteristics. After the frequencies of the low-pass signals are raised, the low-pass signals are input to a first amplifier in the high-frequency circuit portion. After frequencies relevant to the phase distortion correcting function to be applied to low-pass signals that are substantially identical to the low-pass signals are raised, the low-pass signals are input to a second amplifier in the high-frequency circuit portion. Output signals of the first amplifier and second amplifier are added in order to produce an output signal containing a small number of amplitude distortion components impairing the linearity thereof.

More preferably, in an apparatus for correcting signals according to the present invention, the second amplifier substantially causes no distortion. The phase distortion impairing the linearity, and occurring in the first amplifier alone, is corrected.

More preferably, in an apparatus for correcting signals according to the present invention, the phase distortion impairing the linearity, and occurring in the first amplifier, is corrected, and the phase distortion impairing the linearity, and occurring in the second amplifier, is also corrected.

More preferably, in an apparatus for correcting signals according to the present invention, the input signal is low-pass signals passed by low-pass filters defined on the basis of the result of estimating the distortion characteristics. After the frequencies of the low-pass signals are raised, the low-pass signals are input to a first amplifier in the high-frequency circuit portion. After frequencies relevant to the amplitude distortion correcting function to be applied to low-pass signals that are substantially identical to the low-pass signals are raised, the low-pass signals are input to a second amplifier in the high-frequency circuit portion. Output signals of the first amplifier and second amplifier are added in order to produce an output signal containing a small number of amplitude distortion components impairing the linearity thereof.

More preferably, in an apparatus for correcting signals according to the present invention, the second amplifier substantially causes no distortion. The amplitude distortion impairing the linearity, and occurring in the first amplifier alone, is corrected.

More preferably, in an apparatus for correcting signals according to the present invention, the amplitude distortion impairing the linearity, and occurring in the first amplifier, is corrected, and the amplitude distortion impairing the linearity, and occurring in the second amplifier is also corrected.

More preferably, in an apparatus for correcting signals according to the present invention, the input signal is low-pass signals passed by low-pass filters defined on the basis of the result of estimating the distortion characteristics. An amplitude distortion correcting function to be applied to the low-pass signals is calculated. Frequencies relevant to a phase distortion correcting function mated with the amplitude distortion correcting function are raised in order to produce an intermediate-frequency or high-frequency signal for the purpose of correcting the eamplitude distortion and the phase distortion impairing the linearity, and occurring in the high-frequency circuit portion.

More preferably, in an apparatus for correcting signals according to the present invention, the envelope transfer function g(x) is a function including a table function. At least one of the amplitude distortion correcting function h(x) and phase distortion correcting function p(x) is an expansion composed of a polynomial series. Coefficients in terms of orders of the expansion are calculated, and thus at least one of the amplitude distortion correcting function h(x) and phase distortion correcting function p(x) is calculated.

More preferably, in an apparatus for correcting signals according to the present invention, at least one of the amplitude distortion correcting function h(x) and phase distortion correcting function p(x) is fixed.

More preferably, in an apparatus for correcting signals according to the present invention, when a plurality of high-frequency circuit portions are included, at least one of the amplitude distortion correcting function h(x) and the phase distortion correction function p(x) is fixed for each high-frequency circuit portion, or for each group of high-frequency circuit portions produced under the resembling conditions for manufacturing a high-frequency circuit portion.

More preferably, in an apparatus for correcting signals according to the present invention, while the high-frequency circuit portion is in operation, the envelope transfer function g(x) is calculated intermittently or all the time. Based on the result of calculating the envelope transfer function g(x), at least one of the amplitude distortion correcting function h(x) and phase distortion correcting function p(x) is modified.

According to the present invention, there is provided a transmitter comprising an apparatus for correcting signals including a means for estimating distortion characteristics in a high-frequency circuit portion which estimates distortion characteristics of a high-frequency circuit portion concerning distortion impairing linearity; and an input signal processing unit for applying a distortion correcting function, calculated on the basis of the result of estimating the distortion characteristic, to a given input signal, and supplying the input signal to the high-frequency circuit portion so that the distortion impairing the linearity, and occurring in the high-frequency circuit portion, can be corrected. The high-frequency circuit portion transmits a signal of a specified frequency band having the distortion impairing the linearity thereof corrected.

More particularly, according to the present invention, there is provided a transmitter comprising an apparatus for correcting signals including a means for estimating distortion characteristics in high-frequency circuit portion which estimates distortion characteristics of a high-frequency circuit portion concerning at least one of amplitude distortion and phase distortion impairing linearity; and an input signal processing unit for applying at least one of an amplitude distortion correcting function and phase distortion correcting function, calculated on the basis of the result of estimating the distortion characteristics, to a given input signal, and supplying the input signal to the high-frequency circuit portion so that at least one of the amplitude distortion and the phase distortion impairing the linearity, and occurring in the high-frequency circuit portion, can be corrected. The high-frequency circuit portion transmits a signal of a specified frequency band having at least one of the amplitude distortion and the phase distortion impairing the linearity thereof corrected.

More preferably, according to the present invention, there is provided a transmitter, comprising an apparatus for correcting signals, including a means for estimating distortion characteristics in high-frequency circuit portion which estimates distortion characteristics of a narrow-band amplifier concerning at least one of amplitude distortion and phase distortion impairing linearity; and an input signal processing unit for inputting, as an input signal, low-pass signals which are characterized to have given low frequencies by means of digital filters defined on the basis of the result of estimating the distortion characteristics, and appending distortion components, which are reproduced according to the distortion characteristics, to the input signal so that at least one of the amplitude distortion and the phase distortion impairing the linearity, and occurring in the narrow-band amplifier, can be corrected. The input signal to which the distortion components are appended is multiplied by a carrier wave for digital modulation, and then supplied to the narrow-band amplifier. The narrow-band amplifier transmits a signal of a specified frequency band, which has at least one of the amplitude distortion and the phase distortion impairing the linearity thereof corrected.

More preferably, according to the present invention, there is provided a transmitter, comprising an apparatus for correcting signals, including a means for estimating distortion characteristics in high-frequency circuit portion which estimates distortion characteristics of a narrow-band amplifier concerning at least one of amplitude distortion and phase distortion impairing linearity; and an input signal processing unit for inputting, as an input signal, a real-part signal and imaginary-part signal constituting a complex-number signal and characterized to have given low frequencies by means of low-pass filters defined on the basis of the result of estimating the distortion characteristics, and appending distortion components including components, which are reproduced according to the distortion characteristics and represent a function of an absolute value of the complex-number signal or a function of a sum of squares of the real-part signal and imaginary-part signal, to the input signal, so that at least one of the amplitude distortion and the phase distortion impairing the linearity, and occurring in the narrow-band amplifier, can be corrected. The input signal to which the distortion components are appended is subjected to digital quadrature modulation, and then supplied to the narrow-band amplifier. The narrow-band amplifier transmits a signal of a specified frequency band having at least one of the amplitude distortion and the phase distortion impairing the linearity thereof corrected.

In a method for correcting signals in accordance with the present invention, a distortion characteristic of a high-frequency circuit portion concerning the distortion impairing the linearity is estimated, a distortion correcting function, calculated on the basis of the result of estimating the distortion characteristics, is applied to a given input signal, and the input signal to which the distortion correcting function is applied is supplied to the high-frequency circuit portion in order to correct the distortion impairing the linearity, and occurring in the high-frequency circuit portion.

Furthermore, in a method for correcting signals in accordance with the present invention, distortion characteristics of a high-frequency circuit portion concerning at least one of the amplitude distortion and the phase distortion impairing the linearity is estimated, at least one of an amplitude distortion correcting function and phase distortion correcting function, calculated on the basis of the result of estimating the distortion characteristics, is applied to a given input signal, and the input signal to which at least one of the amplitude distortion correcting function and phase distortion correcting function is applied is supplied to the high-frequency circuit portion in order to correct at least one of the amplitude distortion and the phase distortion impairing the linearity, and occurring in the high-frequency circuit portion.

On the other hand, the apparatus for compensating for distortion of the present invention to which an in-phase component and an orthogonal component that have been filtered by a low-pass filter, are supplied, having a function of previously distorting the in-phase component and the orthogonal component so that non-linearity of a power amplifier arranged on the downstream side can be improved. The above apparatus comprises an absolute value calculating unit for calculating an intensity of vector; and a predistortion unit in which a function obtained when a predetermined predistortion function is divided by the above intensity of the vector is used or its reference table is used, for multiplying an output of the low-pass filter by the function.

Further, the apparatus for preparing distortion compensation data of the present invention is used for an apparatus for compensating for distortion by which an input amplitude of a signal on the upstream side of the power amplifier is previously distorted to a value of the predistortion function so as to improve non-linearity of the power amplifier. When an output amplitude with respect to an input amplitude of the power amplifier is expressed by a function, the predistortion function is made to be approximate to a power development of the amplitude of the input, and the power development coefficient is given an initial value, so that the amplitude of the input is an amplitude of an intermodulation wave of a base band signal of an angular frequency. The power development coefficient of the predistortion function is determined so that an absolute value of a ratio of the secondary Fourier coefficient of the function with respect to the primary Fourier coefficient can be substantially a minimum. Further, the apparatus for preparing distortion compensation data of the present invention comprises a processor.

In summary, according to the present invention, the fact that distortion characteristics of a high-frequency circuit portion concerning at least one of the amplitude distortion and the phase distortion impairing the linearity, and occurring in the high-frequency circuit portion, can be reproduced using low-pass signals produced by a simple circuit, is utilized effectively. A signal correcting circuit whose high-frequency circuit portion is smaller than that in a known signal correcting circuit and whose adjustment portion is also smaller is used to calculate a distortion correcting function based on the distortion characteristics. For carrying out various kinds of communication using a portable telephone, portable information equipment, or an information terminal, with low power consumption maintained, despite the circuitry being much simpler than the conventional circuitry, the distortion impairing the linearity, and occurring in the high-frequency circuit, can be reliably suppressed, and power leaking out of channels adjoining each communication channel can be minimized. Eventually, highly reliable communication can be achieved.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Referring to the appended drawings (FIGS. 2 to 31), a fundamental embodiment and preferred embodiments of the present invention will be described below.

Figure 1:
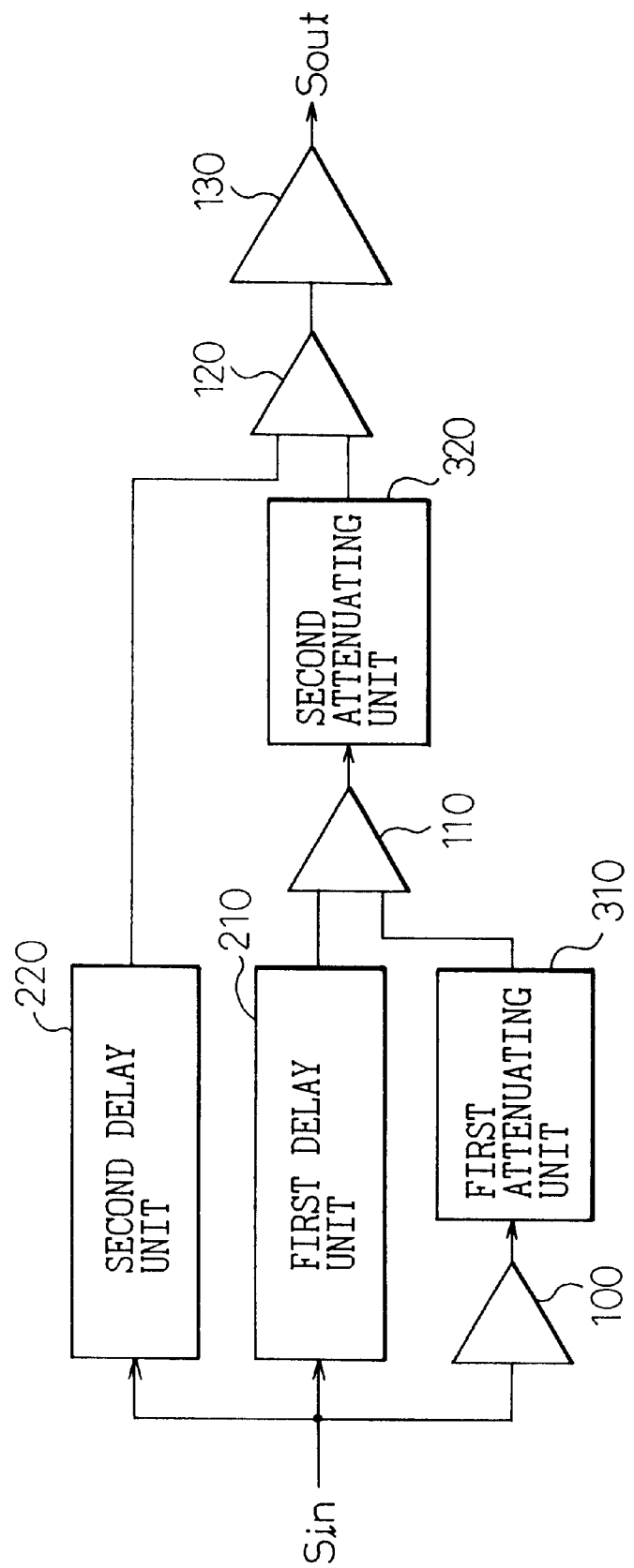
FIG. 1 is a circuit block diagram showing an example of an apparatus for correcting signals in accordance with the prior art.
Figure 2:
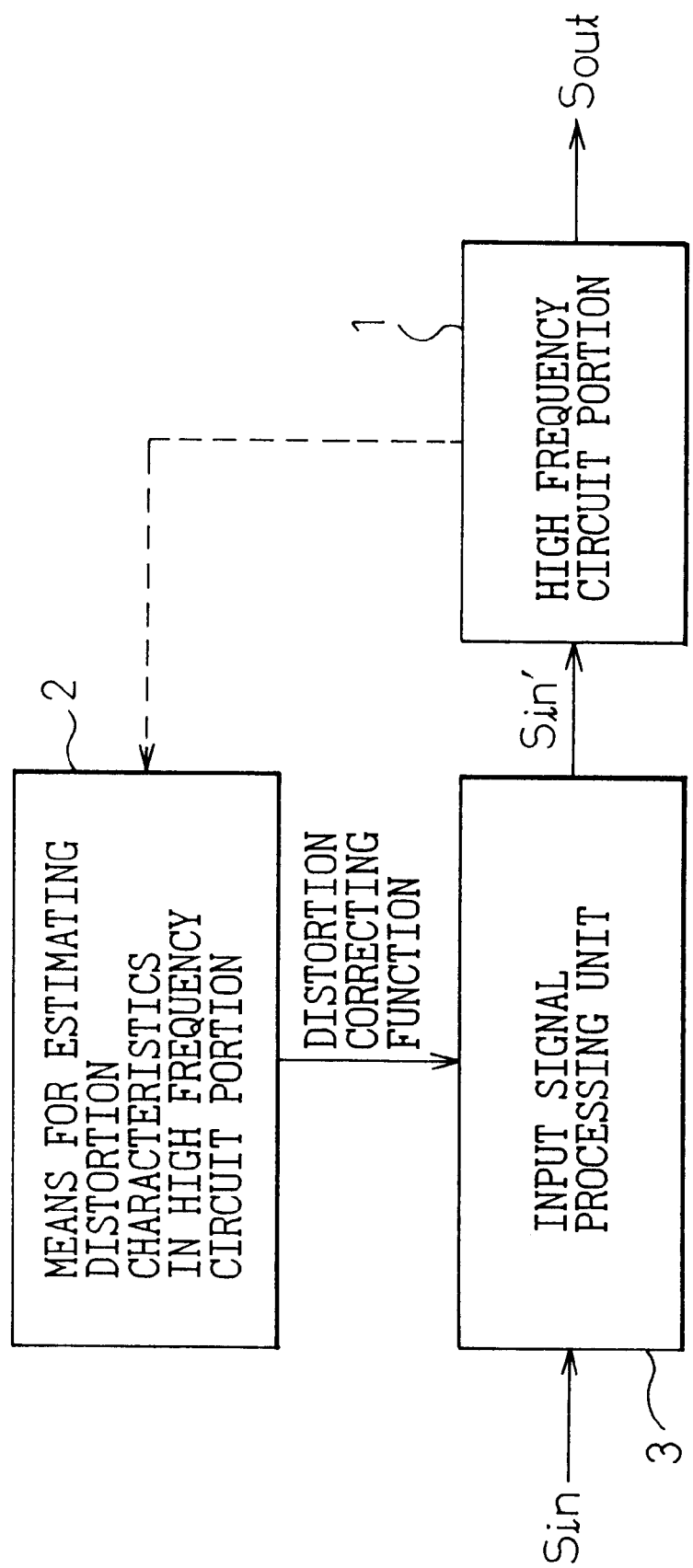
FIG. 2 is a block diagram showing the configuration of a fundamental embodiment based on the principles of the present invention.

FIG. 2 is a block diagram showing the configuration of a fundamental embodiment based on the principles of the present invention. The fundamental embodiment according to which distortion characteristics of a high-frequency circuit, which has a high-frequency circuit portion 1 including a high-frequency amplifier, or characteristics thereof concerning distortion impairing the linearity of an output signal Sout relative to an input signal Sin is corrected will be described below.

As shown in FIG. 2, an apparatus for correcting signals in accordance with the present invention comprises a means for estimating distortion characteristics in high-frequency circuit portion which estimates distortion characteristics of the high-frequency circuit portion 1 concerning the distortion impairing the linearity, and an input signal processing unit 3 for applying a distortion correcting function, which is calculated on the basis of the result of estimating the distortion characteristics, to a given input signal, and supplying the input signal Sin', to which the distortion correcting function is applied, to the high-frequency circuit portion so that the distortion impairing the linearity, and occurring in the high-frequency circuit portion, can be corrected.

Preferably, in an apparatus for correcting signals according to the fundamental embodiment of the present invention, an envelope transfer function g(x), whose variable x indicates an input amplitude, is calculated in order to reproduce the distortion characteristics of the high-frequency circuit portion. As the distortion correcting function, based on the envelope transfer function g(x), an amplitude distortion correcting function h(x) used to correct amplitude distortion impairing the linearity and occurring in the high-frequency circuit portion is determined so that the relationship of ax=g(h(x)) where a is a constant can be established, or a phase distortion correcting function p(x) used to correct phase distortion impairing the linearity, and occurring in the high-frequency circuit portion, is determined so that the relationship of c=g(p(x)) where c is a constant can be established.

More preferably, an apparatus for correcting signals in accordance with the fundamental embodiment of the present invention comprises a means for estimating distortion characteristics in high-frequency circuit portion which estimates distortion characteristics of a high-frequency circuit portion concerning at least one of the amplitude distortion and the phase distortion impairing the linearity, and an input signal processing unit for applying at least one of an amplitude distortion correcting function and phase distortion correcting function, which are calculated on the basis of the result of estimating the distortion characteristics, to a given input signal, and supplying the input signal to the high-frequency circuit portion so that at least one of the amplitude distortion and the phase distortion impairing linearity, and occurring in the high-frequency circuit portion, can be corrected.

More preferably, in an apparatus for correcting signals according to the fundamental embodiment of the present invention, an envelope transfer function g(x), whose variable x indicates an input amplitude, is calculated in order to reproduce the distortion characteristics of the high-frequency circuit portion. Based on the envelope transfer function g(x), an amplitude distortion correcting function h(x) used to correct the amplitude distortion impairing the linearity, and occurring in the high-frequency circuit portion, is determined so that the relationship of ax=g(h(x)) where a is a constant can be established, or a phase distortion correcting function p(x) used to correct the phase distortion impairing the linearity, and occurring in the high-frequency circuit portion, is determined so that the relationship of c=g(p(x)) where c is a constant can be established.

More preferably, in an apparatus for correcting signals according to the fundamental embodiment of the present invention, an approximate expression of the envelope transfer function g(x), whose variable x indicates an input amplitude, is defined as $g(x)=a_0+a_1 x+g'(x)$ where $a_0$ and $a_1$ are constants and $g'(x)$ is a polynomial. The amplitude distortion correcting function is defined as $x \times (1-g'(x)/g(x))$.

More preferably, in an apparatus for correcting signals according to the fundamental embodiment of the present invention, the constant $a_0$ is set to 0.

More preferably, in an apparatus for correcting signals according to the fundamental embodiment of the present invention, the polynomial $g'(x)$ in the envelope transfer function $g(x)=a_0+a_1 x+g'(x)$ is defined as $g'(x)=\Sigma_{i=2}^{N} a_i x^i$ where i and N are positive integers equal to or larger than 2 and $a_i$ is a constant.

More preferably, in an apparatus for correcting signals according to the fundamental embodiment of the present invention, only terms of odd-numbered degrees of the polynomial $g'(x)=\Sigma_{i=2}^{N} a_i x^i$ are employed.

More preferably, in an apparatus for correcting signals according to the fundamental embodiment of the present invention, the input signal is low-pass signals passed by low-pass filters defined on the basis of the result of estimating the distortion characteristics. Frequencies relevant to the phase distortion correcting function p(x) to be applied to the low-pass signals are raised in order to produce an intermediate-frequency or high-frequency signal for the purpose of correcting the phase distortion impairing the linearity, and occurring in the high-frequency circuit portion.

More preferably, in an apparatus for correcting signals according to the fundamental embodiment of the present invention, when frequencies relevant to the phase distortion correcting function p(x) to be applied to the input signal are raised by performing digital modulation, signals passed by transmission filters exhibiting root Nyquist characteristics are used as the input signal.

More preferably, in an apparatus for correcting signals according to the fundamental embodiment of the present invention, when frequencies relevant to the phase distortion correcting function p(x) to be applied to the input signal are raised by performing quadrature modulation, a real-part signal and an imaginary-part signal constituting a complex-number signal and passed by low-pass filters, that are defined on the basis of the result of estimating the distortion characteristics and exhibit root Nyquist characteristics, are used as the input signal.

More preferably, in an apparatus for correcting signals according to the fundamental embodiment of the present invention, the input signal is low-pass signals passed by low-pass filters defined on the basis of the result of estimating the distortion characteristics. After the frequencies of the low-pass signals are raised, the low-pass signals are input to a first amplifier in the high-frequency circuit portion. After frequencies relevant to the phase distortion correcting function to be applied to low-pass signals that are substantially identical to the low-pass signals are raised, the low-pass signals are input to a second amplifier in the high-frequency circuit portion. Output signals of the first amplifier and second amplifier are added in order to produce an output signal containing a small number of amplitude distortion components impairing the linearity.

More preferably, in an apparatus for correcting signals according to the fundamental embodiment of the present invention, the second amplifier causes substantially no distortion. The phase distortion impairing the linearity and occurring in the first amplifier alone is corrected.

More preferably, in an apparatus for correcting signals according to the fundamental embodiment of the present invention, phase distortion impairing linearity and occurring in the first amplifier is corrected, and phase distortion impairing linearity and occurring in the second amplifier is also corrected.

More preferably, in an apparatus for correcting signals according to the fundamental embodiment of the present invention, the input signal is low-pass signals passed by low-pass filters defined on the basis of the result of estimating the distortion characteristics. After the frequencies of the low-pass signals are raised, the low-pass signals are input to a first amplifier in the high-frequency circuit portion. After frequencies relevant to the amplitude distortion correcting function to be applied to low-pass signals that are substantially identical to the low-pass signals are raised, the low-pass signals are input to a second amplifier in the high-frequency circuit portion. Output signals of the first amplifier and second amplifier are added up in order to produce an output signal containing a small number of amplitude distortion components impairing the linearity.

More preferably, in an apparatus for correcting signals according to the fundamental embodiment of the present invention, the second amplifier causes substantially no distortion, and the amplitude distortion impairing the linearity, and occurring in the first amplifier alone, is corrected.

More preferably, in an apparatus for correcting signals according to the fundamental embodiment of the present invention, the amplitude distortion impairing the linearity, and occurring in the first amplifier, is corrected, and the amplitude distortion impairing the linearity, and occurring in the second amplifier, is also corrected.

More preferably, in an apparatus for correcting signals according to the fundamental embodiment of the present invention, the input signal is low-pass signals passed by low-pass filters defined on the basis of the result of estimating the distortion characteristics. An amplitude distortion correcting function to be applied to the low-pass signals is calculated. Frequencies relevant to a phase distortion correcting function mated with the amplitude distortion correction function are raised in order to produce an intermediate-frequency or high-frequency signal for the purpose of correcting the amplitude distortion and the phase distortion impairing the linearity, and occurring in the high-frequency circuit portion.

More preferably, in an apparatus for correcting signals according to the fundamental embodiment of the present invention, the envelope transfer function g(x) is a function including a table function. At least one of the amplitude distortion correcting function h(x) and phase distortion correcting function p(x) is an expansion consisting of a polynomial series. Coefficients in the terms of orders of the expansion are calculated, and thus at least one of the amplitude distortion correcting function h(x) and phase distortion correcting function p(x) is calculated.

More preferably, in an apparatus for correcting signals according to the fundamental embodiment of the present invention, at least one of the amplitude distortion correcting function h(x) and phase distortion correcting function p(x) is fixed.

More preferably, in an apparatus for correcting signals according to the fundamental embodiment of the present invention, when a plurality of high-frequency circuit portions are included, at least one of the amplitude distortion correcting function h(x) and phase distortion correcting function p(x) is fixed for each high-frequency circuit portion or for each group of high-frequency circuit portions produced under similar conditions for manufacturing a high-frequency circuit portion.

More preferably, in an apparatus for correcting signals according to the fundamental embodiment of the present invention, when the high-frequency circuit portion is in operation, the envelope transfer function g(x) is calculated intermittently or all the time. Based on the result of calculating the envelope transfer function g(x), at least one of the amplitude distortion correcting function h(x) and phase distortion correcting function p(x) is modified.

According to the fundamental embodiment of the present invention, in an apparatus for correcting signals, a transmitter having the apparatus for correcting signals, and a method for correcting signals using the apparatus for correcting signals, based on the result of estimating distortion characteristics of a high-frequency circuit including the high-frequency circuit portion 1, an amplitude distortion correcting function or phase distortion correcting function effective in correcting the amplitude distortion or the phase distortion occurring in the high-frequency circuit can be easily calculated by using low-pass filters or the like defined by the means for estimating distortion characteristics in high-frequency circuit portion 2. For example, an envelope transfer function g(x) which reproduces the distortion characteristics of the high-frequency circuit concerning the amplitude distortion impairing the linearity and of which variable x indicates an input amplitude can be provided using the approximate expression (1):

$$g(x) = \sum_{i=1}^{N} a_i x^i \quad (1)$$

where N is an integer equal to or larger than 2.

To be more specific, a first method for correcting signals to be implemented in an apparatus for correcting signals in accordance with the present invention is such that nonlinear distortion components provided by the polynomial (1), that is, by the second-order and succeeding terms of the polynomial are subtracted from an output signal of a high-frequency circuit. As a more practical method, there is a method where the frequencies of the distortion components alone are raised (or up-converted) then, if necessary, passed by an amplifier separate from a main amplifier whose distortion characteristics are the subject for correction, and then subtracted from an output signal of the main amplifier.

In contrast, a second method for correcting signals, which is to be implemented in an apparatus for correcting signal in accordance with the present invention, is such that, assuming that a function of a certain input signal is h(x) (that is, an amplitude distortion correcting function), the amplitude distortion correcting function h(x) is calculated so that the function g(h(x)) defined by the polynomial (1) can reproduce given distortion characteristics. The phrase "the amplitude distortion correcting function h(x) is calculated so that the function g(h(x)) defined by the polynomial (1) can reproduce given distortion characteristics" means that, for example, when adjacent channel power ACP poses a problem, the function g(h(x)) is used to carry out simulation so as to measure the adjacent channel power ACP, and an approximate expression of the function h(x) minimizing the adjacent channel power ACP is calculated. Another meaning is that the function h(x) minimizing (that is, nearly minimizing) b(x)−g(h(x)) where b(x) indicates a target linear relationship of the variable x is calculated. Herein, b(x) can be modified properly. Since the application of the amplitude distortion correcting function h(x) is accompanied by predistortion of an input signal for correcting distortion characteristics of a high-frequency circuit, the amplitude distortion correcting function h(x) may be referred to as a predistortion amplitude function.

In this case, a harmonic-balance method, modeling of a frequency range using a Volterra series, or time domain simulation can be adopted as a method of carrying out simulation for measuring adjacent channel power ACP. For calculating approximate values of the amplitude distortion correcting function h(x), the adoption of a diving method based on the least mean squares (LMS) method or a delta rule would prove convenient.

According to the fundamental embodiment of the present invention, the fact that distortion characteristics of a high-frequency circuit concerning the distortion impairing the linearity can be reproduced by using low-pass signals or the like produced by a simple circuit, is utilized effectively. A signal correcting circuit, whose high-frequency circuit portion and adjustment portion are smaller than those of a known signal correcting circuit is used to calculate a distortion correcting function based on the distortion characteristics. For carrying out various kinds of communication using a portable telephone, portable information equipment, or an information terminal, with low power consumption maintained and with circuitry much simpler than the known circuitry, the distortion impairing the linearity, and occurring in the high-frequency circuit, can be suppressed reliably and power leaking out of channels adjoining each communication channel can be minimized. Eventually, highly reliable communication can be achieved.

Figure 17:
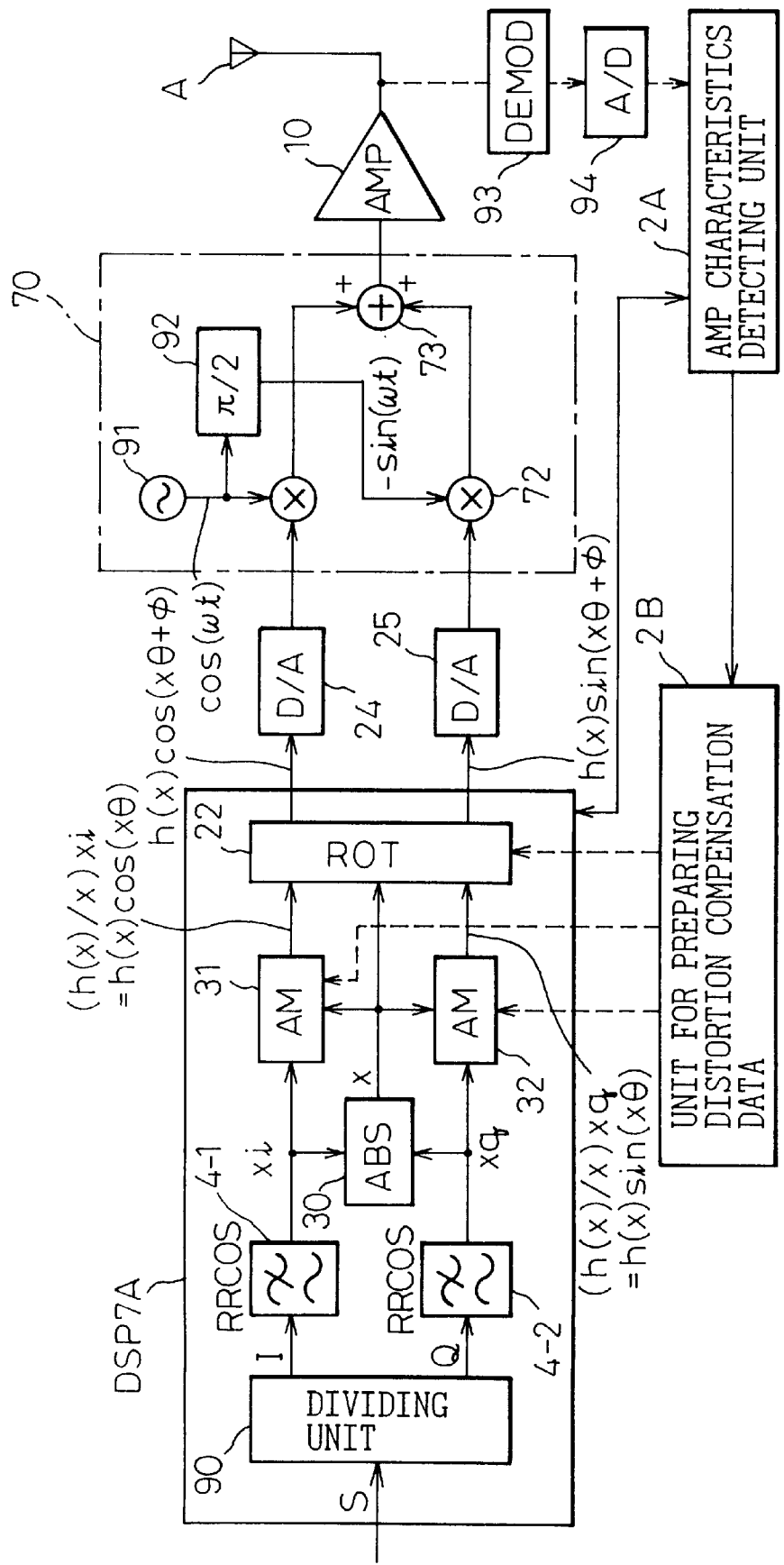
FIG. 17 is a block diagram showing another transmitter of the present invention.

According to another preferred embodiment of the present invention, as shown in FIG. 17 described later, an apparatus for compensating for distortion comprises: an absolute value calculating unit (30) to which an in-phase component xi and an orthogonal component xq, which have been filtered by a low-pass filter, are supplied, having a function of previously distorting the in-phase component and the orthogonal component so that non-linearity of a power amplifier arranged on the downstream side can be improved, the absolute value calculating unit (30) calculating an intensity of vector (xi, xq); and a predistortion unit (31, 32) in which a function h(x)/x obtained when a predetermined predistortion function h(x) is divided by the above intensity x is used or its reference table is used, for multiplying the output xi, xq of the low-pass filter.

According to the above apparatus for compensating for distortion, the following effects can be provided. When function h(x)/x is multiplied by the in-phase component xi and the orthogonal component xq in accordance with the intensity x of the vector of the in-phase component xi and the orthogonal component xq, predistortion can be easily and accurately conducted.

Figure 15:
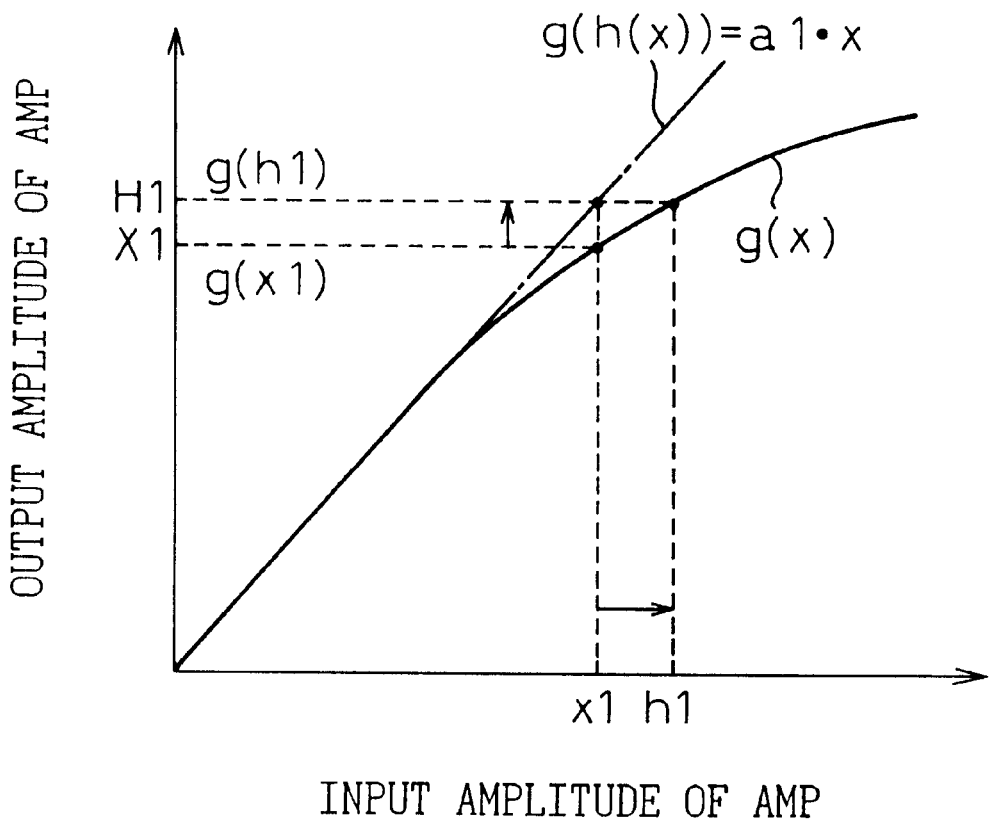
FIG. 15 is a graph showing a relationship between an input amplitude and an output amplitude of a power amplifier.

It is preferable that the above apparatus for compensating for distortion comprises a phase pre-rotation unit (22) in which, for example, as shown in FIG. 15, a predetermined function $\phi(x)$ or its reference table is used, and the vector (xi, xq) or the vector ((h/x)xi, (h/x)xq) generated in the above predistortion unit is rotated by angle $\phi(x)$.

According to the above apparatus for compensating for distortion, the following effects can be provided. When the vector (the in-phase component, the orthogonal component) is rotated by $\phi(x)$ according to the intensity x of the vector of the in-phase component xi and the orthogonal component xq, phase pre-rotation can be easily and accurately conducted.

Further, in the digital signal processor of the present invention, the above function of the apparatus for compensating for distortion is realized by a program.

As shown in FIG. 17 described later, the transmitter of the present invention comprises: an apparatus (22, 31, 32) for compensating for distortion described in claim 30 or 31; an orthogonal modulation circuit (70) for orthogonally modulating carrier waves by the in-phase component and the orthogonal component which have passed through the apparatus for compensating for distortion; and a power amplifier (10) for amplifying orthogonally modulated waves sent from the orthogonal modulation circuit.

Further, the transmitter of the present invention comprises: an amplifying characteristics detecting unit for detecting a relation between an input amplitude and an output amplitude of the power amplifier; and a unit for preparing distortion compensation data for determining the function h(x)/x or the reference table according to the relation.

Further, the apparatus for preparing distortion compensation data of the transmitter of the present invention, the function h(x)/x or the reference table is determined so that the function g(h(x)) can be proportional to x, wherein the output amplitude with respect to the input amplitude x of the power amplifier is expressed by the function g(x).

According to the above transmitter, it is possible to determine an accurate function h(x) for conducting distortion compensation.

Further, the section for preparing distortion compensation data of the present invention comprises a processor characterized in that: when the output amplitude with respect to the input amplitude x of the power amplifier is expressed by the function g(x), the predistortion function h(x) is made to be approximate to a power development of the amplitude x; the power development coefficients c1 to cn are given initial values; the amplitude x is made to be an amplitude of the intermodulation wave of the base band signals, the angular frequencies of which are $\omega 1$ and $\omega 2$; and the power development coefficients c1 to cn of the predistortion function h(x) are determined so that an absolute value $\epsilon$ of the ratio of the primary Fourier coefficient of the function g(h(x)) to the second Fourier coefficient can be substantially locally minimum.

According to the transmitter of the present invention, the following effects can be provided. When the correction of nonlinearity of the power amplifier is appropriately conducted, the predistortion function h(x) for increasing the average transmitting power so that leakage power (power of the side lobe) to an adjacent channel cannot exceed an allowable value, can be easily and effectively obtained.

It is preferable that the unit for preparing distortion compensation data determines the amplitude of the intermodulation wave according to the maximum value of the input amplitude of the power amplifier.

According to the above transmitter, it is possible to obtain the predistortion function h(x) capable of preventing the clipping of the output of the power amplifier and also capable of further increasing the output of the power amplifier.

In the transmitter of the present invention, a step in which an absolute value $\epsilon$ of the ratio is calculated and the coefficients c1 to cn are changed by the method of steepest descent is repeated until the absolute value $\epsilon$ of the ratio is decreased to a value lower than a predetermined value.

In the transmitter of the present invention, the amplifier characteristics detection unit detects a slippage of the phase of the output from that of the input when the input amplitude of the power amplifier is x, and the unit for preparing distortion compensation data further determines a function $\phi(x)$ for expressing a slippage of the phase or determines its reference table.

The apparatus for preparing distortion compensation data of the present invention comprises a processor characterized in that: for example, as shown in FIG. 17 described later, in order to improve nonlinearity of the power amplifier, the processor is used for a distortion compensation device in which the amplitude x of a signal on the upstream side of the power amplifier is previously distorted to a value of the predistortion function h(x); when the output amplitude with respect to the input amplitude x of the power amplifier is expressed by the function g(x), the predistortion function h(x) is made to be approximate to a power development of the amplitude x; the power development coefficients c1 to cn are given initial values; the amplitude x is made to be an amplitude of the intermodulation wave of the base band signals, the angular frequencies of which are ω1 and ω2; and the power development coefficients c1 to cn of the predistortion function h(x) are determined so that an absolute value ε of the ratio of the primary Fourier coefficient of the function g(h(x)) to the second Fourier coefficient can be substantially a local minimum.

In the apparatus for preparing distortion compensation data of the present invention, an amplitude of the intermodulation wave is determined according to the maximum value of the input amplitude of the power amplifier.

Figure 3:
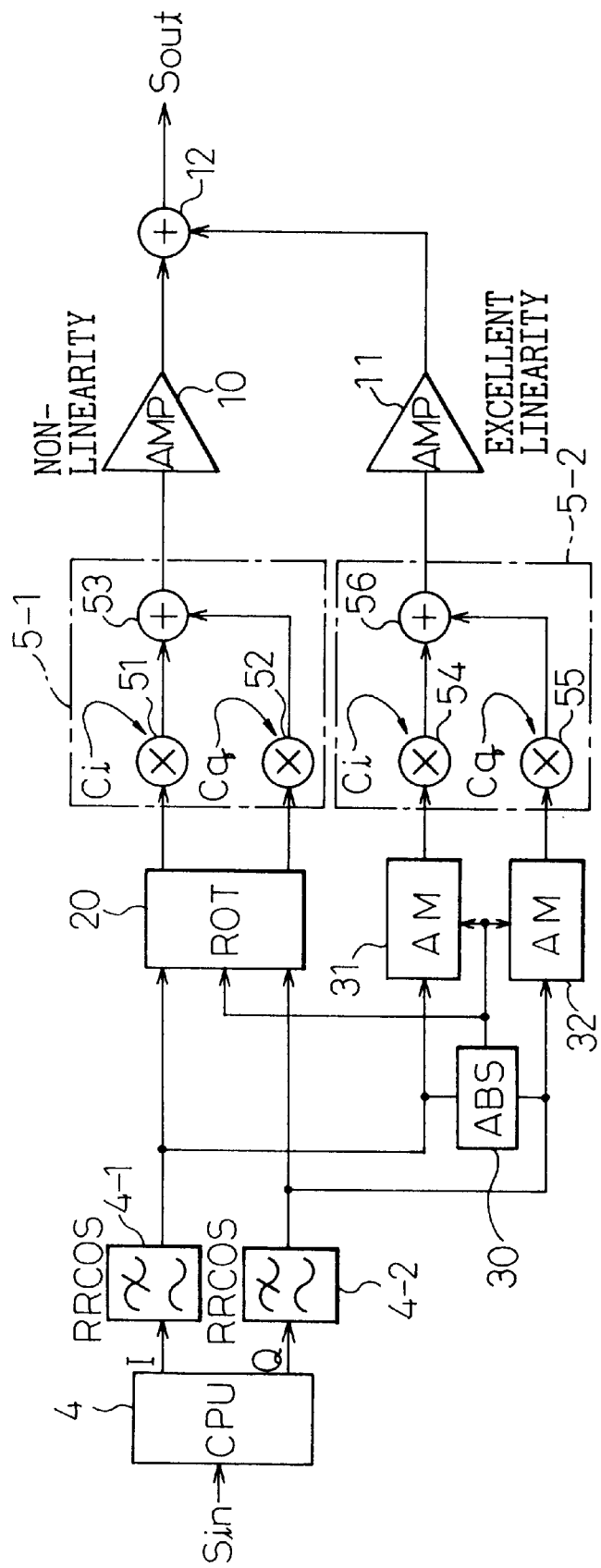
FIG. 3 is a circuit block diagram showing a first preferred embodiment of the present invention.

FIG. 3 is a circuit block diagram showing the first preferred embodiment of the present invention. Shown, as an example, is the circuitry in which the amplitude distortion or the phase distortion impairing the linearity, and occurring in a main amplitude 10 exhibiting nonlinearity serving as a high-frequency circuit whose distortion characteristics are the subject for correction, is corrected. Hereinafter, the same reference numerals will be assigned to components identical to those described previously.

In FIG. 3, the means for estimating distortion characteristics in high-frequency circuit portion 2 (See FIG. 2) which estimate distortion characteristics of the main amplifier 10 concerning the phase distortion impairing the linearity is realized by a central processing unit (CPU) 41 included in a computer system. In the CPU 41, an approximate function of an envelope transfer function g(x) whose variable x indicates an input amplitude is defined as $g(x)=a_0+a_1x+g'(x)$ (where $a_0$ and $a_1$ are constants) in order to reproduce the distortion characteristics of the main amplifier 10. By the way, g'(x) is a polynomial. An amplitude distortion correcting function used to correct the amplitude distortion impairing the linearity, and occurring in the main amplifier 10, is given as $x \times (1-g'(x)/g(x))$. It should be noted is that when the variable x is a complex number, the input amplitude is given as $|x|$ (absolute value of x). The CPU 41 may include a digital signal processor (DSP) shown in FIG. 13. In this case, preferably, after the constant $a_0$ is set to 0 and an offset is set to 0, initialization is carried out.

In FIG. 3, there are shown a first low-pass signal generating unit 4-1 and second low-pass signal generating unit 4-2 which are realized with low-pass filters having a filter coefficient set by the CPU 41. The first low-pass signal generating unit 4-1 and second low-pass signal generating unit 4-2 are preferably formed with root raised cosine filters (RRCOS filters) exhibiting root Nyquist characteristics. The first low-pass signal generating unit 4-1 and second low-pass signal generating unit 4-2 pass a real-part signal I and imaginary-part signal Q constituting a complex-number signal generated by the CPU 4 and containing distortion components reproduced according to the distortion characteristics of the main amplifier, and thus exert the ability to reproduce nonlinear distortion components occurring in the main amplifier.

To be more specific, when signals are passed by the RRCOS filters, the polynomial g'(x) in the envelope transfer function $g(x)=a_0+a_1x+g'(x)$ is expressed as $g'(x)=\Sigma_{i=2}^{N}a_ix^i$ (where N is a positive integer equal to or larger than 2, and $a_i$ is a constant). In this case, preferably, only the terms of odd-numbered orders of the polynomial $g'(x)=\Sigma_{i=2}^{N}a_ix^i$, which express distortion components, are employed. In FIG. 3, there is shown an absolute value-of-complex-number signal calculating unit (ABS) 30 for calculating an absolute value of a complex-number signal consisting of the real-part signal I and imaginary-part signal Q that are low-pass signals output from the RRCOS filters or a sum of squares of the real-part signal I and imaginary-part signal Q. Installed on the output stage of the absolute value-of-complex-number signal calculating unit 30 are a phase distortion correcting unit 20 formed with a rotator (ROT) that is a kind of phase modulator, and a first amplitude distortion component generating unit 31 (that is, a first amplitude modulator AM) and second amplitude distortion component generating unit 32 (that is, a second amplitude modulator AM).

In the first preferred embodiment, a phase distortion correcting function p(x) to be applied to the complex-number signal consisting of the real-part and imaginary-part signal that are substantially identical to low-pass signals of basebands output from the first and second low-pass signal generating units 4-1 and 4-2 is calculated in advance. The phase of the complex-number signal is shifted by an angle given by reversing the sign of the phase distortion correcting function p(x), whereby the phase distortion impairing the linearity is corrected. In this case, the phase distortion correcting function p(x) is expressed as $p(x)=-g(x)$. The first amplitude distortion component generating unit 31 and second amplitude distortion component generating unit 32 do not correct the amplitude distortion impairing the linearity, but modulate in amplitude the complex-number signal so as to raise the frequency band of the complex-number signal.

In FIG. 3, there are shown a first quadrature modulation unit 5-1 for modulating signals having the phase distortion impairing the linearity thereof corrected, and producing a desired intermediate-frequency or high-frequency signal; and a second quadrature modulation unit 5-2 for modulating signals containing amplitude distortion components, and producing a desired intermediate-frequency or high-frequency signal.

The first quadrature modulation unit 5-1 includes a first in-phase carrier wave multiplier 51 for multiplying the real-part signal I having phase distortion impairing linearity thereof corrected by a carrier wave Ci that is in phase with the real-part signal, a first 90° out-of-phase carrier wave multiplier 52 for multiplying the imaginary-part signal Q by a carrier wave Cq that is 90° out of phase with the imaginary-part signal, and a first adder 53 for adding up an in-phase quadrature modulation signal output from the first in-phase carrier wave multiplier 51 and a 90° out-of-phase quadrature modulation signal output from the second 90° out-of-phase carrier wave multiplier 52.

The second quadrature modulation unit 5-2 includes a second in-phase carrier wave multiplier 54 for multiplying the real-part signal I containing amplitude distortion components by a carrier wave Ci that is in phase with the real-part signal, a second 90° out-of-phase carrier wave multiplier 55 for multiplying the imaginary-part signal Q by a carrier wave Cq that is 90° out of phase with the imaginary-part signal, and a second adder 56 for adding up an in-phase quadrature modulation signal output from the second in-phase carrier wave multiplier 54 and a 90° out-of-phase quadrature modulation signal output from the second 90° out-of-phase carrier wave multiplier 55.

Furthermore, a quadrature modulation signal having the phase distortion impairing the linearity thereof corrected is output from the first quadrature modulation unit 5-1, and then supplied to the main amplifier 10 (first amplifier) exhibiting nonlinearity. A quadrature modulation signal containing amplitude distortion components is output from the second quadrature modulation unit 5-2, and then supplied to an auxiliary amplifier 11 (second amplifier) causing substantially no distortion and offering good linearity.

In FIG. 3, an amplitude distortion component subtractor 12 formed with an adder is installed on the output stage of the main amplifier 10 and auxiliary amplifier 11. The amplitude distortion component subtractor 12 subtracts an output signal of the auxiliary amplifier 11 from an output signal of the main amplifier 10, whereby an output signal Sout having the amplitude distortion components thereof canceled out and exhibiting good linearity can be produced.

When frequencies relevant to the phase distortion correcting function p(x) to be applied to low-pass signals are raised by performing digital modulation, signals passed by transmission filters exhibiting root Nyquist characteristics should preferably be used as the low-pass signals.

Furthermore, when frequencies relevant to the phase distortion correcting function p(x) to be applied to low-pass signals are raised by performing quadrature modulation, real-part and imaginary-part signals constituting a complex-number signal and passed by low-pass filters exhibiting the root Nyquist characteristics defined according to the distortion characteristic of the main amplifier 10 should preferably be used as the low-pass signals.

Furthermore, in the first preferred embodiment, even when the linearity offered by the auxiliary amplifier 11 is not very good, if the distortion characteristics of the auxiliary amplifier are estimated and a phase distortion correcting function is calculated in advance, the phase distortion impairing the linearity, and occurring in the auxiliary amplifier, can also be corrected.

Figure 4:
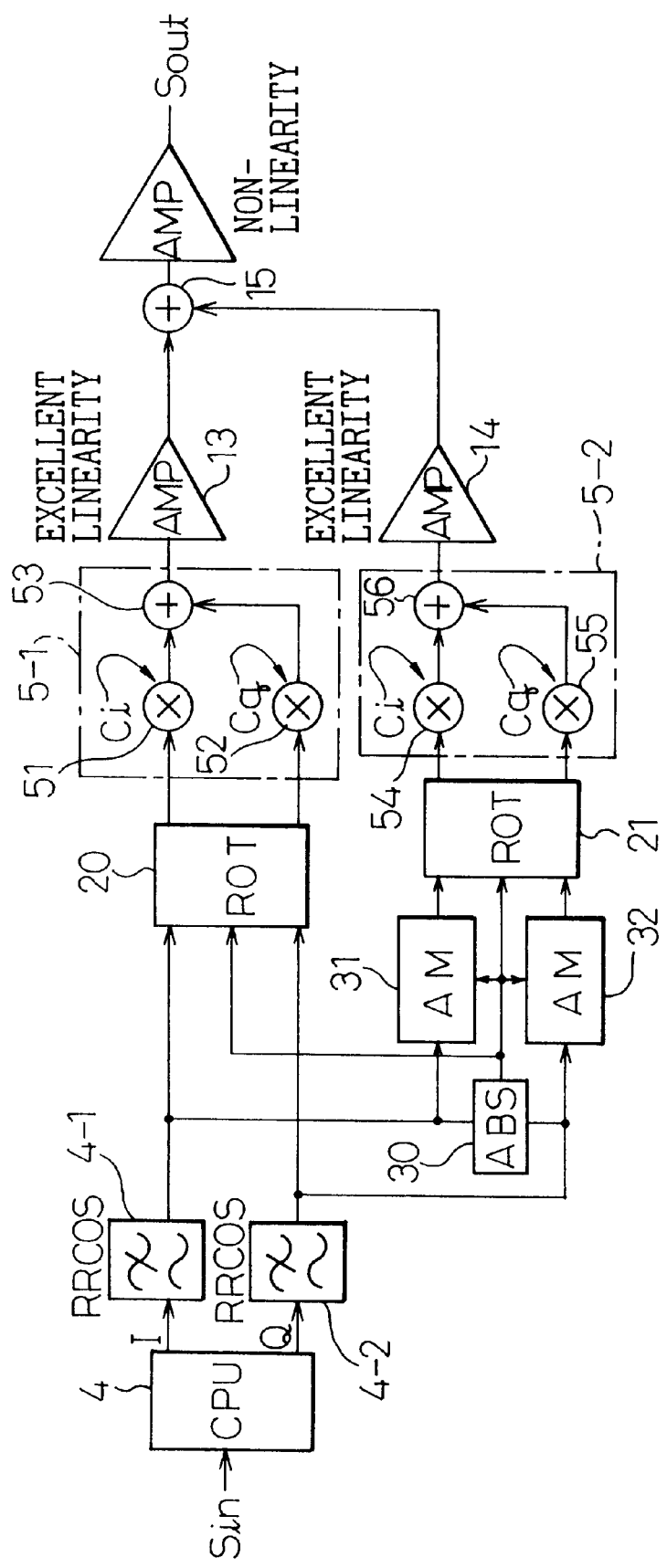
FIG. 4 is a circuit block diagram showing a second preferred embodiment of the present invention.

FIG. 4 is a circuit block diagram showing the second preferred embodiment of the present invention. Shown, as an example, is the circuitry in which the amplitude distortion or phase distortion impairing the linearity, and occurring in the main amplifier 10 offering nonlinearity and serving as a high-frequency circuit, whose distortion characteristics are the subject for correction, is corrected.

The configurations and abilities of the CPU 41, first low-pass signal generating unit 4-1, and second low-pass signal generating unit 4-2 shown in FIG. 4 are identical to those shown in FIG. 2. The detailed description of the components will be omitted.

Even in FIG. 4, as in FIG. 3, there is shown an absolute value-of-complex-number signal calculating unit 30 for calculating an absolute value of a complex-number signal consisting of real-part and imaginary-part signals that are low-pass filters output from the RRCOS filters or calculating a sum of squares of the real-part signal I and imaginary-part signal Q. Installed on the output stage of the absolute value-of-complex-number signal calculating unit 30 are a phase distortion correcting unit 20 formed with a rotator, a first amplitude distortion component generating unit 31 and second amplitude distortion component generating unit 32 for modulating in amplitude a complex-number signal, and an amplitude distortion correcting unit 21 formed with a rotator.

In the second preferred embodiment, a phase distortion correcting function p(x) which is to be applied to a complex-number signal consisting of a real-part signal and imaginary-part signal substantially identical to low-pass signals of basebands, is calculated in advance. The phase of the complex-number signal is shifted by an angle given by changing the sign of the phase distortion correcting function p(x), by means of the phase distortion correcting unit 20, whereby the phase distortion impairing the linearity is corrected. An amplitude distortion correcting function to be applied to the complex-number signal is calculated in advance. The amplitude of the complex-number signal is adjusted by the amplitude distortion correcting unit 21, whereby the amplitude distortion impairing the linearity is corrected.

In FIG. 4, there are shown a first quadrature modulation unit 5-1 for modulating signals having the phase distortion impairing the linearity thereof corrected, and producing a desired intermediate-frequency or high-frequency signal; and a second quadrature modulation unit 5-2 for modulating signals having the amplitude distortion impairing the linearity thereof corrected, and producing a desired intermediate-frequency or high-frequency signal.

The first quadrature modulation unit 5-1 includes, like the one shown in FIG. 2, a first in-phase carrier wave multiplier 51, a first 90° out-of-phase carrier wave multiplier 52, and a first adder 53 for adding up an in-phase quadrature modulation signal output from the first in-phase carrier wave multiplier 51 and a 90° out-of-phase quadrature modulation signal output from the second 90° out-of-phase carrier wave multiplier 52.

The second quadrature modulation unit 5-2 includes, like the one shown in FIG. 2, a second in-phase carrier wave multiplier 54, a second 90° out-of-phase carrier wave multiplier 55, and a second adder 56 for adding up an in-phase quadrature modulation signal output from the second in-phase carrier wave multiplier 54 and a 90° out-of-phase quadrature modulation signal output from the second 90° out-of-phase carrier wave multiplier 56.

A quadrature modulation signal having the phase distortion impairing the linearity thereof corrected is output from the first quadrature modulation unit 5-1, and then supplied to a phase distortion correcting signal amplifier 13 offering good linearity. A quadrature modulation signal having amplitude distortion components thereof corrected is output from the second quadrature modulation unit 5-2, and then supplied to an amplitude distortion correcting signal amplifier 14 offering good linearity.

Referring to FIG. 4, an amplitude distortion/phase distortion correcting signal adder 15 formed with an adder is installed on the output stage of the phase distortion correcting signal amplifier 13 and amplitude distortion correcting signal amplifier 14. The amplitude distortion/phase distortion correcting signal adder 15 adds up two kinds of signals each having the amplitude distortion and the phase distortion components thereof corrected, and supplies a resultant signal to the main amplifier 10 having nonlinearity. Finally, an output signal Sout, having the amplitude distortion and the phase distortion components thereof, which impair the linearity thereof, canceled out, is output through the output terminal of the main amplifier 10.

Furthermore, in the second preferred embodiment, even when the linearity offered by the amplitude distortion correcting signal amplifier 14 and phase distortion correcting signal amplifier 13 is not very good, if the distortion characteristics of the amplifiers are estimated and an amplitude distortion correcting function and phase distortion correcting function are calculated in advance, the distortion impairing the linearity, and occurring in the amplitude distortion correcting signal amplifier 14 and phase distortion correcting signal amplifier 13, can be corrected.

Figure 5:
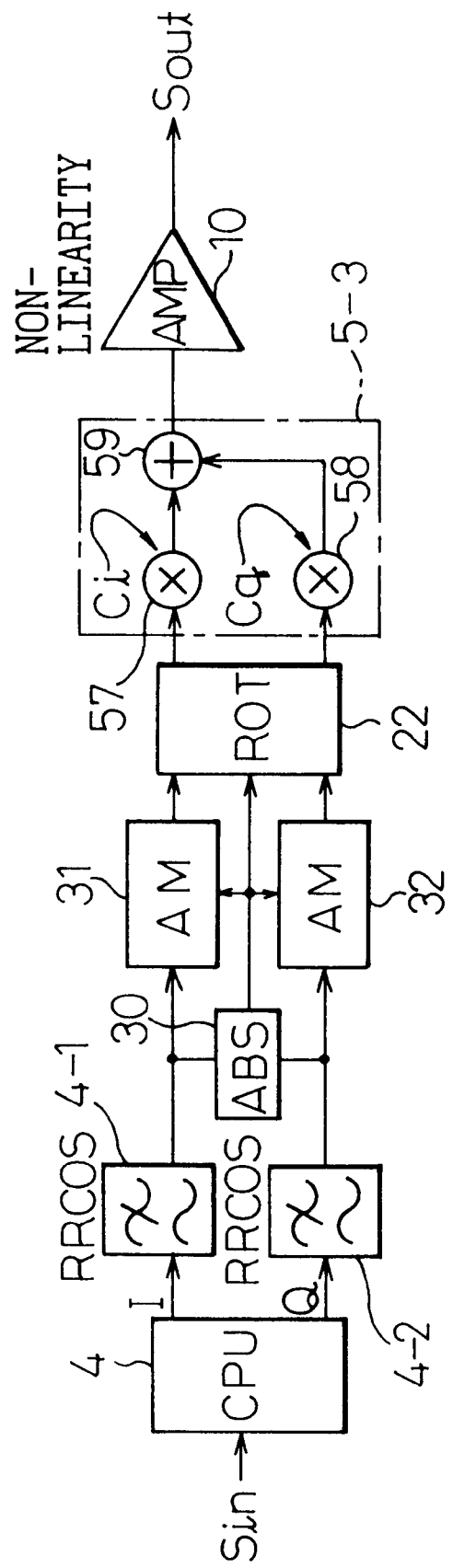
FIG. 5 is a circuit block diagram showing a third preferred embodiment of the present invention.

FIG. 5 is a circuit block diagram showing the third preferred embodiment of the present invention. Shown, as an example, is the circuitry in which the amplitude distortion or phase distortion impairing the linearity, and occurring in the main amplifier 10 that has nonlinearity and serves as a high-frequency circuit whose distortion characteristics are the subject for correction, is corrected.

The configurations and abilities of the CPU 41, the first low-pass signal generating unit 4-1, and the second low-pass signal generating unit 402 shown in FIG. 5 are identical to those shown in FIGS. 2 and 3. A detailed description of the components will be omitted.

In FIG. 5, as in FIGS. 3 and 4, there is shown an absolute value-of-complex-number signal calculating unit 30 for calculating an absolute value of a complex-number signal consisting of a real-part signal and imaginary-part signal that are low-pass signals output from the RRCOS filters or the like, or for calculating a sum of squares of the real-part signal I and imaginary-part signal Q. Installed on the output stage of the absolute value-of-complex-number signal calculating unit 30 are a first amplitude distortion component generating unit 31 and second amplitude distortion component generating unit 32 for modulating in amplitude the complex-number signal, and an amplitude distortion/phase distortion correcting unit 22 formed with a common rotator.

In the third preferred embodiment, an amplitude distortion correcting function and phase distortion correcting function to be applied to a complex-number signal consisting of a real-part signal and imaginary-part signal that are substantially identical to low-pass signals of basebands are calculated in advance. The signs of values of the correction functions are reversed by the amplitude distortion/phase distortion correcting unit 22. Thus, both amplitude distortion and phase distortion impairing the linearity are corrected at the same time. More specifically, distortion components expressed by the below-mentioned polynomial (2) are appended to the complex-number signal, and amplitude distortion correction and phase distortion correction are carried out at the same time. This results in a simpler circuit.

Assuming that $$g(x) = \sum_{i=2}^{N} a_i x^i,$$

the signs of converted values of inputs that are distortion components are reversed as follows.

$$\left(\sum_{i=2}^{N} -a_i x^i\right) / bx \quad (2)$$

When it is said that "the signs of converted values of inputs that are distortion components are reversed," this means that distortion components contained in an output signal of the main amplifier are canceled out.

In FIG. 5, there is shown a common quadrature modulation unit 5-3 for modulating signals, each of which has the amplitude distortion and the phase distortion impairing the linearity thereof corrected simultaneously, and producing a desired intermediate-frequency or high-frequency signal.

The common quadrature modulation unit 5-3 includes a common in-phase carrier wave multiplier 57, a common 90° out-of-phase phase carrier wave multiplier 58, and a common adder 59. The common adder 59 has the ability to add up an in-phase quadrature modulation signal and 90° out-of-phase quadrature modulation signal output from the common in-phase carrier wave multiplier 57 and 90° out-of-phase carrier wave multiplier 58, and the ability to add up two kinds of signals each having the amplitude distortion and the phase distortion components thereof corrected.

Furthermore, a quadrature modulation signal, having the amplitude distortion and the phase distortion impairing the linearity thereof corrected, is output from the common quadrature modulation unit 503, and then supplied to the main amplifier 10 having nonlinearity. Finally, an output signal Sout having the amplitude distortion and the phase distortion components thereof, which impair the linearity thereof, canceled out is output through the output terminal of the main amplifier 10.

In the first to third preferred embodiments, the first method for correcting signals to be implemented in an apparatus for correcting signals in accordance with the present invention is adopted. Distortion components alone occurring in a main amplifier that has nonlinearity are subjected to quadrature modulation, and then subtracted from an output signal of the main amplifier.

Furthermore, in the third preferred embodiment, distortion components expressed by the below-mentioned polynomial (3) below may be appended to a complex-number signal, and then amplitude distortion correction and phase distortion correction may be carried out.

Assuming that $$g(x) = \sum_{i=2}^{N} a_i x^i,$$

when the signs of converted values of inputs that are distortion components are reversed:

$$\sum_{i=2}^{N} -a_i x^i / \sum_{i=1}^{N} a_i x^i \quad (3)$$

where the denominator of the polynomial (3) is equivalent to g(x). Distortion components expressed by the polynomial (3) includes "curved" components of the complex-number signal. Amplitude distortion correction and phase distortion correction can therefore be carried out with relatively high precision. In this case, a circuit block diagram will be identical to FIG. 5. Distortion components expressed by the polynomial (3) can be readily reproduced merely by modifying software (i.e., software program) in the CPU.

Figure 6:
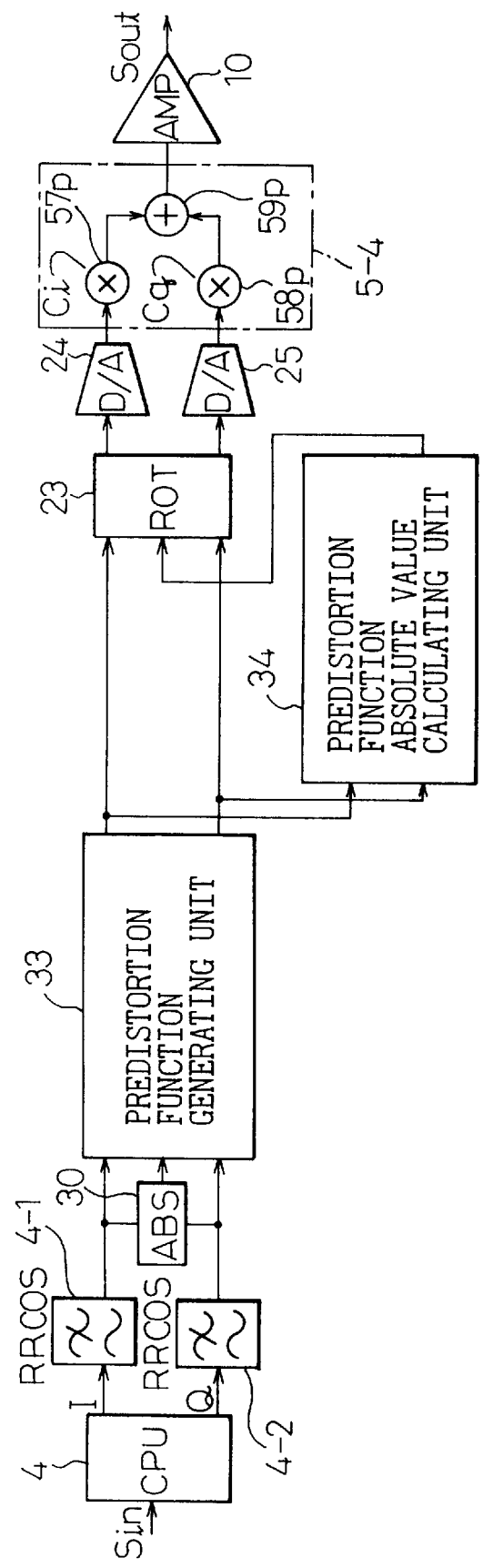
FIG. 6 is a circuit block diagram showing a fourth preferred embodiment of the present invention.

FIG. 6 is a circuit block diagram showing the fourth preferred embodiment of the present invention. Shown as an example is the circuitry in which the amplitude distortion or the phase distortion impairing the linearity, and occurring in the main amplifier 10, that offers nonlinearity and serves as a high-frequency circuit whose distortion characteristics are the subject for correction, is corrected.

The configurations and abilities of the CPU 41, first low-pass signal generating unit 4-1, and second low-pass signal generating unit 4-2 are identical to those shown in FIGS. 3 to 5. The distortion characteristics of the main amplifier 10 estimated by the CPU 41 are considerably different from those of the main amplifiers shown in FIGS. 3 to 5.

In the fourth preferred embodiment, an envelope transfer function g(x), whose variable x indicates an input amplitude, is calculated in order to reproduce the distortion characteristics of the main amplitude. Based on the envelope transfer function g(x), an amplitude distortion correcting function h(x) (that is, a predistortion amplitude function) used to correct the amplitude distortion impairing the linearity, and occurring in the main amplifier, is calculated so that the relationship of ax=g(h(x)) where a is a constant can be established, or a phase distortion correcting function p(x) used to correct the phase distortion impairing the linearity, and occurring in the main amplifier, is calculated so that the relationship of c=g(p(x)) where c is a constant can be established. That is to say, according to a second method for correcting signals to be implemented in an apparatus for correcting signals in accordance with the present invention, the amplitude distortion correcting function h(x) is calculated so that the function g(h(x)) can reproduce given distortion characteristics.

For calculating the distortion characteristic correcting function h(x) according to the second method for correcting signals, the number of calculations is relatively large. Preferably, digital low-pass signals passed by low-pass transmission filters exhibiting root Nyquist characteristics are processed at high speed by means of a digital signal processor (DSP).

In FIG. 6, as in FIGS. 3 to 5, there is shown an absolute value-of-complex-number signal calculating unit 30 for calculating an absolute value of a digital complex-number signal consisting of a real-part signal and imaginary-part signal that are digital low-pass signals output from the RRCOS filters or the like, or a sum of the squares of the real-part signal I and imaginary-part signal Q.

Referring to FIG. 6, installed on the output stage of the absolute value-of-complex-number signal calculating unit 30 is a predistortion function generating unit 33 for calculating an amplitude distortion correcting function h(x) to be applied to a complex-number signal that is an input signal. The predistortion function generating unit 33 calculates the predistortion amplitude function that is applied for distorting the complex-number signal in advance so as to correct the distortion characteristics of the main amplifier 10.

Referring to FIG. 6, a predistortion function absolute value calculating unit 34 for calculating an absolute value of the predistortion function, and an amplitude distortion/phase distortion correcting unit 23 for simultaneously carrying out amplitude distortion correction and phase distortion correction for an input signal are installed on the output stage of the predistortion function generating unit 33. Herein, in consideration of the fact that after the predistortion amplitude function is applied to the complex-number signal, the amplitudes of the complex-number signal vary, the predistortion function absolute value calculating unit 34 calculates the absolute value of the complex-number signal so that amplitude distortion correction and phase distortion correction can be achieved with high precision.

In FIG. 6, there are shown digital-to-analog converters 24 and 25 for converting a digital complex-number signal, which has the amplitude distortion and the phase distortion impairing the linearity thereof corrected by the amplitude distortion/phase distortion correcting unit 23, into an analog form, and a common quadrature modulation unit 5-4 for modulating analog complex-number signals output from the digital-to-analog converters 24 and 25 and producing a desired intermediate-frequency or high-frequency signal.

The common quadrature modulation unit 5-4 includes a common in-phase carrier wave multiplier 57$p$, a common 90° out-of-phase carrier wave multiplier 58$p$, and a common adder 59$p$. The common adder 59$p$ has the ability to add up an in-phase quadrature modulation signal and 90° out-of-phase quadrature modulation signal output from the common in-phase carrier wave multiplier 57$p$ and 90° out-of-phase carrier wave multiplier 58$p$, and the ability to add up two kinds of signals each having amplitude distortion and phase distortion components thereof corrected.

Furthermore, a quadrature modulation signal having the amplitude distortion and the phase distortion impairing the linearity thereof corrected is output from the common quadrature modulation unit 5-3, and then supplied to the main amplifier 10 offering nonlinearity. Finally, an output signal Sout having amplitude distortion and phase distortion components thereof, which impair the linearity thereof, canceled out is output through the output terminal of the main amplifier 10.

Furthermore, in the fourth preferred embodiment, the envelope transfer function g(x) is a function including a "table" function. The amplitude distortion correcting function h(x) or phase distortion correcting function p(x) is an expansion consisting of a polynomial series. Coefficients in terms of all orders of the expansion are calculated, whereby the amplitude distortion correcting function h(x) or phase distortion correcting function p(x) is calculated.

Furthermore, in the fourth preferred embodiment, the amplitude distortion correcting function h(x) or phase distortion correcting function p(x) should preferably be fixed.

Furthermore, in the fourth preferred embodiment, when a plurality of amplifiers offering nonlinearity are present, the amplitude distortion correcting function h(x) or phase distortion correcting function p(x) should preferably be fixed for each amplifier or each group of amplifiers produced under similar manufacturing conditions.

Furthermore, in the fourth preferred embodiment, while the amplifier is in operation, the envelope transfer function g(x) is calculated intermittently or all the time. Based on the result of calculating the envelope transfer function g(x), the amplitude distortion correcting function h(x) or phase distortion correcting function p(x) is modified.

In a variant of the fourth preferred embodiment, an amplitude distortion correcting function defined by the below-mentioned polynomial (4) below may be applied to a complex-number signal for predistortion.

$$h(x) = \sum_{i=1}^{N} c_i x^i \qquad (4)$$

A coefficient ci in the polynomial (4) is a constant in the amplitude distortion correcting function which is newly defined for predistortion.

In this case, a circuit block diagram will be the same as that of FIG. 6. The coefficient $c_i$ in the amplitude distortion correcting function defined by the polynomial (4) can be calculated for a relatively high order merely by modifying software in the DSP.

Using any of the apparatuses for correcting signals in accordance with the first to fourth preferred embodiments of the present invention, a method for correcting signals in which: distortion characteristics of a high-frequency circuit including an amplifier concerning the amplitude distortion and the phase distortion impairing the linearity is estimated; at least one of an amplitude distortion correcting function and phase distortion correcting function calculated on the basis of the result of estimating the distortion characteristics is applied to low-pass signals; a signal based on the low-pass signals to which the amplitude distortion correcting function or phase distortion correcting function is applied is supplied to the high-frequency circuit; and thus at least one of the amplitude distortion and the phase distortion impairing the linearity, and occurring in the high-frequency circuit is corrected, can be easily implemented.

A technique for reducing distortion, which occurs during intermodulation according to distortion characteristics of a microwave amplifier, and the conclusion of a discussion on the technique will be explained in detail.

Discussion on Reduction of Distortion Stemming from Intermodulation and Occurring in a Microwave Amplifier due to Predistortion (A) Summary It is generally known that adjacent channel power ACP can be reproduced by expressing the linearity offered by a microwave amplifier using a function of an input amplitude, that is, two functions of an amplitude and phase indicated by an envelope, expressing a carrier wave in the form of an "instantaneous" transfer function, and employing a discrete model or a model of discrete circuits. When aliasing caused by digital processing can be suppressed and a frequency resolution is sufficient, even if a low-pass model or a model of circuits each including a low-pass filter which has a simpler configuration than the discrete model is employed, the same results are obtained. Simulation was carried out using the low-pass model in order to reproduce adjacent channel power ACP. It was confirmed that the adjacent channel power ACP could be reproduced. It was then discussed whether or not the distortion impairing linearity, and occurring in a narrow-band high-frequency circuit, could be corrected on the basis of this fact (baseband predistortion).

A signal of a personal digital cellular form was taken as an example. Measured data concerning a hetero-junction bipolar transistor (HBT) power amplifier was used to carry out simulation for reproducing adjacent channel power ACP. Whichever of the discrete model and low-pass model was used, measured values and the results of simulation agreed with each other with a difference of 2 dB or smaller between them as far as significant parts of the values and results were concerned. The aforesaid two methods for correcting signals will be discussed as a method for correcting distortion that occurs during intermodulation according to distortion characteristics of a microwave amplifier. For confirmation, the two methods for correcting signals will be reiterated briefly.

(1) Distortion components are removed on the output stage of a high-frequency circuit. Adjacent channel power ACP is reduced by 40 dB or more. It has been demonstrated that the phase distortion impairing the linearity can be nullified by applying the inverse of the phase distortion impairing the linearity.

(2) On the basis of an envelope amplitude distortion function employed in a simulation for reproducing adjacent channel power ACP, a prediction function (for example, a prediction amplitude function) is calculated according to the LMS method. The prediction function is applied for distorting the real-part signal and imaginary-part signal I and Q of a complex-number signal in advance, whereby adjacent channel power ACP can be reduced by about 10 dB.

(B) Estimating Adjacent Channel Power ACP

In a known discrete model, a PDC signal is used to estimate adjacent channel power ACP generated by an amplifier according to a method described below. A thirteenth-order polynomial is used to express the amplitude distortion impairing the linearity and the phase distortion impairing the linearity as a distortion model or a model of expressions representing distortion components occurring in an amplifier, and applied to a PDC up signal (QPSK modulation, α=0.5). When an input amplitude x is expressed by a complex number, the amplitude and phase of an output signal of the amplitude can be regarded as functions of an absolute value of the amplitude |x| of the high-frequency input signal of the amplifier, and are therefore given as an envelope amplitude function and envelope phase function g(|x|) and p(|x|) respectively. Specifically, the envelope amplitude function and envelope phase function g(|x|) and p(|x|) are defined by the expressions (5) and (6) below. A signal whose output amplitude is determined by the envelope amplitude function g(|x|) is given by the expression (7) below.

$$g(|x|) = \sum_{i=1}^{N} a_i |x|^i \qquad (5)$$

$$p(|x|) = \sum_{i=1}^{N} b_i |x|^i \qquad (6)$$

$$V_{osr} = g(|x|)e^{i(\angle p(x))} \qquad (7)$$

When the signal $V_{osr}$ given by the expression (7) is passed by a low-pass filter, a signal $F_{os}$ resulting from Fourier transform and a signal $V_{os}$ resulting from inverse Fourier transform are produced as defined by the expression (8) and expression (9).

$$F_{os} = \text{fft}(V_{osr})H_{lpf} \qquad (8)$$

$$V_{os} = \text{ifft}(F_{os}) \qquad (9)$$

here Hlpf denotes a frequency characteristic of a low-pass filter for passing frequencies within a bandwidth that is six times larger than the frequency band handled by quadrature modulation, fft denotes Fourier transform, and ifft denotes inverse Fourier transform. The narrower the bandwidth of the low-pass filter is, the smaller the adverse effect of aliasing noise stemming from digital signal processing is. A minimum bandwidth necessary for predicting adjacent channel power ACP2 leaking out of channels adjoining adjacent channels is therefore set to 6×21 kHz≈100 kHz+10.5 kHz. When the absolute value of an input amplitude of a carrier wave, $|x_c|$, is defined as $|x_c|=\sqrt{(2\text{Pin})}\times\sqrt{2}$, if the amplitude of the carrier wave is regarded as an instantaneous amplitude function g'(|$x_c$|) the carrier wave $V_c$ can be extracted by passing a signal $V_{cr}$ through a narrow-band filter exhibiting frequency characteristics of Hnbf. The instantaneous amplitude function g'(|$x_c$|), signal $V_{cr}$ supplied to the narrow-band filter, and carrier wave $V_c$ passed by the narrow-band filter are defined as the expressions (10), (11), and (12) below.

$$g'(|x_c|) = \sum_{i=1}^{N} a_i \sin(i\xi |x_c|) \qquad (10)$$

$$V_{cr} = g'(|x_c|)e^{i\angle xc} \qquad (11)$$

$$V_c = \text{ifft}(\text{fft}(A_{cr})\times H_{nbf}) \qquad (12)$$

where ξ denotes a scaling factor determined for filtering coefficients $\alpha_i$ included in a Bessel series on the basis of measured values indicating amplitude modulation-amplitude modulation (AM-AM) characteristics, and is provided by the expression below.

$$\xi = \pi/2\max(|x|) \qquad (13)$$

An output signal $V_o$ of the amplifier is defined by the expression (14) below on the assumption that the amplitude of input power Pin is given as $\sqrt{(2P_{in})}$.

$$V_o = V_{os} V_c e^{i\{-p(|x|)\}} / g(\sqrt{2P_{in}}) \quad (14)$$

Coefficients of finite orders are determined according to amplitude modulation-amplitude modulation (AM-AM) characteristics and amplitude modulation-frequency modulation (AM-PM) characteristic which are actually measured by inputting a single tone to an amplifier. Thus, approximate values of the functions are calculated. According to this method, adjacent channel power ACP can be calculated using a PDC signal by varying input power. Only when a discrete model is used, adjacent channel power ACP2 leaking out of channels adjoining adjacent channels can be reproduced successfully. This is because the frequency band of a signal to which amplitude distortion components impairing the linearity are appended is limited. Even when a low-pass model relating to the present invention is used, if similar filtering is carried out, adjacent channel power ACP1 leaking out of adjacent channels and adjacent channel power ACP2 leaking out of channels adjoining the adjacent channels can be reproduced with high accuracy (Refer to the expression (6)). As far as the low-pass model employed this time is concerned, a signal $V_{osr}$ and signal $V_{os}$ are defined by the expressions (15) and (16) below by employing the aforesaid envelope amplitude function and envelope phase function g(|x|) and p(|x|).

$$V_{osr} = g(|x|) e^{i\angle x} \quad (15)$$

$$V_{os} = \text{ifft}(\text{fft}(V_{osr}) \times H_{lpf}) \quad (16)$$

A final output signal of the amplifier is provided as the expression (17) below including multiplication of $\sqrt{2} \sin(\omega_c t)$ expressing a carrier wave.

$$V_o = \sqrt{2} \sin(\omega_c t) \times V_{os} \times e^{i-p(|x|)} \quad (17)$$

Figure 7:
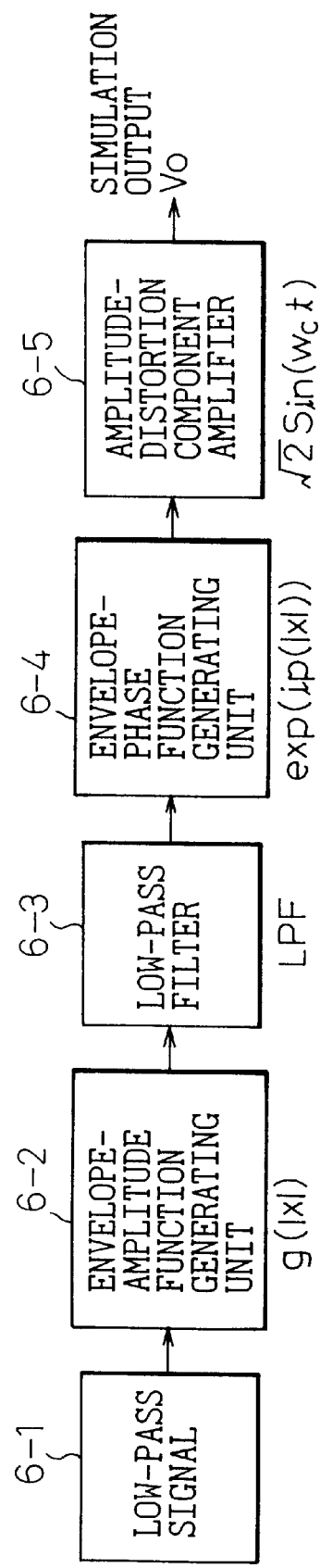
FIG. 7 is a block diagram showing a low-pass model used to realize a method for correcting signals in accordance with the present invention.
Figure 8:
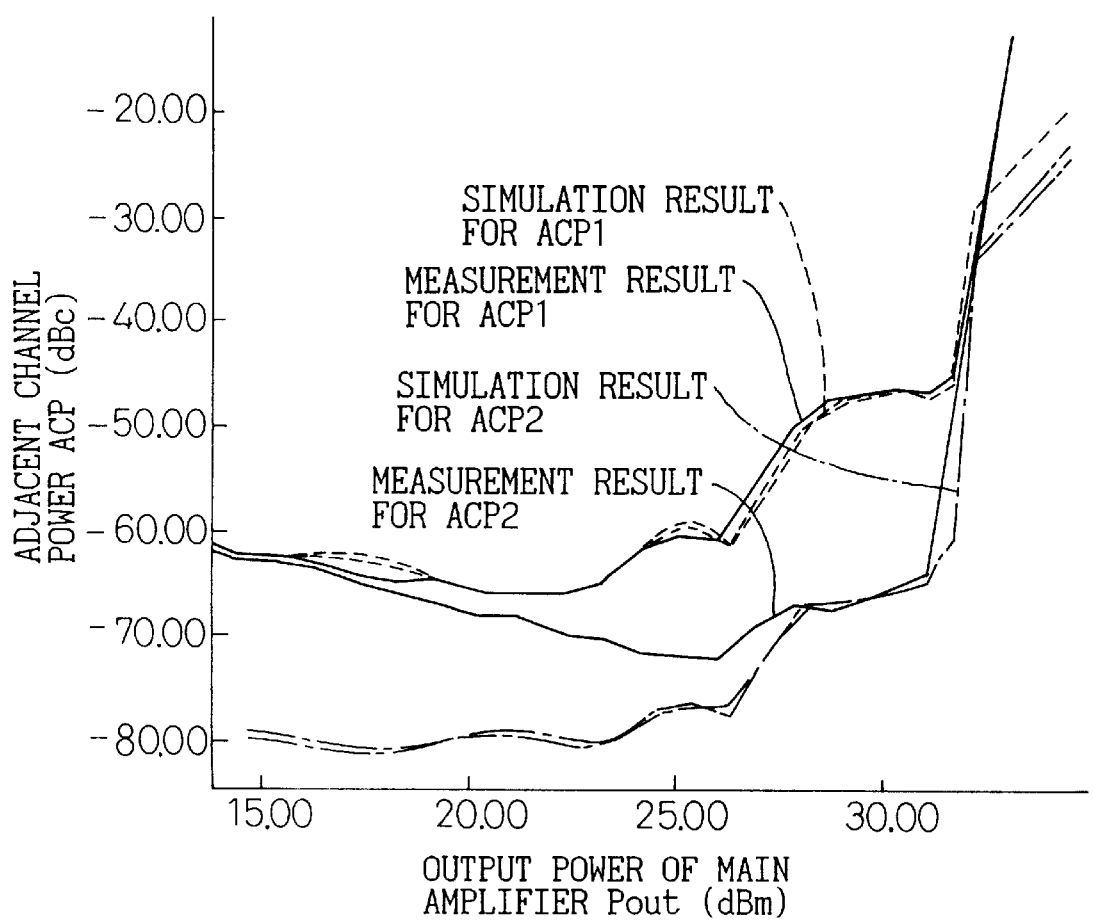
FIG. 8 is a graph showing the results of simulation performed using the low-pass model shown in FIG. 7.

FIG. 7 is a block diagram showing a low-pass model used to implement a method for correcting signals in accordance with the present invention by carrying out a procedure described below; and FIG. 8 is a graph showing the results of simulation performed using the low-pass model.

In the low-pass model shown in FIG. 7, a low-pass signal 6-1 is used as an input signal, and an envelope amplitude function generating unit 6-2 calculates an envelope amplitude function g(|x|). A signal representing the envelope amplitude function g(|x|) is passed through a low-pass filter (LPF) 6-3. An envelope phase function generating unit 6-4 calculates an envelope phase function (exp(ip(|x|))). An amplitude distortion component amplifier 6-5 multiplies the value of the signal passed by the low-pass signal by 2 sin($\omega_{ct}$) expressing a carrier wave. Eventually, an output signal $V_o$ of an amplifier is produced by carrying out simulation.

As a result of carrying out simulation using the low-pass model shown in FIG. 7, the graph of FIG. 8 is plotted to indicate the relationship between output power $P_{out}$ of an amplifier and adjacent channel power ACP. In the graph, two solid lines indicate the results of measuring adjacent channel power ACP1 leaking out of adjacent channels and the results of measuring adjacent channel power ACP2 leaking out of channels adjoining the adjacent channels. Two dashed lines indicate, as results of simulation, adjacent channel power leaking out of the adjacent channels on both sides. Two dot-dash lines indicate, as results of simulation, adjacent channel power ACP2 leaking out of channels adjoining the two adjacent channels on both sides.

As is apparent from the graph of FIG. 8, as long as output power $P_{out}$ of an amplifier falls within a range of levels within which the power is actually consumed, the adjacent channel power ACP1 leaking out of adjacent channels and the adjacent channel power ACP2 leaking out of channels adjoining the adjacent channels are reproduced with high accuracy.

(C) Reducing Adjacent Channel Power ACP Using a Low-pass Model

As mentioned above, it has been demonstrated that distortion stemming from intermodulation and occurring in a high-frequency circuit can be reproduced using a low-pass model. A method of reducing adjacent channel power ACP using the low-pass model will be discussed.

(C-1). Correcting Amplitude Distortion Impairing Linearity and Occurring in a High-frequency Circuit Using the configuration of the first embodiment shown in FIG. 3, simulation is carried out on the assumption that the amplitude distortion impairing the linearity, and occurring in a high-frequency circuit, will be corrected. In this case, the amplitude of low-pass signals output from the RRCOS filters is worked out by calculating an absolute value of a complex-number signal composed of the real-part signal I and imaginary-part signal Q. The terms of second and higher orders of an envelope amplitude function used to estimate adjacent channel power ACP express distortion components occurring in the high-frequency circuit. The signs of the terms of second and higher orders are reversed in order to calculate the amplitudes of the distortion components. Frequencies relevant to the amplitudes are raised and subtracted from an output of the high-frequency circuit. Thus, the adjacent channel power ACP can be expected to be reduced.

Figure 9:
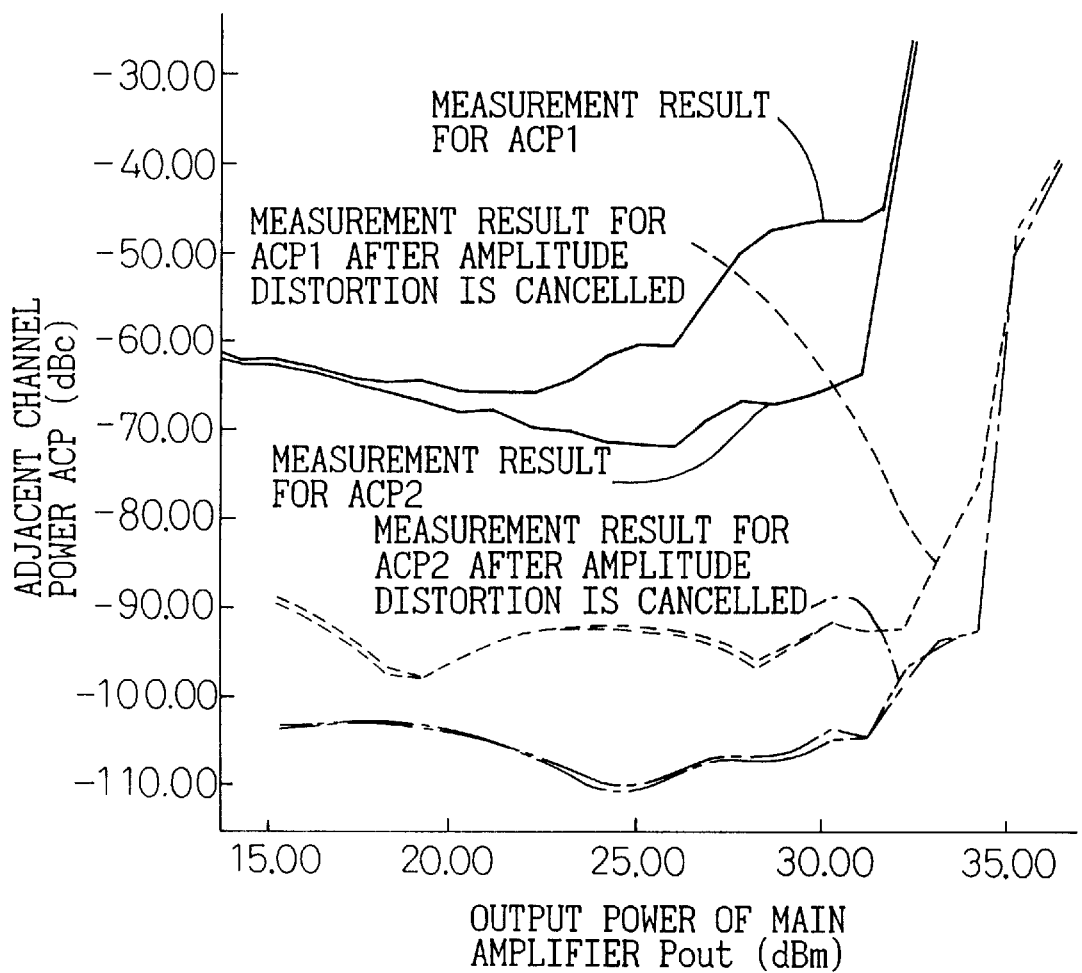
FIG. 9 is a graph indicating how amplitude distortion components are canceled out in a high-frequency range in the preferred embodiments of the present invention.

FIG. 9 is a graph showing how amplitude distortion components are canceled out in a high frequency range according to any of the embodiments of the present invention. Shown is the relationship between output power Pout and adjacent channel power ACP attained when simulation is carried out using the configuration of the first embodiment (FIG. 3) of the present invention in order to correct the amplitude distortion impairing the linearity and occurring in an amplifier.

In the graph of FIG. 9, two solid lines indicate the results of measuring adjacent channel power ACP1 leaking out of adjacent channels, and the results of measuring adjacent channel power ACP2 leaking out of channels adjoining the adjacent channels. For the measurement, the amplitude distortion impairing the linearity, and occurring in the amplifier, is not corrected. Two dashed lines indicate adjacent channel power ACP1 leaking out of the adjacent channels after amplitude distortion components occurring in the amplifier are canceled out. Two dot-dash lines indicate adjacent channel power ACP2 leaking out of the channels adjoining the adjacent channels after amplitude distortion components occurring in the amplifier are canceled out.

As apparent from the graph of FIG. 9, the adjacent channel power ACP1 leaking out of adjacent channels and the adjacent channel power ACP2 leaking out of channels adjoining the adjacent channels are reduced by 40 dB or more, and adjacent channel power ACP can thus be reduced drastically using the low-pass model. Even when the output power Pout of an amplifier is 32 dBm or more, the effect of reducing adjacent channel power can be exerted. However, in reality, the degree of reduction will be restricted by the ability of an amplifier for correction. The phase distortion impairing the linearity can be corrected readily by shifting the phase of a signal supplied to a main amplifier by an angle given by −p(|x|).

(C-2). Predistortion Function and Its Utilization

Distortion components of an output signal of an amplifier can be diminished by distorting an input signal of the amplifier in advance using an amplitude distortion correcting function, that is, a predistortion amplitude function h(|x|). An envelope transfer function g(h(|x|)) (g(h) in the polynomial (18) to be described later) and the predistortion amplitude function h(|x|) are expressed as the polynomials (18) and (19) below.

$$g(h) = \sum_{k=1}^{N} a_k h^k \quad (18)$$

$$h(|x|) = \sum_{i=1}^{N} c_i |x|^i \quad (19)$$

When an output signal of an amplifier is defined in relation to an input amplitude |x| using the polynomials (18) and (19), the polynomial (20) below is obtained.

$$g(|x|) = \sum_{k=1}^{N} a_k \left( \sum_{i=1}^{N} c_i |x|^{i-1} \right)^{k-1} \quad (20)$$

In this case, the polynomial (18) and coefficients $c_i$ in the polynomial (19) are determined so that the envelope transfer function g(|x|) will approach the amplitude, b·|x|, of an output provided with a gain b and undergoing no distortion. Herein, the amplitude b·|x| of the output of the amplifier that produces the gain b and causes no distortion is regarded as a target envelope transfer function, and the coefficients $c_i$ are calculated using A method of steepest descent based on the LMS method so that a sum of errors between the square of the envelope transfer function and the square of the output amplitude b·|x| will be minimized (LMS method). Assuming that a cumulative error between the square of the envelope transfer function g(|x|) and the square of the output amplitude b·|x| that is the target envelope transfer function is $\epsilon$, updated coefficients $\delta_i$ are calculated by differentiating the envelope transfer function g(|x|) with respect to the coefficients $c_i$. A procedure of calculating the updated coefficients $\delta_i$ is a procedure of calculating the expressions (21) to (24) below.

$$\varepsilon = \sum_{l=0}^{L} (b|x| - g|x|)^2 \quad (21)$$

$$\delta_i = -\theta \epsilon \cdot (\partial g(|x|)/\partial c_i) \quad (22)$$

$$\partial g(|x|)/\partial c_i = \sum_{k=1}^{N} \left[ (k-1)a_k \left( \sum_{j=1}^{N} c_i |x|^{i-1} \right)^{k-2} |x|^{i-1} \right] \quad (23)$$

$$c_i += \delta_i \quad (24)$$

While a step gain η is adjusted, the calculation of the expressions (21) to (24) is repeated approximately 1000 times. Eventually, a set of coefficients $c_i$ of thirteen orders are calculated.

Figure 10:
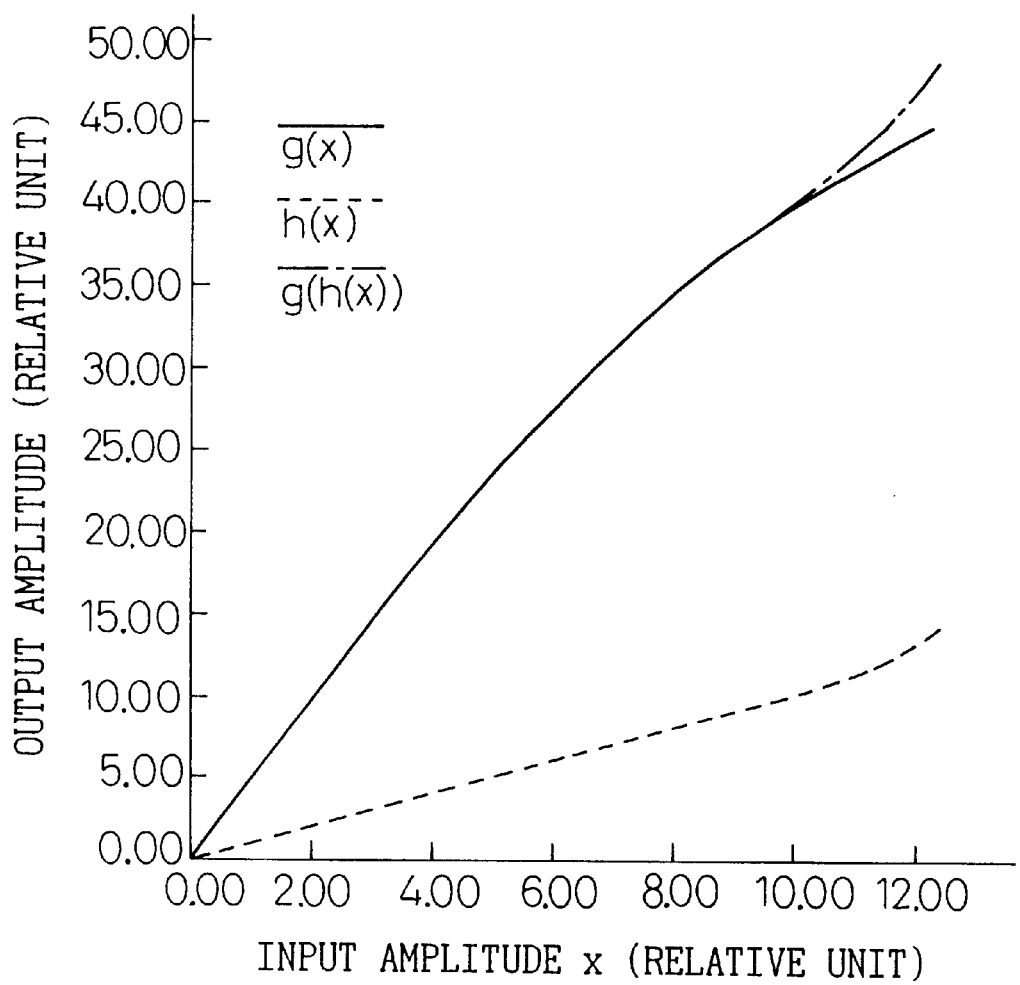
FIG. 10 is a graph showing a predistortion function used in the preferred embodiments of the present invention.

FIG. 10 is a graph showing a predistortion function employed in the embodiments of the present invention. In the graph of FIG. 10, an input amplitude |x| is simplified to x.

The method of steepest descent based on the LMS method employed in the fourth embodiment of the present invention is used to calculate a predistortion amplitude function h(|x|) (dashed line in FIG. 10). An envelope transfer function g(|x|) (solid line in FIG. 10) is modified using the predistortion amplitude function h(|x|) for the purpose of predistortion. This makes it possible to correct amplitude distortion components impairing the linearity which are reproduced by the envelope transfer function g(|x|). consequently, a function g(h|x|) exhibiting good linearity can be defined over a relatively large range of input amplitudes (dot-dash line in FIG. 10).

Figure 11:
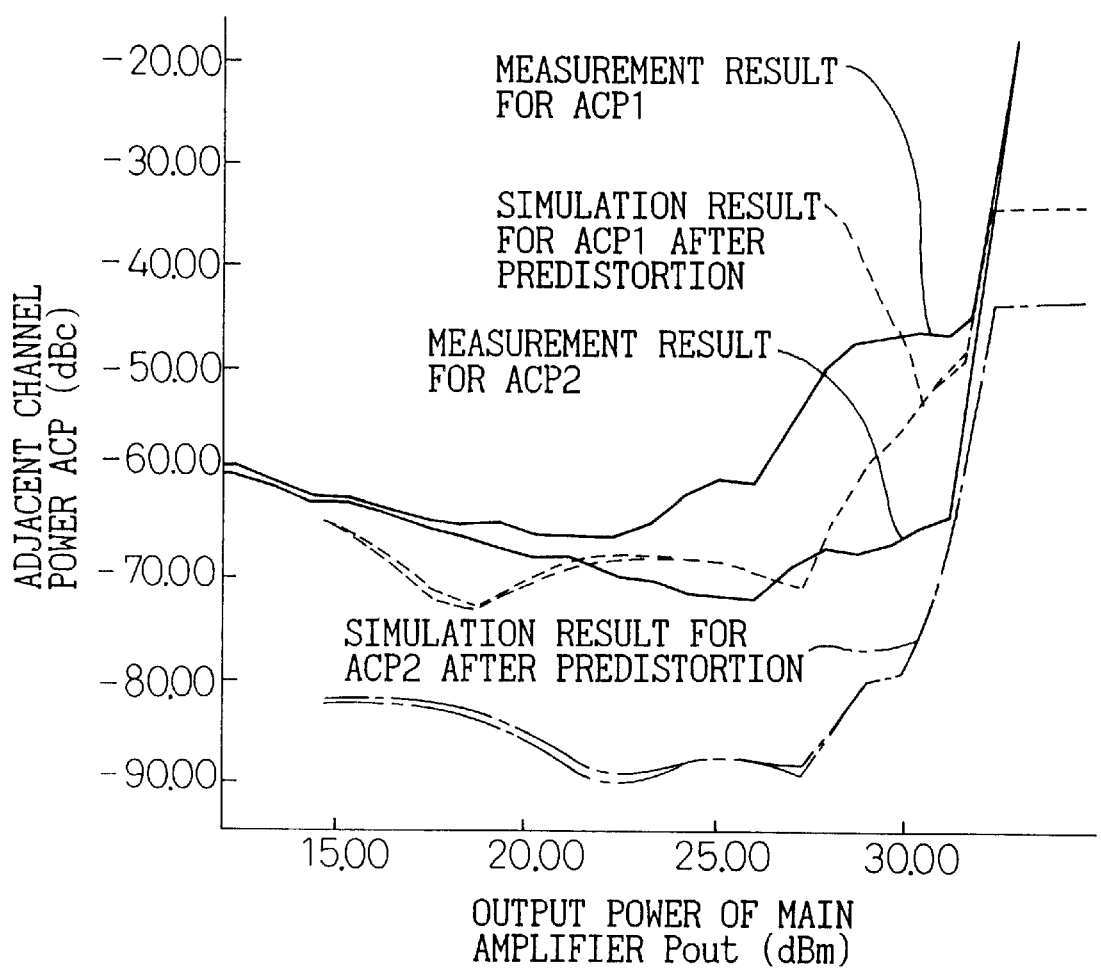
FIG. 11 is a graph showing the results of simulation in which a baseband signal is pre-distorted.
Figure 12:
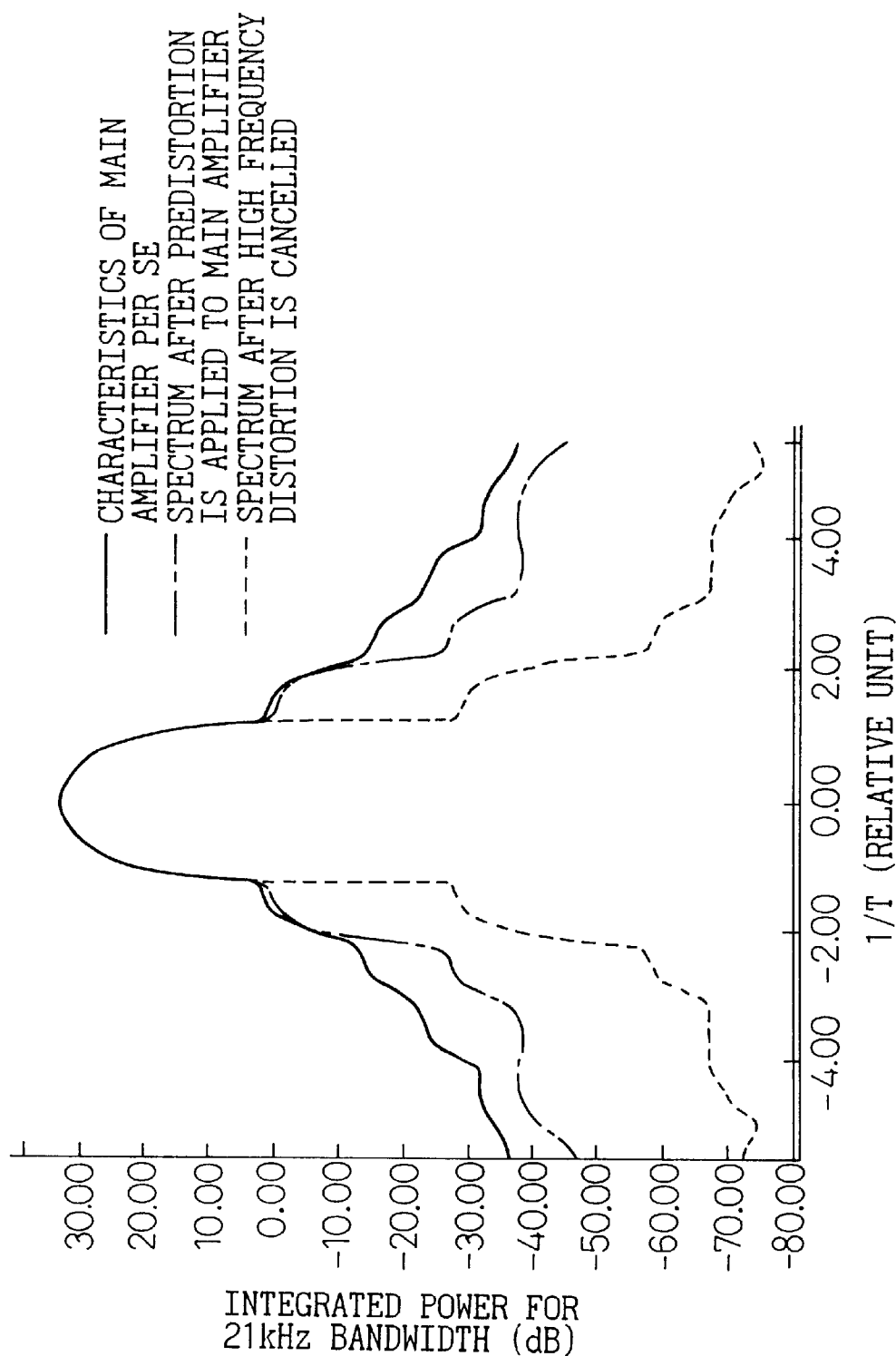
FIG. 12 is a graph indicating changes in spectrum caused by canceling out high-frequency amplitude distortion components and applying predistortion components.

FIG. 11 is a graph showing the results of simulation in which a baseband signal is pre-distorted, FIG. 12 is a graph showing changes in spectrum caused by canceling out high-frequency amplitude distortion components and by carrying out predistortion.

In the graph of FIG. 11, two solid lines indicate the results of measuring adjacent channel power ACP1 leaking out of adjacent channels, and the results of measuring adjacent channel power ACP2 leaking out of channels adjoining the adjacent channels. For the measurement, the amplitude distortion impairing the linearity, and occurring in an amplifier, is not corrected. Two dashed lines indicate adjacent channel power ACP1 leaking out of the adjacent channels when simulation is carried out by pre-distorting a baseband signal. Two dot-dash lines indicate adjacent channel power ACP2 leaking out of the channels adjoining the adjacent channels when simulation is carried out by pre-distorting the baseband signal.

As is apparent from the graph of FIG. 11, the adjacent channel power ACP1 leaking out of the adjacent channels and the adjacent channel power ACP2 leaking out of the channels adjoining the adjacent channels are reduced by 20 dB to 40 dB, and thus adjacent channel power ACP can be reduced drastically by pre-distorting the baseband signal.

FIG. 12 shows spectra of frequencies (1/T) of integrated power having a bandwidth of 21 kHz, that is, spectra attained when an average output power level is 30.5 dBm. In the graph of FIG. 12, a spectrum representing frequency characteristics of a main amplitude and not including frequencies of corrected amplitude distortion components is indicated with a solid line, a spectrum including frequencies of pre-distorted components is indicated with a dot-dash line, and a spectrum including frequencies of components remaining after high-frequency amplitude distortion components alone are amplified, removed from an output signal of the main amplifier, and then canceled out, is indicated with a dashed line.

In this case, when frequency characteristics of a main amplifier are reproduced and when predistortion is carried out, power of 18 dBm is input. When high-frequency amplitude distortion components alone are amplified and removed from an output signal of the main amplifier, power of 16.2 dBm is input. Each spectrum is integrated by passing the frequency components through an "ideal filter" having a bandwidth of 21 kHz. As far as frequency bands having a difference of 50 kHz (±2.38/T) (that is, adjacent channel power ACP1 leaking out of adjacent channels) between them are concerned, the spectrum including frequencies of pre-distorted components is lowered by approximately 10 dB compared with the spectrum representing the frequency characteristics of the main amplifier. The spectrum including frequencies of components remaining after high-frequency amplitude distortion components alone are amplified and removed from the output signal of the main amplifier is lowered approximately 40 dB compared with the spectrum representing the frequency characteristics of the main amplifier.

(D) Summary of Two Methods for Correcting Signals

As mentioned above, two methods for correcting signals which are intended to improve distortion characteristics of a microwave amplifier, which impairs the linearity, have been discussed in detail. The first method for correcting signals is such that nonlinear distortion components alone are amplified by an amplifier offering good linearity, and are subtracted from an output signal of a main amplifier whose output signal is the subject for correction. An envelope amplitude function defined by a thirteenth-order polynomial was used to carry out simulation. It was demonstrated that adjacent channel power ACP was reduced by 40 dB or more. Likewise, the sign of a polynomial serving as an approximate expression of an envelope phase function is reversed in order to pre-distort in phase an input signal of the main amplifier. However, in this case, another amplifier is needed for correcting the distortion characteristics of the main amplifier. The feasibility of adapting this method to portable telephones and portable equipment is poor.

The second method for correcting signals is such that an input signal is pre-distorted so that an output amplitude of an amplifier will have a linear relationship to an input amplitude. The sign of a phase transfer function concerning the distorted signal is reversed, and then a resultant signal is input to the amplifier.

According, especially, to the second method for correcting signals, when a predistortion function was calculated and simulation was carried out, it was revealed that adjacent channel power ACP was reduced by about 10 dB. As long as a digital signal processor (DSP) has an extra ability, only a modification to firmware is required.

If the relationship between a modulation signal and high-frequency output signal can be expressed in the same form as an envelope function concerning a narrow-band amplifier which was employed in the simulation, the distortion characteristics of a modulator or multiplier concerning the distortion impairing the linearity can be improved. When a portable telephone or portable equipment is in operation, if linearity offered by an amplifier or adjacent channel power ACP is measured, coefficients in a predistortion function can be updated for keeping up with a change in characteristics of a circuit by executing a smaller number of processing steps than the number of processing steps required conventionally.

Figure 13:
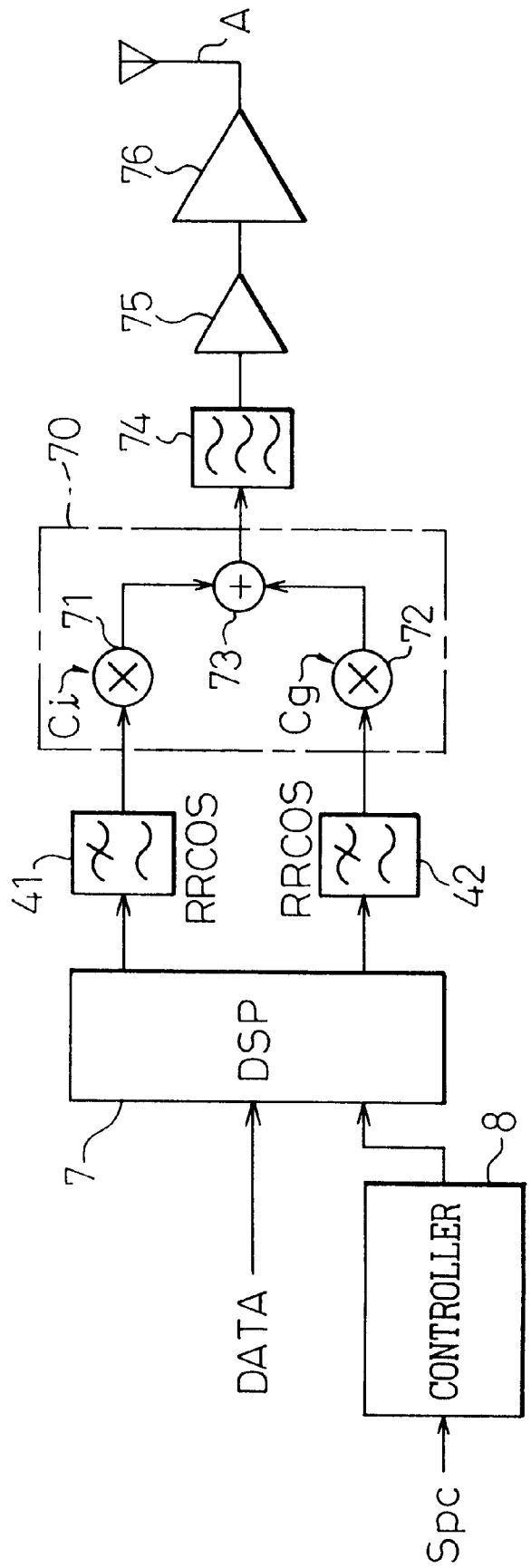
FIG. 13 is a block diagram showing an example of a transmitter including an apparatus for correcting signals in accordance with the present invention.
Figure 14:
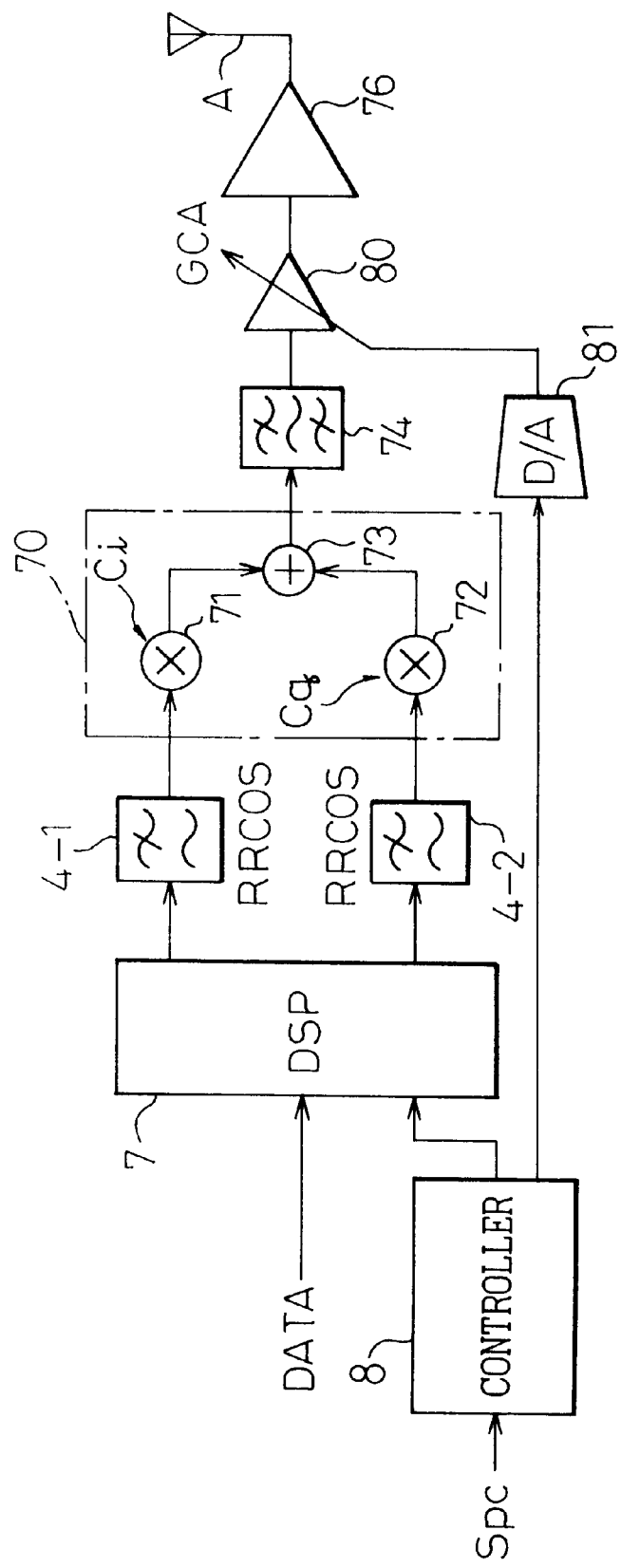
FIG. 14 is a block diagram showing an example of a transmitter in accordance with the prior art which is presented for comparison with the transmitter shown in FIG. 13.

FIG. 13 is a circuit block diagram showing an example of a transmitter including an apparatus for correcting signals in accordance with the present invention; and FIG. 14 is a circuit block diagram showing an example of a transmitter in accordance with the prior art which is presented for comparison with the transmitter shown in FIG. 13.

The transmitter shown in FIG. 13 comprises, in addition to the apparatus for correcting signals according to the third preferred embodiment of the present invention, a narrow-band signal generating unit 74, a front-end amplifier 75, a main amplifier 76, and an antenna A, and thus transmits a signal of a specific frequency band having the amplitude distortion and the phase distortion impairing the linearity thereof corrected.

Referring to FIG. 13, the means for estimating distortion characteristics in high-frequency circuit portion 2 (FIG. 2), which estimates distortion characteristics of the main amplifier 76 concerning the amplitude distortion and the phase distortion impairing the linearity, is composed of a digital signal processor (DSP) 7 and a controller 8 formed with a CPU for controlling the DSP 7. The DSP 7 defines a digital filter for calculating an amplitude distortion correcting function and phase distortion correcting function, which are used to correct the amplitude distortion and the phase distortion occurring in the main amplifier 76, on the basis of a data signal DATA such as a complex-number signal according to the distortion characteristics of the main amplifier 76 and a power control signal Spc output from the controller 8.

In FIG. 13, there is shown a first low-pass signal generating unit 41 and second low-pass signal generating unit 42 which are formed with low-pass filters characterized to pass desired low frequencies by means of the digital filter defined by the DSP 7. The first low-pass signal generating unit 41 and second low-pass signal generating unit 42 are preferably formed with RRCOS filters exhibiting a root Nyquist characteristic. The first low-pass signal generating unit 41 and second low-pass signal generating unit 42 have the ability to reproduce nonlinear distortion components occurring in the main amplifier by passing a real-part signal I and imaginary-part signal Q constituting a complex-number signal, which has components reflecting the distortion characteristics of the main amplifier, and being produced by the DSP 7.

Referring to FIG. 13, a quadrature modulation unit 70 for modulating the real-part and imaginary-part signals of the complex-number signal, which are produced by the RRCOS filters and have components representing an amplitude distortion correcting function and phase distortion correcting function, and producing a desired intermediate-frequency or high-frequency modulation signal is installed on the output stage of the first low-pass signal generating unit 41 and second low-pass signal generating unit 42.

The quadrature modulation unit 70 includes an in-phase carrier wave multiplier 71, a 90° out-of-phase carrier wave multiplier 72, and an adder 73. The adder 73 has the ability to add up an in-phase quadrature modulation signal and 90° out-of-phase quadrature modulation signal output from the in-phase carrier wave multiplier 71 and 90° out-of-phase carrier wave multiplier 72 respectively, and the ability to add up two kinds of signals having the amplitude distortion and the phase distortion thereof corrected.

Furthermore, a quadrature modulation signal having the amplitude distortion and the phase distortion thereof corrected simultaneously is output from the quadrature modulation unit 70, and then supplied to the narrow-band signal generating unit 74 including a narrow-band filter. The narrow-band signal generating unit 74 produces a signal having frequencies thereof passed with respect to a specified bandwidth. The signal is then supplied to the front-end amplifier 75 offering good linearity. Finally, an output signal having amplitude distortion components and phase distortion components thereof canceled out is output through the output terminal of the main amplifier 76 offering nonlinearity.

On the other hand, in the transmitter in accordance with the prior art shown in FIG. 14, the controller 8 does not have a facility for estimating the distortion characteristics of the main amplifier 76. The first low-pass signal generating unit 41 and second low-pass signal generating unit 42 cannot therefore produce the real-part and imaginary-part signals of a complex-number signal, which contain components representing an amplitude distortion correcting function and phase distortion correcting function, by reproducing nonlinear distortion components occurring in the main amplifier.

Instead of the facility, the transmitter in accordance with the prior art has a gain control amplifier 80 on the input stage of the main amplifier 76. A gain produced by the gain control amplifier 80 is adjusted properly according to a gain control signal supplied from the controller 8 to the gain control amplifier 80 via a digital-to-analog converter 81. The influence of the distortion impairing the linearity and occurring in the main amplifier upon the transmitter, is thus limited.

Unlike the transmitter in accordance with the present invention, the transmitter having this configuration has drawbacks that it is difficult to adjust a gain to be produced by an analog gain control amplifier with high accuracy and that the circuitry is complex.

Preferably, in the transmitter in accordance with the present invention shown in FIG. 13, after distortion components reproduced according to the distortion characteristics of the narrow-band amplifier are appended to low-pass signals, the low-pass signals are multiplied by a carrier wave for digital modification. The low-pass signals undergoing this digital modulation are supplied to the narrow-band amplifier. The narrow-band amplifier then transmits a signal of a specified frequency band having the amplitude distortion or the phase distortion impairing the linearity thereof corrected.

More preferably, in the transmitter in accordance with the present invention shown in FIG. 13, a complex-number signal, including real-part and imaginary-part signals, which are characterized to have desired low frequencies by means of low-pass filters, is used as an input signal. The input signal containing components representing a function of an absolute value of the complex-number signal or a function of a sum of squares of the real-part and imaginary-part signals is subjected to digital quadrature modulation. A signal resulting from the digital quadrature modulation is supplied to the narrow-band amplifier. The narrow-band amplifier then transmits a signal of a specified frequency band having the amplitude distortion and the phase distortion impairing the linearity thereof corrected.

Next, a method by which nonlinearity of the power amplifier 10 is changed into linearity will be explained below.

Figure 16:
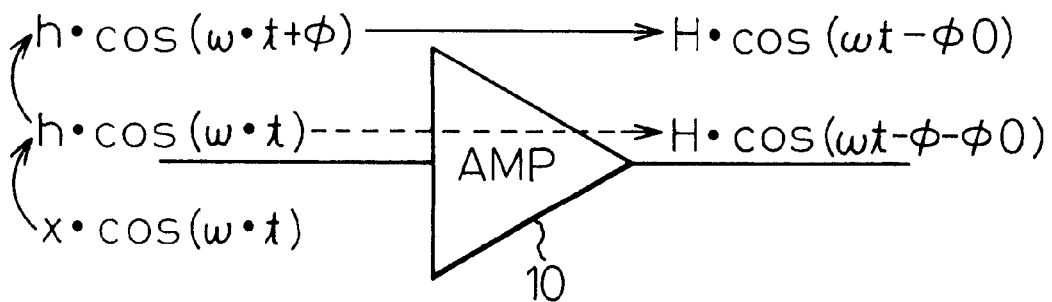
FIG. 16 is a schematic illustration for explaining circumstances of distortion compensation of a power amplifier.

FIG. 15 is a graph showing a relationship between the input amplitude of the power amplifier 10 and the output amplitude, and FIG. 16 is a diagram for explaining a state of distortion compensation of the power amplifier 10.

A relation of the output amplitude to the input amplitude of RF power amplifier, the electric power efficiency of which is high, is nonlinear in a region in which the input amplitude is large as shown in FIG. 15. For example, when the input amplitude is x1, the output amplitude becomes g(x1). When x1 is changed to hi, a point determined by (x1, g(h1)) is on a straight line in FIG. 15. Therefore, a relation between x and g(h(x)) can be made linear as follows. A relationship between x=x1 and h=h1 is previously found with respect to an arbitrary value of x. When the input amplitude is x, this value is previously distorted to a value of the predistortion function h(x) on the upstream side of the power amplifier 10. Due to the foregoing, the relationship between x and g(h(x)) can be made linear.

In other words, as shown in FIG. 16, when the original input to the power amplifier 10 is x·cos($\omega$·t), the input amplitude is previously distorted from x to h as described above, and h·cos($\omega$·t) is inputted into the power amplifier 10. Then, an output of the power amplifier 10 becomes h·cos ($\omega$·t−$\phi$−$\phi$0). In this case, $\phi$0 is a slippage of the phase that is not caused by h, and $\phi$ is a slippage of the phase that is caused by h. In order to correct the slippage $\phi$ of the phase, the phase of h·cos($\omega$·t) is previously sifted by $\phi$, and h·cos($\omega$·t+$\phi$) is inputted into the power amplifier 10. Due to the foregoing, the amplitude and phase of the output of the power amplifier 10 can be compensated.

FIG. 17 is a block diagram showing another transmitter of the present invention.

In this transmitter, the digital signal processor (DSP) 7A conducts processing until S is divided into two orthogonal components and subjected to predistortion. The function in DSP 7A is realized by a program. In FIG. 17, this function is shown by blocks.

Figure 19:
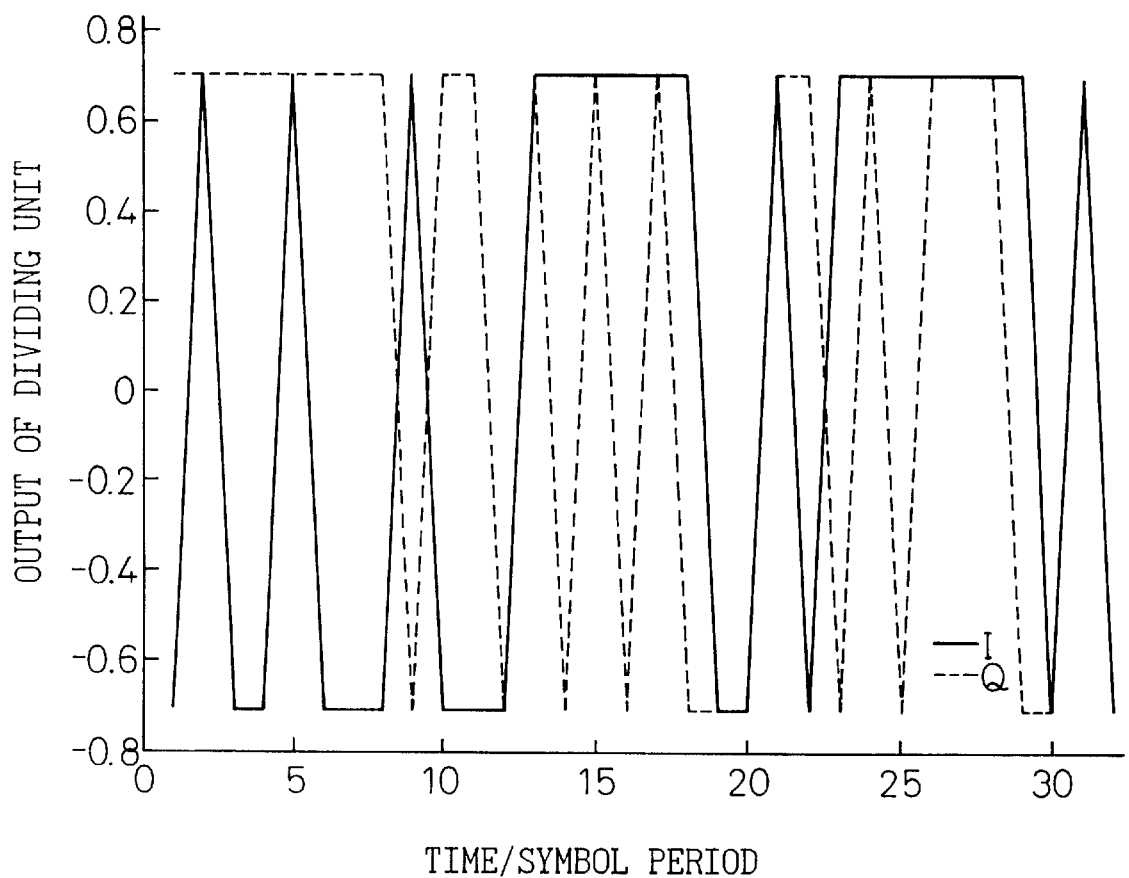
FIG. 19 is a diagram showing an output waveform of a dividing unit in FIG. 17.

Base band signal S in series to be transmitted is made to be a 2-bit parallel signal in which the in-phase component is I and the orthogonal component is Q, and the bit continuation time is twice as long as the time of signal S. FIG. 19 is a diagram showing a specific example of the waveforms of signals I and Q. In FIG. 19, bit "0" is made to correspond to −0.7, and bit "1" is made to correspond to 0.7. The reason why the waveform is inclined between "0" and "1" is to reduce the side lobe of the base band signal.

Referring to FIG. 17 again, signals I and Q are respectively supplied to the root-raised-cosine filters 4-1 and 4-2, the characteristics of which are the same. The reason why the root-raised-cosine filter is used as a low-pass filter is that the side lobe is cut as short as possible in order to prevent interference between the adjoining channels and further prevent interference between marks on the receiving side.

Figure 20:
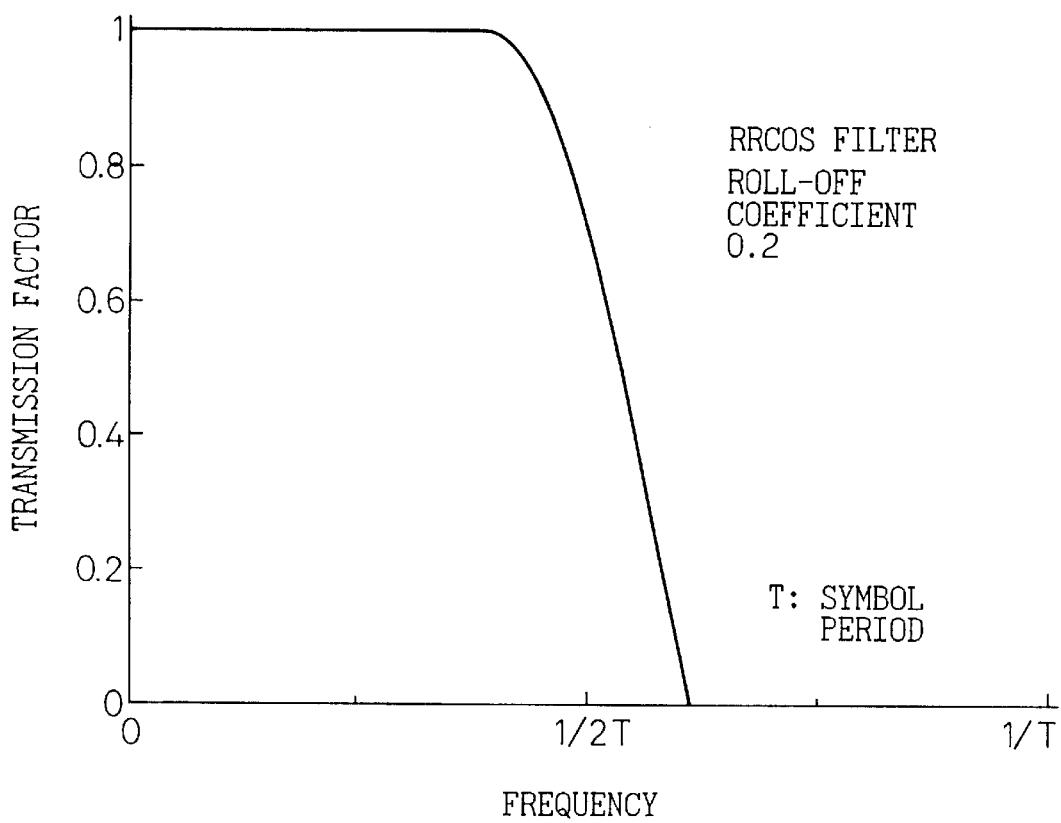
FIG. 20 is a characteristic diagram of a root-raised cosine filter, the roll-off coefficient of which is 0.2.
Figure 21:
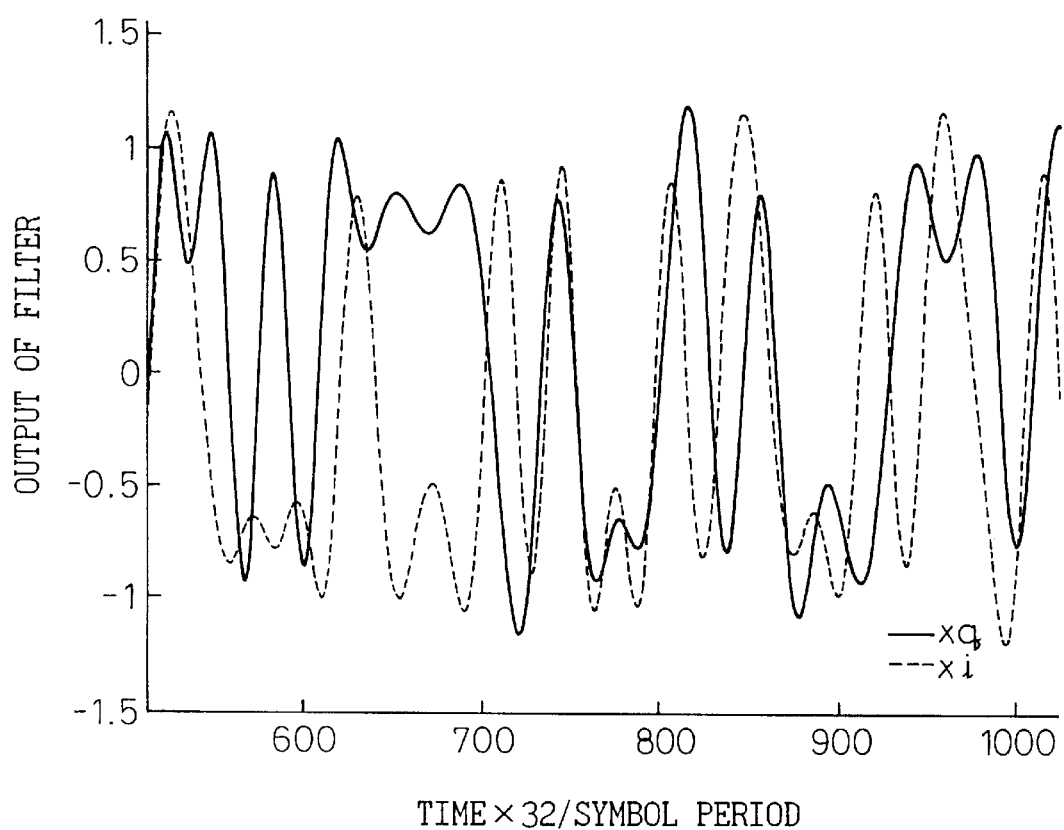
FIG. 21 is a view showing a waveform of a base band signal which has passed through a root-raised cosine filter.

The pass characteristics of the root-raised-cosine filter, the roll-off coefficient of which is 0.2, are shown in FIG. 20. FIG. 21 is a diagram showing the waveforms of signals xi and xq obtained when signals I and Q shown in FIG. 19 have passed through filters 4-1, 4-2, the characteristics of which are shown in FIG. 20. The time axis of FIG. 21 is shifted from that of FIG. 19. Therefore, FIG. 21 does not correspond to FIG. 19.

Referring to FIG. 17 again, the in-phase component xi is supplied to the absolute value calculating unit 30 and the predistortion unit 31, and the orthogonal component xq is supplied to the absolute value calculating unit 30 and the predistortion unit 32. In the absolute value calculating unit 30, an intensity x of vector (xi, xq) is calculated and supplied to the predistortion units 31, 32 and the phase pre-rotation unit 22. In FIG. 17, in order to facilitate understanding, the predistortion unit is divided into two predistortion units 31, 32. However, the two predistortion units 31, 32 function as one predistortion unit. The predistortion units 31, 32 are provided with parameters or reference tables as distortion compensation data, wherein the parameters or reference tables determine an approximate expression of the function h(x)/x in which the predistortion function h(x) is divided by x. When the predistortion units 31, 32 are provided with reference tables, the predistortion units 31, 32 designate the address x for the memory and read out the data h(x)/x. Then, the product h(x)·(xi/x) of this value h(x)/x and xi is calculated, and also the product h(x)·(xq/x) of this value h(x)/x and xq is calculated.

In the case in which values of the function h(x)/x are accurately calculated using a power development expression, its calculation circuit may be provided outside DSP 7A.

When the phase angle of the signals xi and xq is represented by x$\theta$, the outputs of the predistortion units 31, 32 can be respectively expressed by h(x)·cos x$\theta$ and h(x)·sin x$\theta$. The phase pre-rotation unit 22 rotates the phase angle of the input vector (h(x)cos(x$\theta$), h(x)·sin(x$\theta$)) by $\phi$(x), and supplies the in-phase component h(x)cos(x$\theta$+$\phi$) and the orthogonal component h(x)·sin(x$\theta$+$\phi$) respectively to D/A converters 24, 25. In the same manner as that of the predistortion units 31, 32, the phase pre-rotation unit 22 is provided with parameters or reference tables as distortion compensation data, wherein the parameters or reference tables determine an approximate expression of the function $\phi$(x).

The in-phase component and the orthogonal component of the output of the phase pre-rotation unit 22 are respectively made to be analogue signals by D/A converters 24, 25 arranged outside DSP 7A and supplied to the orthogonal modulation circuit 70.

In the orthogonal modulation circuit 70, the carrier wave $\cos(\omega \cdot t)$, which is outputted from the cosine wave generation circuit 91, is multiplied and modulated by the output of D/A converter 24 in the multiplying circuit 71. The phase of the output of the cosine wave generation circuit 91 is shifted by $\pi/2$ in the phase shifting circuit 92, and the carrier wave $\sin(\omega \cdot t)$ is generated, which is multiplied and modulated by an output of D/A converter 25 in the multiplying circuit 72. In the composite circuit 73, both modulation waves are added to each other, and a QPSK wave is formed and supplied to the power amplifier 10. This QPSK wave becomes $h(x) \cdot \cos(x\theta + \phi) \cdot \cos(\omega \cdot t) \cdot h(x) \cdot \sin(x\theta + \phi) \cdot \sin(\omega \cdot t) = h(x) \cdot \cos(\omega \cdot t + x\theta + \phi)$. That is, $h(x)$ becomes the input amplitude of the power amplifier 10.

Electric waves are transmitted from antenna A by the output of the power amplifier 10.

When the absolute value calculating unit 30, the predistortion units 31, 32 and the phase pre-rotation unit 22 are not used, $h(x)=x$, and $\phi=0$. Therefore, an output of the composite circuit 73 becomes $x \cdot \cos(\omega \cdot t + x\phi)$, and x becomes an input amplitude of the power amplifier 10. That is, by the compensation of the predistortion units 31, 32, an output of the composite circuit 73 becomes as follows. As shown in FIG. 14(B), $x \cdot \cos(\omega \cdot t)$ becomes $h \cdot \cos(\omega \cdot t)$. Further, by the compensation of the phase pre-rotation unit 22, this becomes $h \cdot \cos(\omega \cdot t + \phi)$. Accordingly, the output of the power amplifier 10 becomes $g(h) \cdot \cos(\omega \cdot t - \phi 0)$ in which distortion caused by nonlinearity has been corrected.

The above functions or tables, which are used in the predistortion units 31, 32 and the phase pre-rotation unit 22, are determined as follows.

The amplifier characteristics detecting unit 2A outputs a signal, which has already been known, to DSP 7A, and sampling is conducted on the output of the power amplifier 10 via the orthogonal restoring circuit 93 and D/A converter 94. The amplitude $g(h)$ and slippage of $\phi(h)+\phi 0$ of the phase are measured, and the results are supplied to the unit 2B for preparing distortion compensation data. The input amplitude h of the power amplifier 10 is an intensity h of the output vector of DSP 7A, and the digital value h is received from DSP 7A. Due to the foregoing, consideration can be given not only to the nonlinearity of the power amplifier 10 but also to the nonlinearity of the circuit formed between the DSP 7A and the power amplifier 10.

The unit 2B for preparing distortion compensation data is composed of a processor, for example, one chip microcomputer or DSP. This unit 2B for preparing distortion compensation data conducts processing as follows according to a schematic illustration shown in FIG. 18.

(1) The measured waveform of $g(x)$ is made to be approximate to a power development expression of x. A coefficient $aj$ ($j=1$ to N) of the degree j of x in the power development expression can be determined by the method of least squares.

(2) Next, $h(x)$ is made to be approximate to a power development expression of x. A coefficient of the degree j of x is $cj$ ($j=1$ to N) in the power development expression. As shown in FIG. 15, the equation of $g(h(x))=a1 \cdot x$ is established. Therefore, the coefficient of j ($j=1$ to N) is determined so that $|g(h(x))-a1 \cdot x|$ can be minimum. As can be seen in FIG. 15, $c1=1$.

(3) When the predistortion units 31, 32 find $h(x)/x$ by a polynomial calculation, the coefficient $cj$ ($j=1$ to N) is supplied to the predistortion units 31, 32. For example, $N=10$. In this case, it is possible to reduce a necessary amount of distortion correction data. When the predistortion units 31, 32 use a reference table, a table on which $h(x)/x$ is made to correspond to x is made, and this table is stored in memories used by the predistortion units 31, 32.

(4) The measured waveform of $\phi(x)$ is stored as a reference table in the memory used by the phase pre-rotation unit 22. Alternatively, this waveform is made to be approximate to a power development expression of x, and the coefficient of development is supplied to the phase pre-rotation unit 22.

According to the transmitter having the above structure, when the function $h(x)/x$ is multiplied by the in-phase component xi and the orthogonal component xq in accordance with an intensity x of the vector of the in-phase component xi and the orthogonal component xq, predistortion can be easily and accurately conducted.

In FIG. 16, when the amplitude x before conducting the predistortion is large, the amplitude h after the predistortion becomes larger. When the apparatus shown in FIG. 17 is used for a portable telephone, it is necessary to extend life of a battery. Therefore, an upper limit of the amplitude at which no signal is saturated is relatively low. For the above reasons, when the amplitude x is large, the circuit between DSP 7A and the power amplifier 10 shown in FIG. 17 is saturated, and an output of the composite circuit 73 is subjected to clipping. As a result, an output of the power amplifier 10 is distorted compared with a case in which distortion compensation is not conducted. Accordingly, a leakage of electric power to the adjoining channel exceeds an allowable value. In other words, an average transmitting electric power of the transmitter is limited.

In order to solve the above problems, it is possible to take the following countermeasures. When nonlinearity of the power amplifier 10 is appropriately corrected, the leakage of electric power (electric power of the side lobe) to the adjoining channel is suppressed so that it cannot exceed the allowable value.

Next, a method will be explained as follows, by which the predistortion function $h(x)$ for conducting the above correction can be easily and effectively obtained.

For example, in wide band CDMA, the band width of a base band signal is 4,096 MHz with respect to the frequency 1.9 GHz of carrier waves. In order to simplify the explanation, the base band signal x is a multiple signal $A(\sin(\omega 1 \cdot t)+\sin(\omega 2 \cdot t))$ of the angular frequency $\omega 1$ and the angular frequency $\omega 2$. This signal can be expressed by $2A(\cos(((\omega 1-\omega 2)t/2) \cdot \sin((\omega 1+\omega 2)t/2)$, and the amplitude x can be expressed by $2A|(\cos((\omega 1-\omega 2)t/2)|$.

When the characteristics of the power amplifier 10 are linear, distortion of the amplitude $2A|(\cos((\omega 1-\omega 2)t/2)|$, which has been subjected to intermodulation, is not outputted from the power amplifier 10. However, the characteristics of the power amplifier 10 are actually nonlinear. Therefore, a signal of intermodulation of the degree $m(m \cdot 2, 3, 4, \ldots )$, the angular frequency of which is $m(\omega 1-\omega 2)$, is outputted from the power amplifier 10. In accordance with the deterioration of linearity of $g(x)$, the degree m, which can not be neglected, is increased.

In the determination of $h(x)$, if the intermodulation wave amplitude $x=2A|(\cos((\omega 1-\omega 2)t/2)|$ is used and the secondary intermodulation distortion of $g(h(x))$ can be minimized, $g(h(x))$, the linearity of $g(x)$ of which is improved, can be easily and effectively obtained without giving consideration to the intermodulation distortion, the degree of which is not less than tertiary.

This predistortion function $h(x)$ is found in the unit 2B for preparing distortion compensation data shown in FIG. 15 by the method shown in FIG. 16. Development coefficients of g(x) and h(x) are expressed by the same characters in the following explanations. Marks in parentheses are the step identification marks shown in FIG. 18.

(S1) As described above, g(x) is made to be approximate to an expression of the degree N of x, and the power development coefficients $a_1$ to aN are determined.

(S2) Initial values are given to the power development coefficients c1 to cN when h(x) is made to be approximate to an expression of N degree of x. When g(x) is linear, h=x. Therefore, it is most natural that the initial values are set at c1=1, cj=0(j=2 to N).

(S3) A waveform of h(x(t)) with respect to the time t is found by numerical calculation. In this case, $x(t)=2A|\cos((\omega 1-\omega 2)t/2)|$.

(S4) A waveform of g(x(t)) with respect to the time t is found by numerical calculation.

(S5) The primary Fourier coefficient IM(1) and the secondary Fourier coefficient IM(2) in the coefficients IM(m) of the Fourier term $\cos(m(\omega 1-\omega 2)t/2)$ of the waveform of g(h(x(t))) are calculated.

Since IM(m) is used when |IM(2)/IM(1)| is found in the next step S6, the multiplication by a constant and the mark may be arbitrarily determined. In the mathematical calculation, g(x) may be set at g(-x)=-g(x) so that it can be symmetrical with respect to the origin and the definition region of x may be extended to a negative region. That is, it is possible to set to be $g(-\cos((\omega 1-\omega 2)t/2))=-g(\cos((\omega 1-\omega 2)t/2))$. Then, for example, IM(k) is found by the following expression.

$IM(k)=g(h)\cdot s \cdot EXP(i\cdot k(\omega 1-\omega 2)t/2)dt$. In this case, i is a unit of an imaginary number, s is a code of $\cos((\omega 1-\omega 2)t/2)$, and a range of integration is from $-2\pi/(\omega 1-\omega 2)$ to $2\pi/(\omega 1-\omega 2)$.

(S6) The secondary intermodulation distortion ratio $\epsilon=|IM(2)/IM(1)|$ is calculated.

In the following steps S7 to S12, processing is repeated by the method of steepest descent until $\epsilon$ becomes a local minimum, and the power development coefficients c1 to cN of h(x) are determined.

(S7) The increment dc1 of c1 is given an initial value, and the increment dcj of cj (j=2 to n) is found in the order of j=2 to N by the expression dcj=$\epsilon$/dck. In this case, k=j-1.

(S8) $\epsilon p \leftarrow \epsilon$ (S9) cj $\leftarrow$ cj+dcj with respect to each of j=1 to N (S10) The above steps S3 to S6 are carried out with respect to h(x) determined by c1 to cN obtained in step S9.

(S11) dc1$\leftarrow -\eta\cdot\epsilon(\epsilon-\epsilon p)/dc1$

In this case, dc2 to dcN are renewed in the same manner as that shown in Step S7.

(S12) When the expression of $|\epsilon-\epsilon p|\geq\Delta$ is satisfied, the program returns to step S8. When the expression of $|\epsilon-\epsilon p|\geq\Delta$ is is not satisfied, the program proceeds to step S13. In this case, $\Delta$ is a minute value that has been previously given.

(S13) As described above, the predistortion units 31, 32 shown in FIG. 17 are supplied with c1 to cN which are renewed values of compensation data. Alternatively, a table on which h(x)/x is made to correspond to x is made and supplied.

A table of $\phi(x)$ with respect to the phase pre-rotation unit 22 is found by the same method as that shown in FIG. 17.

The above processing is conducted, for example, at predetermined periods of time or according to a changeover of a ratio of amplification or a change in temperature. In a case immediately after the electric power source has been turned on, that is, when a change in the characteristics of the power amplifier 10 are so quick that the unit for preparing distortion compensation data can not follow the change, an output of the power amplifier 10 is limited so that the side lobe is decreased.

In this connection, h(x) depends upon a difference ($\omega 1-\omega 2$) in the angular frequency in the expression of the amplitude x. Also, h(x) depends upon the amplitude 2A. However, when the value of $\omega 1$ and the value of $\omega 2$ are somewhat different from each other, h(x) seldom depends upon the value of ($\omega 1-\omega 2$). Therefore, for example, ($\omega 1-\omega 2$)/($2\pi$) is made to be a bandwidth of the base band signal. When the value 2A of the amplitude x is determined by the maximum value of the input amplitude of the power amplifier 10 actually used, the predistortion function h(x) capable of enhancing the average transmitting power is determined. In the case of a portable telephone, an input amplitude of the power amplifier 10 is adjusted by a control signal sent from a base station. Therefore, the value 2A of the amplitude according to that is used. This value of the amplitude is described later in reference to simulation.

A result of simulation will be explained as follows.

Figure 18:
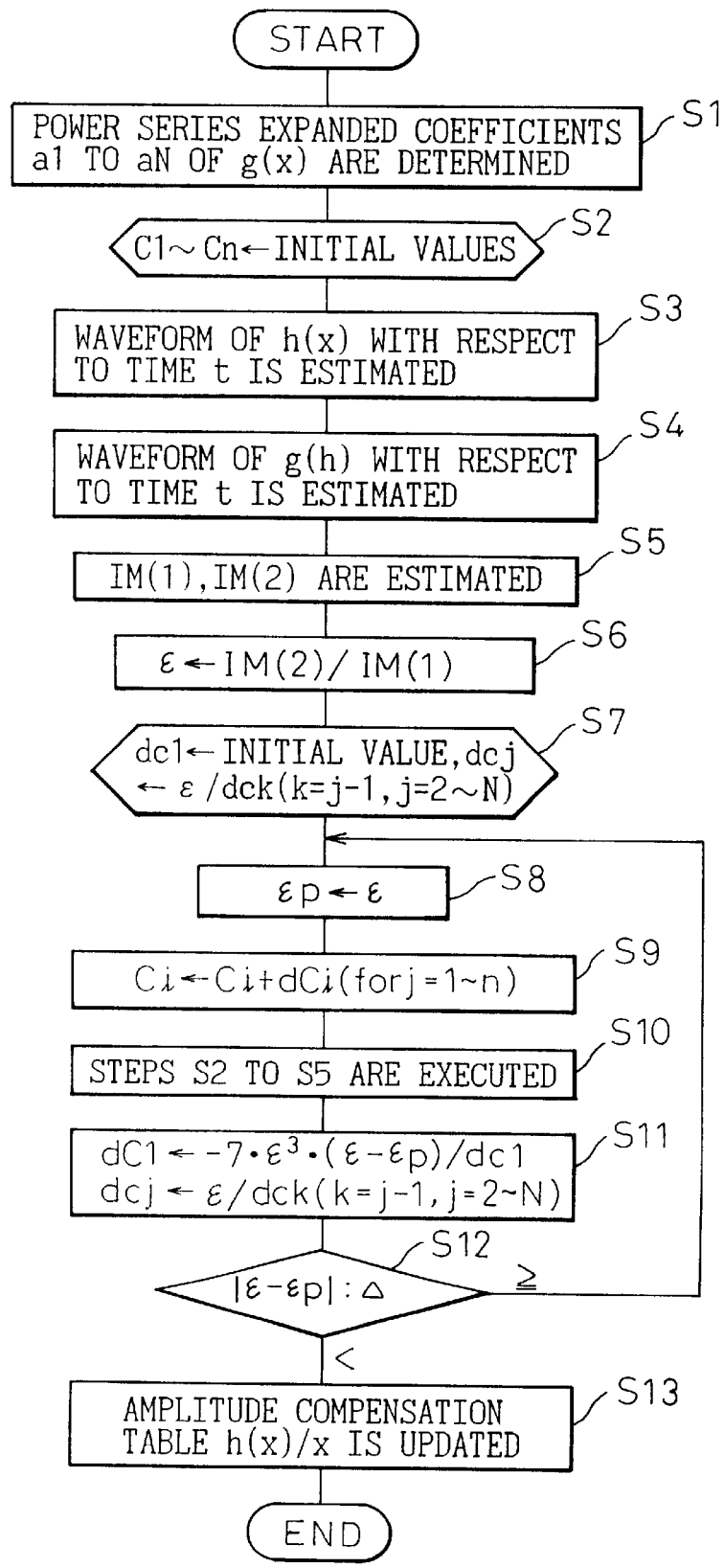
FIG. 18 is a flow chart showing a method of finding a predistortion function h(x) for moderately correcting non-linearity of a power amplifier.
Figure 22:
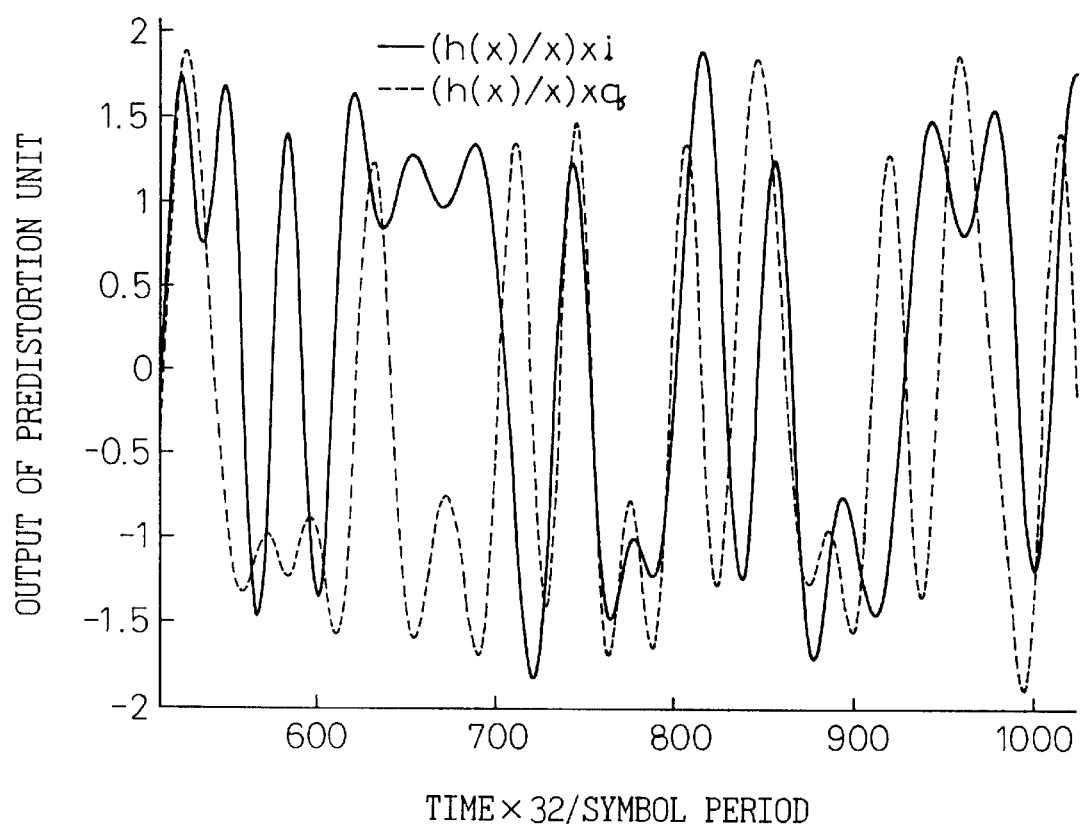
FIG. 22 is a waveform diagram of an output of a predistortion unit.
Figure 23:
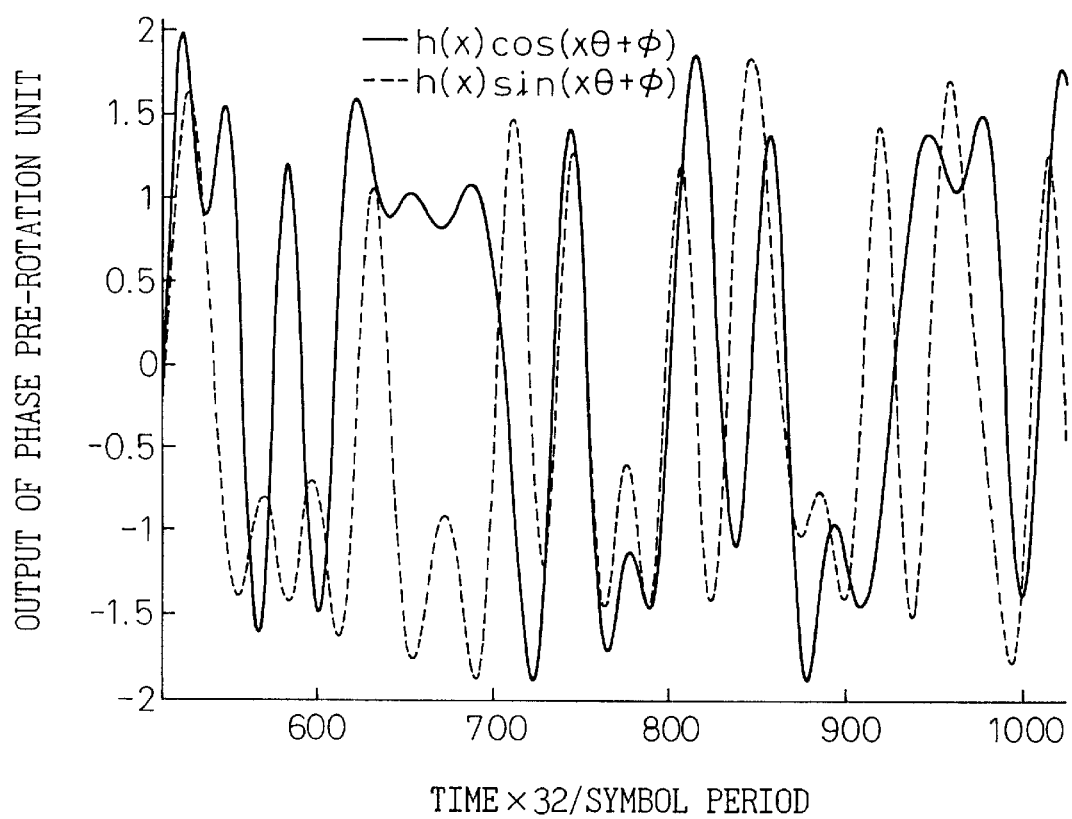
FIG. 23 is a waveform diagram of an output of phase pre-rotation unit.
Figure 24:
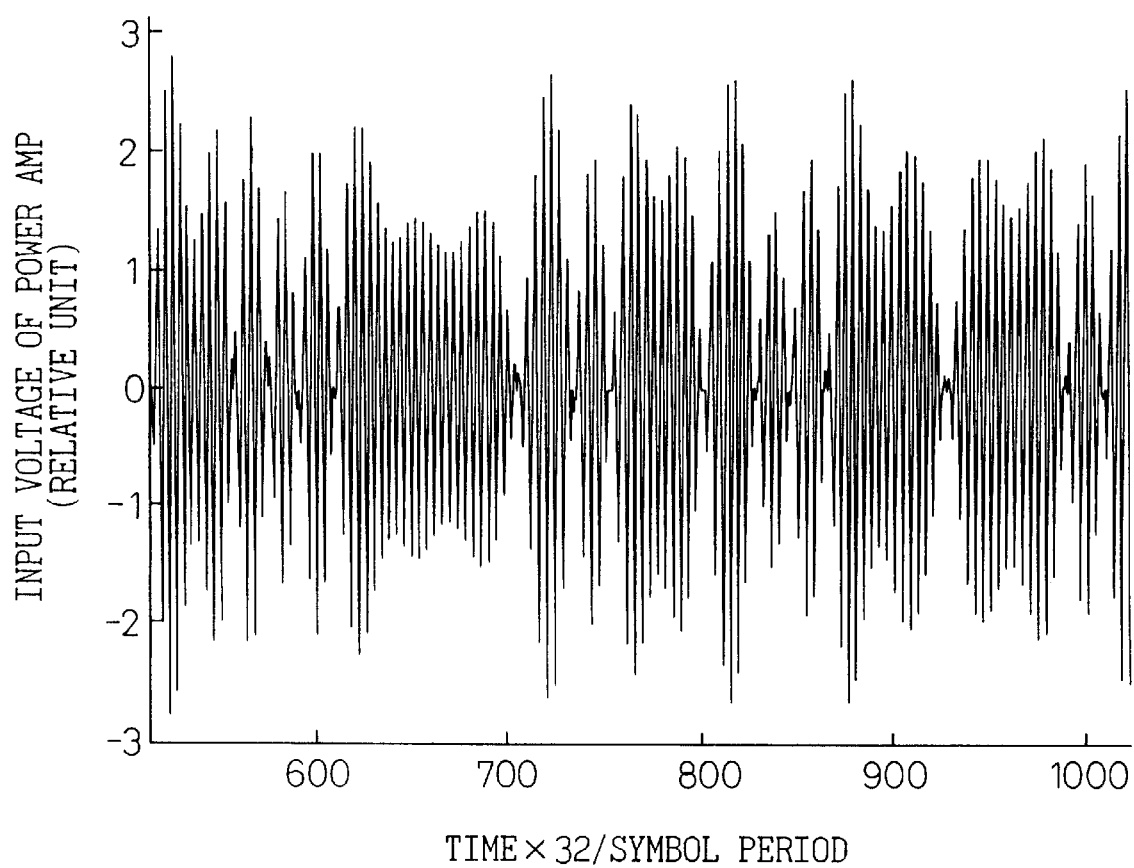
FIG. 24 is a diagram showing a waveform of an input of a power amplifier, wherein the frequency of carrier waves is reduced.
Figure 25:
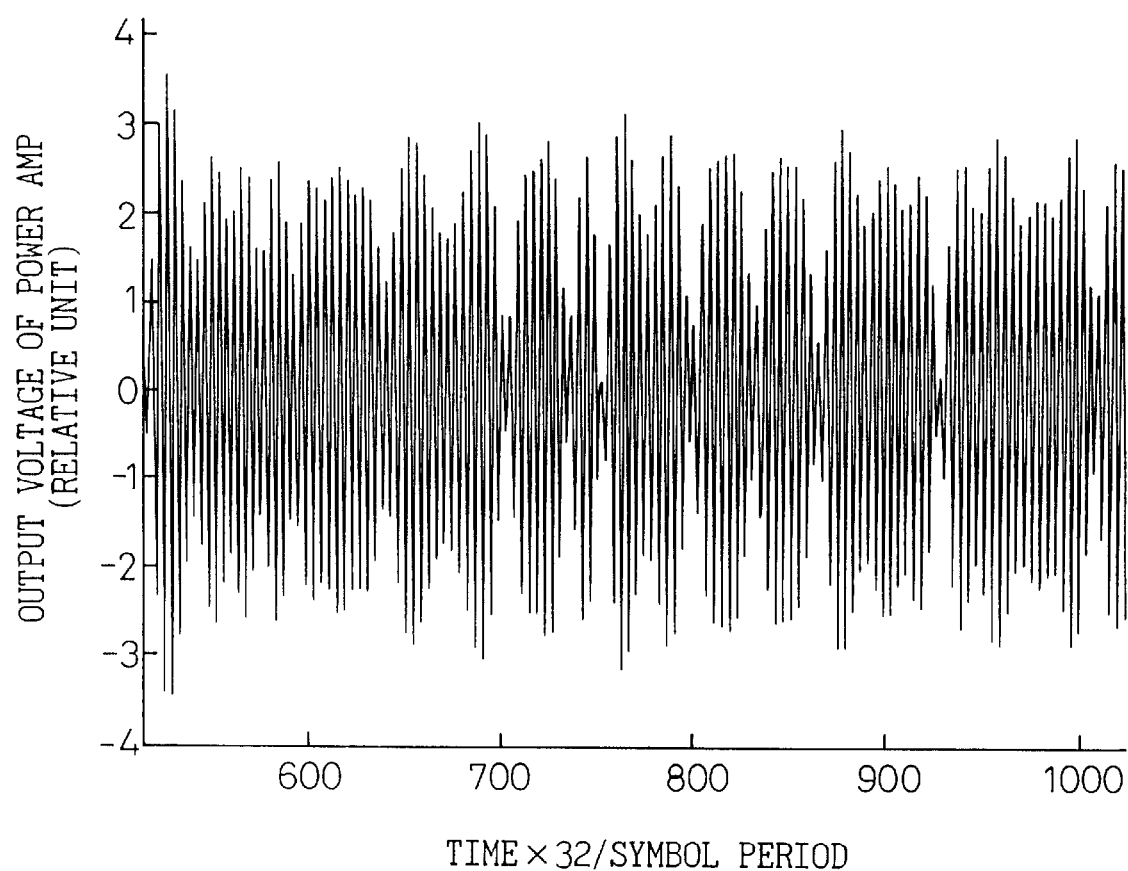
FIG. 25 is a waveform diagram of an output of a power amplifier.

FIGS. 22 to 25 are views showing cases in which the predistortion function h(x) found by the method shown in FIG. 18 is used. FIG. 22 is an output waveform diagram of the predistortion units 31, 32 shown in FIG. 17; FIG. 23 is an output waveform diagram of the phase pre-rotation unit 22 shown in FIG. 17; and FIGS. 24 and 25 are respectively an input and an output waveform diagram of the power amplifier 10. However, in FIGS. 24 and 25, the carrier wave frequency is made to be 672 kHz, which is considerably lower than the actual carrier wave frequency, so that the waveform can be confirmed.

Figure 26:
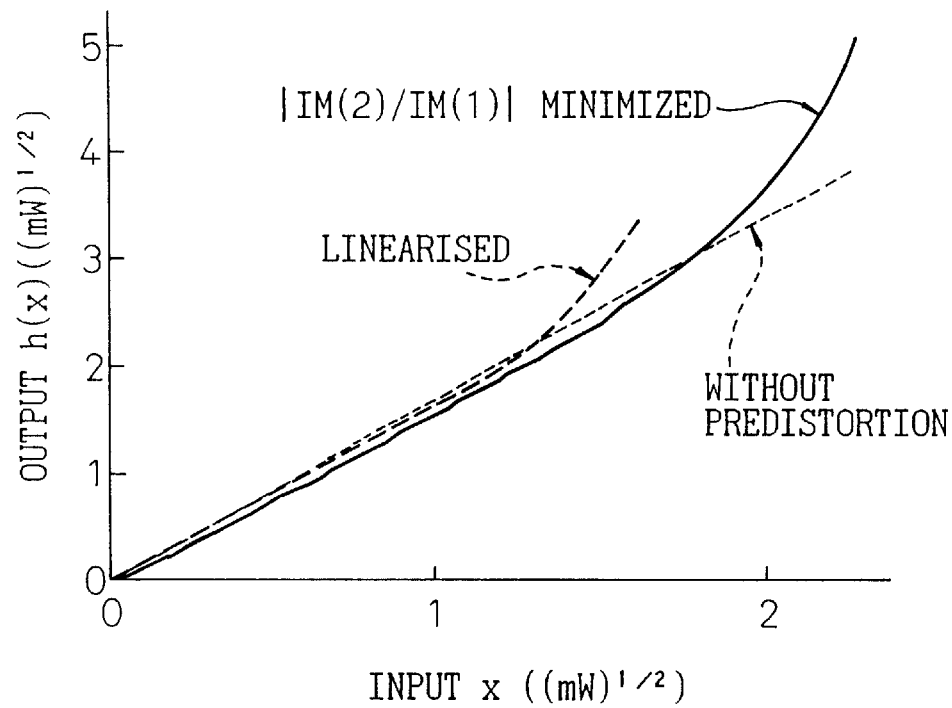
FIG. 26 is a diagram in which predistortion functions h(x) are respectively shown by a short dotted line, long dotted-line and solid line, wherein the short dotted line is a case in which predistortion is not conducted at all (h=x), the long dotted line is a case in which g(h(x)) is made linear, and the solid line is a case in which |IM(2)/IM(1)| is locally minimized by the method shown in FIG. 18.

In FIG. 26, a short-dotted-line expresses the predistortion function h(x) in the case in which the predistortion is not conducted at all, a long-dotted line expresses the predistortion function h(x) in the case where g(h(x)) is made linear as shown by a one-dotted chain line in FIG. 15, and a solid line expresses the predistortion function h(x) in the case in which the method shown in FIG. 18 is used. In this case, N=12. FIG. 26 shows h(x) which has been multiplied by a constant.

Figure 27:
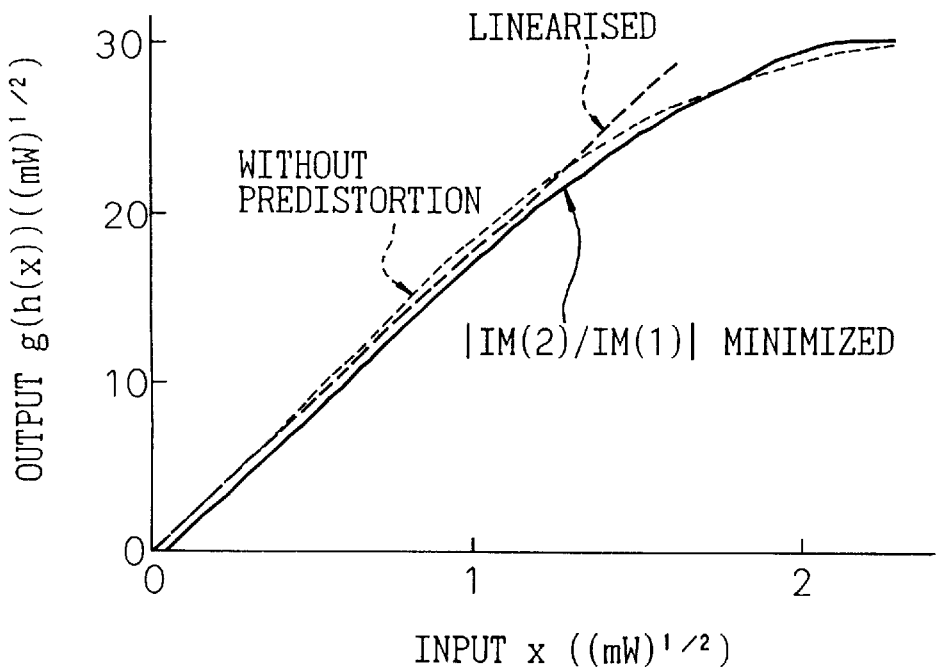
FIG. 27 is a diagram in which amplitudes of outputs of a power amplifier are respectively shown by a short dotted line, long dotted-line and solid line in the three cases described in FIG. 26.

In FIG. 27, the values of g(h(x)) in the above three cases are respectively shown by a short dotted line, long dotted line and solid line.

Figure 28:
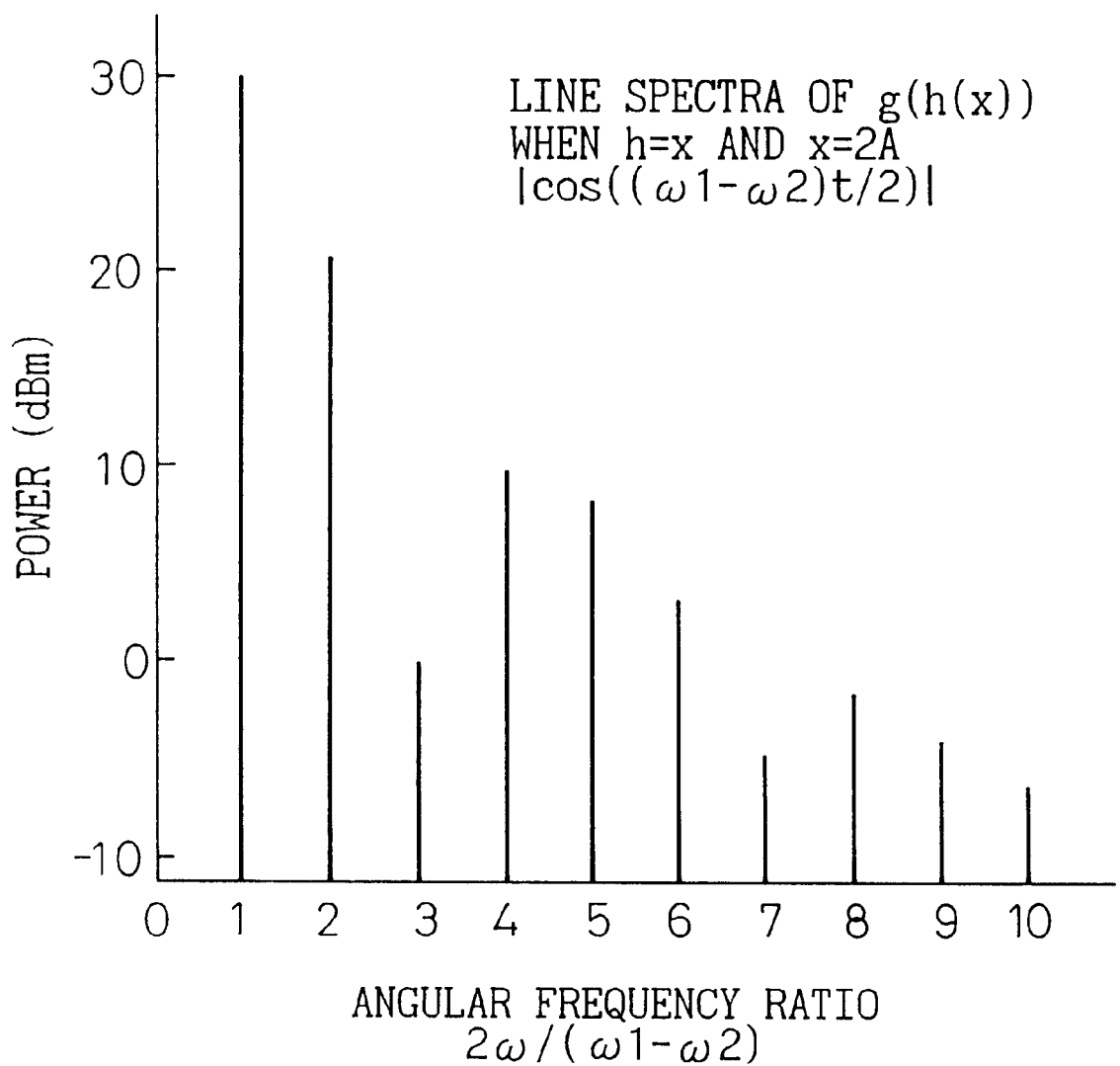
FIG. 28 is a diagram showing a line spectrum of amplitude g(h(x)) of the output of a power amplifier in the case in which the predistortion is not conducted at all when the intermodulation wave amplitude x is $2A|(\cos((\omega 1-\omega 2)t/2)|$.
Figure 29:
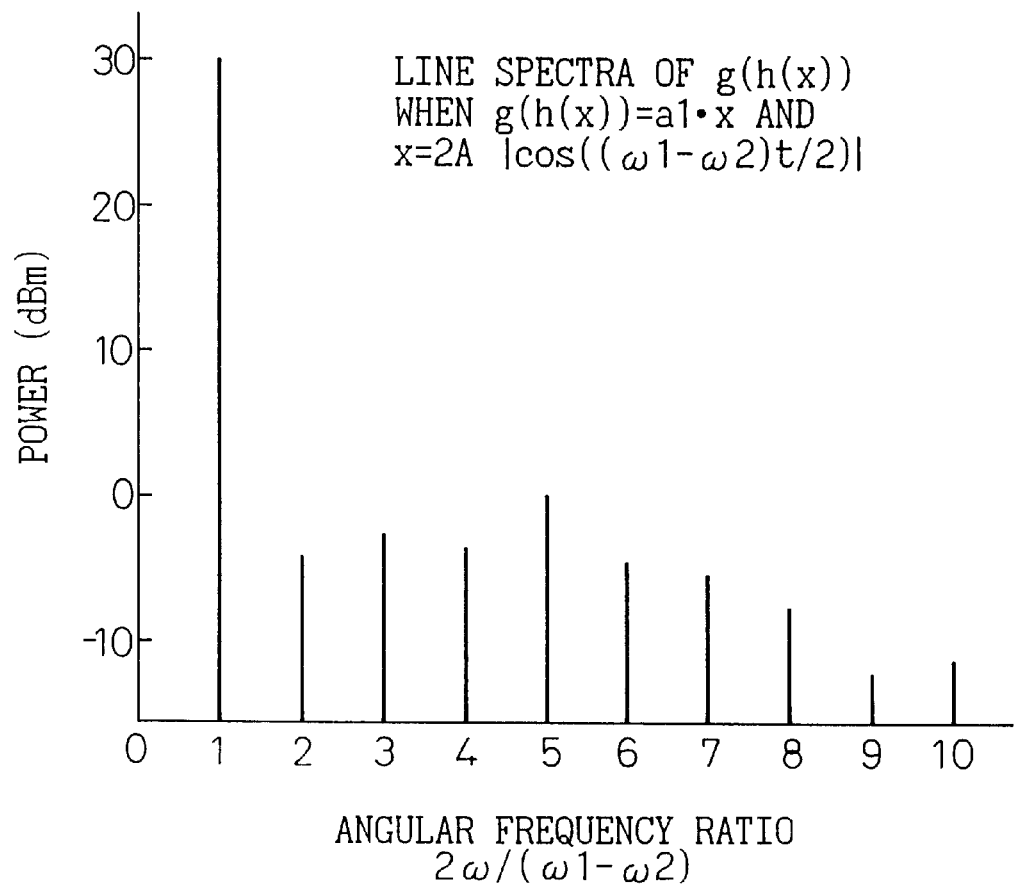
FIG. 29 is a diagram showing a line spectrum of amplitude g(h(x)) of the output of a power amplifier in the case in which g(h(x)) is made linear when the intermodulation wave amplitude x is $2A|(\cos((\omega 1-\omega 2)t/2)|$.
Figure 30:
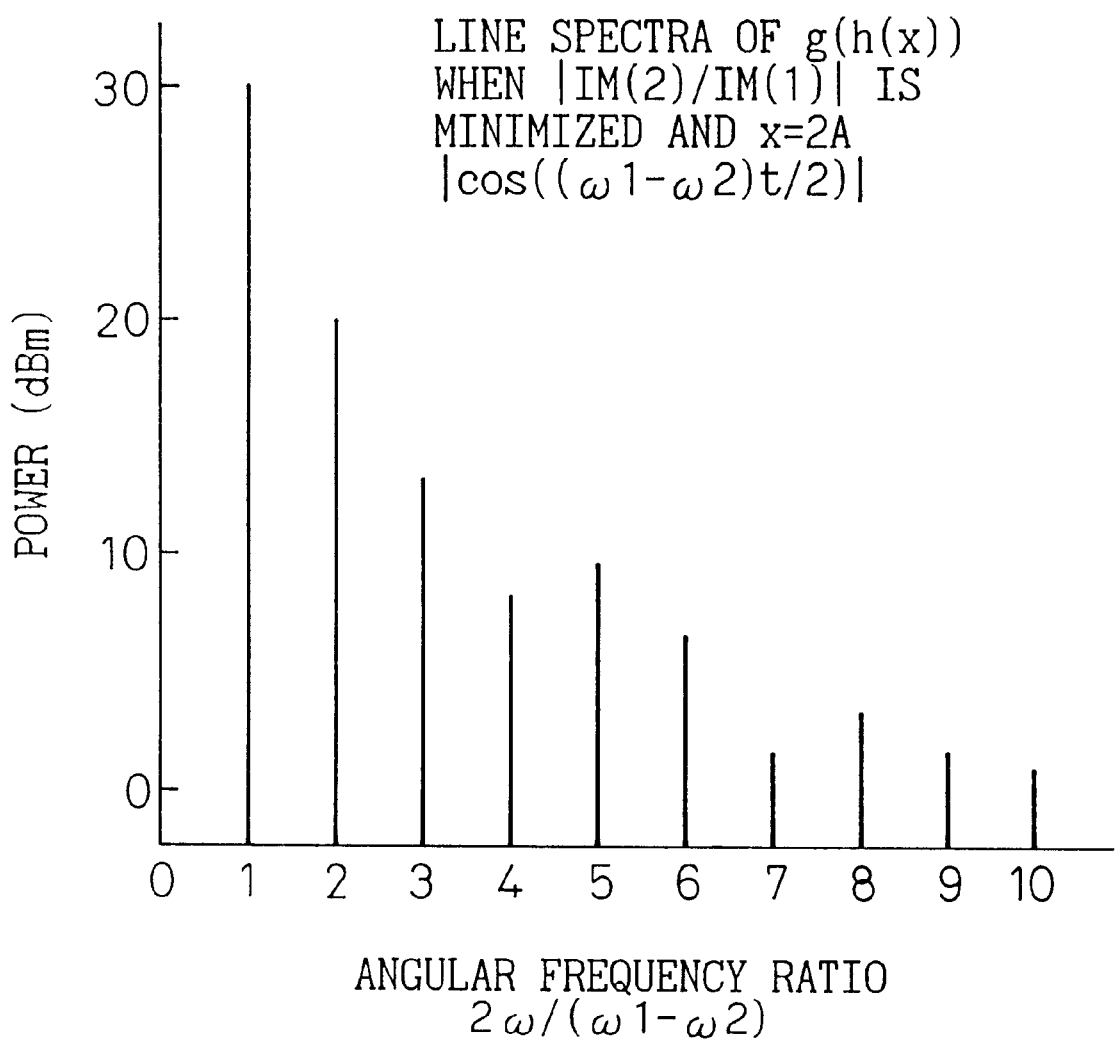
FIG. 30 is a diagram showing a line spectrum of amplitude g(h(x)) of the output of a power amplifier in the case in which |IM(2)/IM(1)| is locally minimized by the method shown in FIG. 18 when the intermodulation wave amplitude x is $2A|(\cos((\omega 1-\omega 2)t/2)|$.

FIGS. 28, 29 and 30 respectively shows a line spectrum of the output amplitude g(h(x)) of the power amplifier 10 in the above three cases when the intermodulation amplitude x is $x=2A|\cos((\omega 1-\omega 2)t/2)|$ as described above. The horizontal axis represents an angular frequency ratio $2\omega/(\omega 1-\omega 2)$.

Figure 31:
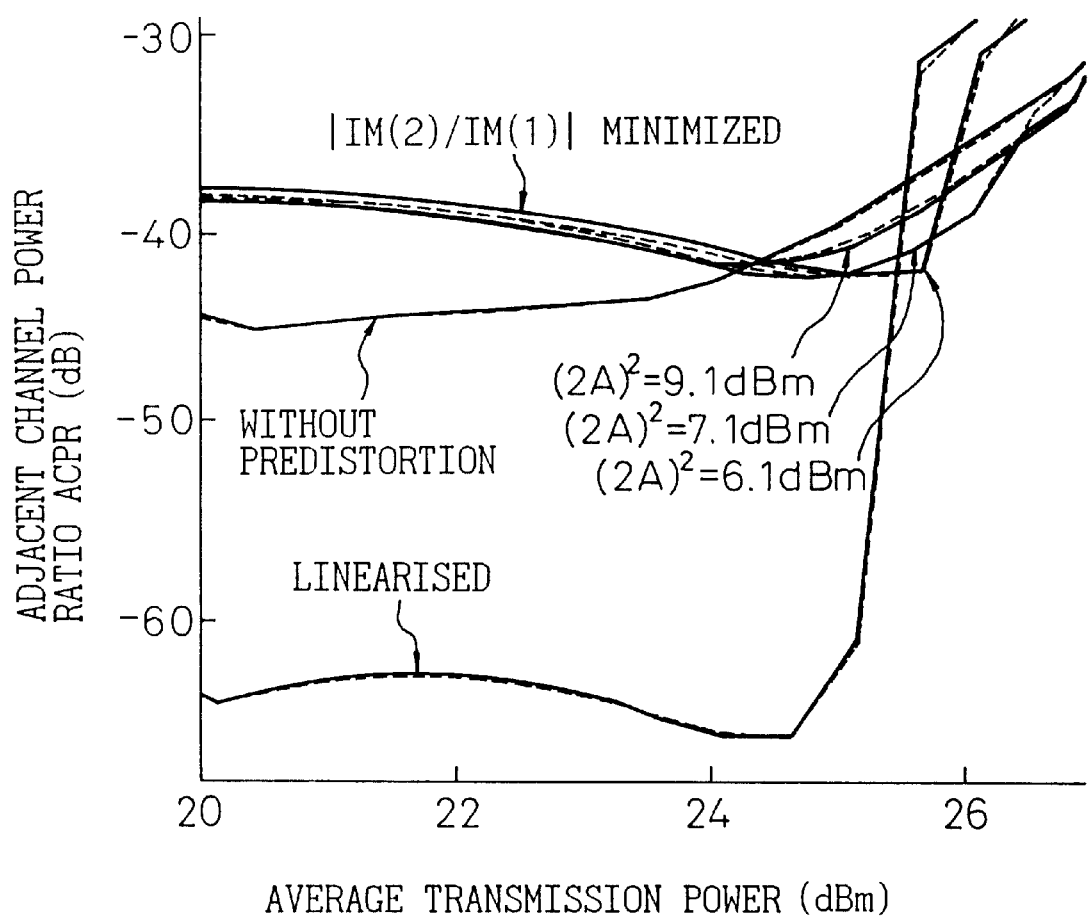
FIG. 31 is a diagram showing a relation between average transmission power and adjacent channel power ratio ACPR in three cases shown in FIG. 26.

FIG. 31 expresses a relation between the average transmitting electric power (average electric power of the output of the power amplifier 10) of a transmitter and the adjoining channel electric power ratio ACPR (adjacent channel power ratio) in the above three cases. ACPR is found by calculating (total of electric power of the side lobe section in a predetermined range)/(total of electric power of the main lobe section) with respect to the frequency spectrum of the output of the power amplifier 10, that is, ACPR shows a degree of interference of the adjoining channel. In each case, a solid line shows a case in which the side lobe is a lower side lobe, and a dotted line shows a case in which the side lobe is an upper side lobe. However, they are substantially symmetrical to each other with respect to the carrier wave frequencies of both side lobes. Therefore, both curves are substantially equal to each other.

As described above, in the case in which the method shown in FIG. 18 is used, h(x) relies on the amplitude 2A of the intermodulation wave amplitude $x=2A|\cos((\omega 1-\omega 2)t/2)|$, and h(x) is found in each of the cases in which electric power (2A) is 6.1, 7.1 and 9.1 dBm, and ACPR is calculated.

In order to prevent interference with the adjoining channel, it is necessary that ACPR is kept at a value, for example, not higher than −40 dBc. As can be seen in FIG. 31, only when the method shown in FIG. 18 is used, it is possible to use the transmitter, at the average transmission power having a value which is in the proximity of 26 dBm. As can be seen, it is preferable to use the predistortion function h(x) in the case where the electric power (2A) is 7.1 dBm. As described above, it is possible to find the average transmitting electric power of the transmitter and the amplitude 2A of the intermodulation wave amplitude x by means of simulation.

As described so far, in the apparatuses for correcting signals according to several preferred embodiments of the present invention, first, the fact that a distortion characteristics of a high-frequency circuit concerning the distortion impairing the linearity can be reproduced using low-pass signals or the like, is noted. A simple circuit designed for processing the low-pass signals is used to estimate the distortion characteristics so as to calculate a distortion correcting function. With low power consumption maintained, and despite circuitry simpler than the conventional circuitry, the distortion impairing linearity, and occurring in a high-frequency circuit, can be suppressed reliably and power leaking out of adjacent channels can be minimized.

In the apparatuses for correcting signals according to several preferred embodiments of the present invention, second, as a distortion correcting function concerning a high-frequency circuit, an amplitude distortion correcting function h(x) is determined so that the relationship of ax=g(h(x)) can be established, or a phase distortion correcting function p(x) is determined so that the relationship of c=g(p(x)) can be established. Amplitude distortion components or phase distortion components which impair the linearity and occur in the high-frequency circuit, can be reliably canceled out.

In the apparatuses for correcting signals according to several preferred embodiments, third, an approximate expression of an envelope transfer function is defined as $g(x)=a_0+a_1x+g'(x)$, and an amplitude distortion correcting function is defined as $x \times (1-g'(x)/g(x))$. It is therefore guaranteed that the amplitude distortion impairing the linearity, and occurring in a high-frequency circuit, can be corrected relative to a wide range of input amplitudes. Consequently, power leaking out of adjacent channels can be minimized.

Furthermore, in the apparatuses for correcting signals according to several preferred embodiments of the present invention, fourth, a polynomial g'(x) in the envelope transfer function $g(x)=a_0+a_1x+g'(x)$ is defined as $$g'(x) = \sum_{i=2}^{N} a_i x^i.$$

If necessary, therefore, coefficients in the polynomial g'(x) having relation to an amplitude distortion correcting function can be readily modified by using a digital signal processor (DSP) or the like.

Furthermore, in the apparatuses for correcting signals according to several preferred embodiments of the present invention, fifth, the phase distortion correcting function p(x) is defined as $p(x)=-g(x)$. Using the simple circuitry for shifting a phase according to a phase distortion correcting function, the phase distortion impairing the linearity, and occurring in a high-frequency circuit, can be reliably suppressed, and power leaking out of adjacent channels can be minimized.

Furthermore, in the apparatuses for correcting signals according to several preferred embodiments of the present invention, sixth, low-pass signals passed by low-pass filters defined on the basis of the result of estimating the distortion characteristics of a high-frequency circuit are used to calculate a phase distortion correcting function. Despite the simple circuitry, the phase distortion impairing the linearity, and occurring in the high-frequency circuit, can be reliably suppressed and power leaking out of adjacent channels can be minimized.

Furthermore, in the apparatuses for correcting signals according to several preferred embodiments of the present invention, seventh, signals passed by transmission filters exhibiting root Nyquist characteristics are used to calculate a phase distortion correcting function p(x). If necessary, therefore, coefficients set to realize the transmission filters can be readily modified. Consequently, phase distortion correction can be carried out quickly and reliably.

Furthermore, in the apparatuses for correcting signals according to several preferred embodiments of the present invention, eighth, after low-pass signals passed by low-pass filters are modulated, a phase distortion correcting function to be applied to low-pass signals substantially identical to the low-pass signals is input to one amplifier. An output signal of the one amplifier and an output signal of the other amplifier are added up. Consequently, the phase distortion impairing the linearity, and occurring in a high-frequency circuit, can be reliably suppressed, and power leaking out of adjacent channels can be minimized.

Furthermore, in the apparatuses for correcting signals according to several preferred embodiments of the present invention, ninth, an amplifier causing no distortion is used to correct the phase distortion impairing the linearity, and occurring in a high-frequency circuit. Despite the simple circuitry, the phase distortion impairing the linearity, and occurring in the high-frequency circuit, can be reliably suppressed, and power leaking out of adjacent channels can be minimized.

Furthermore, in the apparatuses for correcting signals according to several preferred embodiments of the present invention, tenth, the phase distortion impairing the linearity, and occurring in a plurality of amplifiers, can be corrected simultaneously. Despite the simple circuitry, the phase distortion impairing the linearity, and occurring in the plurality of amplifiers, can be corrected quickly and accurately.

Furthermore, in the apparatuses for correcting signals according to several preferred embodiments of the present invention, eleventh, after low-pass signals passed by low-pass filters are modulated, an amplitude distortion correcting function to be applied to low-pass signals substantially identical to the low-pass signals is input to one amplifier. Output signals of the one amplifier and the other amplifier are added up. Consequently, the amplitude distortion impairing the linearity, and occurring in a high-frequency circuit, can be reliably suppressed, and power leaking out of adjacent channels can be minimized.

Furthermore, in the apparatuses for correcting signals according to several preferred embodiments of the present invention, twelfth, low-pass signals passed by low-pass filters defined on the basis of distortion characteristics of a high-frequency circuit are used to calculate an amplitude distortion correcting function and phase distortion correcting function. Despite the simple circuitry, the amplitude distortion and the phase distortion impairing the linearity, and occurring in the high-frequency circuit, can be reliably suppressed, and power leaking out of adjacent channels can be minimized.

Furthermore, in the apparatuses for correcting signals according to several preferred embodiments of the present invention, thirteenth, a common circuit is used to correct the amplitude distortion and the phase distortion impairing the linearity of low-pass signals. Despite the very simple circuitry, the amplitude distortion and the phase distortion impairing the linearity, and occurring in a high-frequency circuit, can be reliably suppressed, and power leaking out of adjacent channels can be suppressed almost perfectly.

Furthermore, in the apparatuses for correcting signals according to several preferred embodiments of the present invention, fourteenth, at least one of an amplitude distortion correcting function h(x) and phase distortion correcting function p(x) is an expansion consisting of a polynomial series. Despite the simple circuitry, approximate values of amplitude distortion components or phase distortion components impairing the linearity, and occurring in a high-frequency circuit, can be calculated. Consequently, the amplitude distortion or the phase distortion impairing the linearity, and occurring in an amplifier, can be corrected quickly and accurately.

Furthermore, in the apparatuses for correcting signals according to several preferred embodiments of the present invention, fifteenth, at least one of an amplitude distortion correcting function h(x) and phase distortion correcting function p(x) is fixed. Despite the simple circuitry, approximate values of amplitude distortion components or phase distortion components impairing the linearity, and occurring in a high-frequency circuit, can be calculated. Consequently, the amplitude distortion or the phase distortion impairing the linearity, and occurring in an amplifier, can be corrected quickly and accurately.

Furthermore, in the apparatuses for correcting signals according to several preferred embodiments of the present invention, sixteenth, even when a plurality of high-frequency circuits are present, at least one of an amplitude distortion correcting function h(x) and phase distortion correcting function p(x) is fixed for each high-frequency circuit or for each group of high-frequency circuits produced under the similar conditions for manufacturing a high-frequency circuit portion. Approximate values of amplitude distortion components and phase distortion components impairing the linearity, and occurring in a high-frequency circuit, can be calculated. Consequently, the amplitude distortion or the phase distortion impairing the linearity, and occurring in an amplifier, can be corrected quickly and accurately.

Furthermore, in the apparatuses for correcting signals according to several preferred embodiments of the present invention, seventeenth, an envelope transfer function g(x) is calculated. If necessary, at least one of an amplitude distortion correcting function h(x) and phase distortion correcting function p(x) is modified. Consequently, the amplitude distortion or the phase distortion impairing linearity, and occurring in an amplifier, can be corrected quickly and accurately.

In the transmitter according to a preferred embodiment of the present invention, first, a distortion characteristic of a high-frequency circuit is estimated by a simple circuit designed for processing low-pass signals. A distortion correcting function is then calculated. With low power consumption maintained, and despite circuitry simpler than the conventional circuitry, the distortion impairing the linearity, and occurring in the high-frequency circuit, can be reliably suppressed, and power leaking out of adjacent channels, can be minimized. Consequently, highly reliable communication can be achieved.

Furthermore, in the transmitter according to a preferred embodiment, second, low-pass signals passed by low-pass filters defined on the basis of the result of estimating the distortion characteristics of a narrow-band amplifier are arranged to have the amplitude distortion or the phase distortion, which impairs the linearity thereof and occurs in the narrow-band amplifier, corrected. With low power consumption maintained, and despite circuitry simpler than the conventional circuitry, the distortion impairing the linearity, and occurring in a high-frequency circuit, can be reliably suppressed, and power leaking out of adjacent channels can be minimized. Consequently, highly reliable communication can be achieved.

Furthermore, in the transmitter according to a preferred embodiment, third, real-part and imaginary-part signals constituting a complex-number signal and passed by low-pass filters defined on the basis of the result of estimating distortion characteristics of a narrow-band amplifier are subjected to digital quadrature modulation. The amplitude distortion and the phase distortion impairing the linearity, and occurring in the narrow-band amplifier, are then corrected simultaneously. The phase distortion correction can therefore be carried out quickly and reliably. Consequently, highly reliable communication can be achieved.

According to a method for correcting signals utilizing any of the preferred embodiments of the present invention, a simple circuit is used to estimate a distortion characteristics of a high-frequency circuit so as to calculate a distortion correcting function. With low power consumption maintained, according to a procedure simpler than a conventional one, the distortion impairing linearity, and occurring in a high-frequency circuit, can be reliably suppressed and power leaking out of adjacent channels can be minimized.

In short, when a class-AB, B, or C amplifier exhibiting good power efficiency is used to correct a distortion characteristics, an apparatus for correcting signals in accordance with the present invention can be used for transmission in a high frequency band. The apparatus for correcting signals in accordance with the present invention has a high-frequency circuit portion that is smaller than that in a conventional linearizer, and can therefore be realized readily. Moreover, an adjustment portion of the apparatus is small and may sometimes be eliminated. Consequently, the apparatus is advantageous in the aspects of reliability, mass-productivity, cost, and power consumption.

An envelope transfer function g(x) can also reproduce distortion components impairing the linearity, and occurring in a modulator, intermediate-frequency circuit, and low-pass filters succeeding distortion characteristics correcting unit. Distortion components occurring in all these circuits can be corrected. Linearity is measured to be followed or predicted, whereby a change in characteristics of a high-frequency circuit whose distortion characteristics are the subject for correction can be coped with. Many processing sequences can be carried out by means of a DSP incorporated in a transmitter. Even when coefficients must be modified, if the modification is carried out intermittently, the increase in the amount of processing is negligible. When the coefficients cannot be modified in a timely fashion, for example, immediately after the power supply is turned on, if a facility for limiting transmission output to such an extent that a magnitude of interception will not exceed a permissible range is included, highly reliable communication can be achieved.

What is claimed is:

1. An apparatus for correcting signals, comprising:
   a unit for estimating distortion characteristics in high-frequency circuit portion which estimates distortion characteristics of a high-frequency circuit portion concerning distortion impairing the linearity; and an input signal processing unit for applying a distortion correcting function, calculated on the basis of the result of estimating the distortion characteristics, to a given input signal, and supplying the input signal to said high-frequency circuit portion so that distortion impairing linearity, and occurring in said high-frequency circuit portion, can be corrected, wherein the input signal is low-pass signals passed by low-pass filters defined on the basis of the result of estimating the distortion characteristics; after the frequencies of the low-pass signals are raised, the low-pass signals are input to a first amplifier in said high-frequency circuit portion; after frequencies relevant to the phase distortion correction function to be applied to low-pass signals substantially identical to the low-pass signals are raised, the low-pass signals are input to a second amplifier in said high-frequency circuit portion; and output signals of said first amplifier and second amplifier are added in order to produce an output signal containing a small number of amplitude distortion components impairing linearity.

2. An apparatus for correcting signals according to claim 1, wherein an envelope transfer function $g(x)$, whose variable x indicates an input amplitude, is calculated in order to reproduce the distortion characteristics of said high-frequency circuit portion; and as the distortion correcting function, based on the envelope transfer function $g(x)$, an amplitude distortion correcting function $h(x)$ used to correct amplitude distortion impairing the linearity, and occurring in said high-frequency circuit portion, is determined so that the relationship of $ax=g(h(x))$ where a is a constant can be established, or a phase distortion correcting function $p(x)$ used to correct phase distortion impairing the linearity, and occurring in said high-frequency circuit portion, is determined so that the relationship of $c=g(p(x))$ where c is a constant can be established.

3. An apparatus for correcting signals, comprising:
a unit for estimating distortion characteristic in high-frequency circuit portion which estimates distortion characteristics of a high-frequency circuit portion concerning at least one of amplitude distortion and phase distortion impairing linearity; and an input signal processing unit for applying at least one of an amplitude distortion correcting function and a phase distortion correcting function, which are calculated on the basis of the result of estimating the distortion characteristics, to a given input signal, and supplying the input signal to said high-frequency circuit portion so that at least one of the amplitude distortion and the phase distortion impairing the linearity, and occurring in said high-frequency circuit portion, can be corrected, wherein the input signal is low-pass signals passed by low-pass filters defined on the basis of the result of estimating the distortion characteristics; after the frequencies of the low-pass signals are raised, the low-pass signals are input to a first amplifier in said high-frequency circuit portion; after frequencies relevant to the phase distortion correction function to be applied to low-pass signals substantially identical to the low-pass signals are raised, the low-pass signals are input to a second amplifier in said high-frequency circuit portion; and output signals of said first amplifier and second amplifier are added in order to produce an output signal containing a small number of amplitude distortion components impairing linearity.

4. An apparatus for correcting signals according to claim 3, wherein an envelope transfer function $g(x)$, whose variable x indicates an input amplitude, is calculated in order to reproduce the distortion characteristics of said high-frequency circuit portion; and based on the envelope transfer function $g(x)$, an amplitude distortion correcting function $h(x)$ used to correct the amplitude distortion impairing the linearity, and occurring in said high-frequency circuit portion, is determined so that the relationship of $ax=g(h(x))$ where a is a constant can be established, or a phase distortion correcting function $p(x)$ used to correct the phase distortion impairing the linearity, and occurring in said high-frequency circuit portion, is determined so that the relationship of $c=g(p(x))$ where c is a constant can be established.

5. An apparatus for correcting signals according to claim 3, wherein an approximate expression of the envelope transfer function $g(x)$, whose variable x indicates an input amplitude, is defined as follows in order to reproduce the distortion characteristics of said high-frequency circuit portion:

$$g(x)=a_0+a_1x+g'(x)$$

where $a_0$ and $a_1$ are constants and $g'(x)$ is a polynomial; and the amplitude distortion correcting function is defined as $x*(1-g'(x)/g(x))$.

6. An apparatus for correcting signals according to claim 5, wherein the constant $a_0$ is set to 0.

7. An apparatus for correcting signals according to claim 5, wherein the polynomial $g'(x)$ in the envelope transfer function $g(x)=a_0+a_1x+g'(x)$ is defined as $g'(x)=\Sigma_{i=2}^{N}a_ix^i$ where i and N are positive integers equal to or larger than 2, and $a_i$ is a constant.

8. An apparatus for correcting signals according to claim 7, wherein only the terms of odd-numbered orders of the polynomial $g'(x)=\Sigma_{i=2}^{N}a_ix^i$ are employed.

9. An apparatus for correcting signals according to claim 3, wherein the phase distortion correcting function $p(x)$ is defined as $p(x)=-g(x)$.

10. An apparatus for correcting signals according to claim 4, wherein said input signal is low-pass signals passed by low-pass filters defined on the basis of the result of estimating the distortion characteristic, and frequencies relevant to the phase distortion correcting function $p(x)$ to be applied to the low-pass signals are raised in order to produce an intermediate-frequency or high-frequency signal for the purpose of correcting the phase distortion impairing the linearity, and occurring in said high-frequency circuit portion.

11. An apparatus for correcting signals according to claim 4, wherein, when frequencies relevant to the phase distortion correcting function $p(x)$ to be applied to the input signal are raised by performing digital modulation, signals passed by transmission filters exhibiting root Nyquist characteristics are used as the input signal.

12. An apparatus for correcting signals according to claim 4, wherein, when frequencies relevant to the phase distortion correcting function $p(x)$ to be applied to the input signal are raised by performing quadrature modulation, a real-part signal and an imaginary-part signal constituting a complex-number signal and passed by low-pass filters, that exhibit root Nyquist characteristics and are defined on the basis of the result of estimating the distortion characteristics, are used as the input signal.

13. An apparatus for correcting signals according to claim 3, wherein said second amplifier causes substantially no distortion, and the phase distortion impairing the linearity, and occurring in said first amplifier alone, is corrected.

14. An apparatus for correcting signals according to claim 3, wherein the phase distortion impairing the linearity, and occurring in said first amplifier, is corrected and the phase distortion impairing the linearity, and occurring in said second amplifier, is also corrected.

15. An apparatus for correcting signals according to claim 3, wherein the input signal is low-pass signals passed by low-pass filters defined on the basis of the result of estimating the distortion characteristics; after the frequencies of the low-pass signals are raised, the low-pass signals are input to a first amplifier in said high-frequency circuit portion; after frequencies relevant to the amplitude distortion correcting function to be applied to low-pass signals substantially identical to the low-pass signals are raised, the low-pass signals are input to a second amplifier in said high-frequency circuit portion; and output signals of said first amplifier and second amplifier are added in order to produce an output signal containing a small number of amplitude distortion components impairing the linearity.

16. An apparatus for correcting signals according to claim 15, wherein said second amplifier causes substantially no distortion, and the amplitude distortion impairing linearity, and occurring in said first amplifier alone, is corrected.

17. An apparatus for correcting signals according to claim 15, wherein the amplitude distortion impairing the linearity, and occurring in said first amplifier, is connected, and the amplitude distortion impairing the linearity, and occurring in said second amplifier, is also corrected.

18. An apparatus for correcting signals according to claim 3, wherein the input signal is low-pass signals passed by low-pass filters defined on the basis of the result of estimating the distortion characteristics; an amplitude distortion correcting function to be applied to said low-pass signals is calculated; and frequencies relevant to a phase distortion correcting function in the amplitude distortion correcting function are raised in order to produce an intermediate-frequency signal or high-frequency signal for the purpose of correcting the amplitude distortion and the phase distortion impairing the linearity, and occurring in said high-frequency circuit portion.

19. An apparatus for correcting signals according to claim 4, wherein the envelope transfer function g(x) is a function including a table function; at least one of the amplitude distortion correcting function h(x) and phase distortion correcting function p(x) is an expansion composed of a polynomial series; coefficients in the terms of orders of the expansion are calculated; and thus at least one of the amplitude distortion correcting function h(x) and phase distortion correcting function p(x) is calculated.

20. An apparatus for correcting signals according to claim 4, wherein at least one of the amplitude distortion correcting function h(x) and phase distortion correcting function p(x) is fixed.

21. An apparatus for correcting signals according to claim 4, wherein, when a plurality of high-frequency circuit portions are included, at least one of the amplitude distortion correcting function h(x) and phase distortion correcting function p(x), is fixed for each high-frequency circuit portion, or for each group of high-frequency circuit portions produced under the similar conditions for manufacturing a high-frequency circuit portion.

22. An apparatus for correcting signals according to claim 4, wherein, when said high-frequency circuit portion is in operation, the envelope transfer function g(x) is calculated intermittently or all the time; and based on the result of calculating the envelope transfer function g(x), at least one of the amplitude distortion correcting function h(x) and phase distortion correcting function p(x) is modified.

23. A method for correcting signals, including the steps of:

estimating distortion characteristics of a high-frequency circuit portion concerning distortion impairing linearity;

applying a distortion correcting function, calculated on the basis of the result of estimating the distortion characteristics, to a given input signal; and supplying the input signal to which the distortion correction function is applied, to said high-frequency circuit portion for the purpose of correcting the distortion impairing the linearity, and occurring in said high-frequency circuit portion, wherein the input signal is low-pass signals passed by low-pass filters defined on the basis of the result of estimating the distortion characteristics; after the frequencies of the low-pass signals are raised, the low-pass signals are input to a first amplifier in said high-frequency circuit portion; after frequencies relevant to the phase distortion correction function to be applied to low-pass signals substantially identical to the low-pass signals are raised, the low-pass signals are input to a second amplifier in said high-frequency circuit portion; and output signals of said first amplifier and second amplifier are added in order to produce an output signal containing a small number of amplitude distortion components impairing linearity.

24. A method for correcting signals, including the steps of:

estimating distortion characteristics of a high-frequency circuit portion concerning at least one of amplitude distortion and phase distortion impairing linearity;

applying at least one of an amplitude distortion correcting function and phase distortion correcting function, calculated on the basis of the result of estimating the distortion characteristics, to a given input signal; and supplying the input signal to which at least one of the amplitude distortion correcting function and phase distortion correcting function is applied, to said high-frequency circuit portion for the purpose of correcting at least one of the amplitude distortion and the phase distortion impairing the linearity, and occurring in said high-frequency circuit portion, wherein the input signal is low-pass signals passed by low-pass filters defined on the basis of the result of estimating the distortion characteristics; after the frequencies of the low-pass signals are raised, the low-pass signals are input to a first amplifier in said high-frequency circuit portion; after frequencies relevant to the phase distortion correction function to be applied to low-pass signals substantially identical to the low-pass signals are raised, the low-pass signals are input to a second amplifier in said high-frequency circuit portion; and output signals of said first amplifier and second amplifier are added in order to produce an output signal containing a small number of amplitude distortion components impairing linearity.

25. An apparatus for compensating for distortion to which an in-phase component xi and an orthogonal component xq that have been filtered by a low-pass filter, are supplied, having a function of previously distorting the in-phase component and the orthogonal component so that non-linearity of a power amplifier arranged on the downstream side can be improved, said apparatus comprising:

an absolute value calculating unit for calculating an intensity of vector (xi, xq); and a predistortion unit in which a function h(x)/x obtained when a predetermined predistortion function h(x) is divided by the above intensity x is used or its reference table is used, for multiplying an output xi, xq of the low-pass filter by h(x)/x.

26. An apparatus for compensating for distortion according to claim 25, further comprising a phase pre-rotation unit in which a predetermined function or its reference table is used, and the vector (xi, xq) or the vector ((h/x)xi, (h/x)xq) generated in the above predistortion unit is rotated by angle φ(x).

27. A digital signal processor characterized in that a function of the apparatus for compensating for distortion described in claim 25 is realized by a program.

28. A digital signal processor characterized in that a function of the apparatus for compensating for distortion described in claim 26 is realized by a program.

29. An apparatus preparing distortion compensation data comprising a processor (2B), wherein, in order to improve nonlinearity of the power amplifier, the processor (2B) is used for an apparatus for compensating for distortion in which the amplitude x of a signal on the upstream side of the power amplifier is previously distorted to the value of the predistortion function h(x); when the output amplitude with respect to the input amplitude x of the power amplifier is expressed by the function g(x), the predistortion function h(x) is made to be approximate to a power development of the amplitude x; the power development coefficients $c_1$ to $c_n$ are given initial values; the amplitude x is made to be an amplitude of the inter-modulation wave of the base band signals, the angular frequencies of which are $\omega_1$ and $\omega_2$; and the power development coefficients $c_1$ to $c_n$ of the predistortion function h(x) are determined so that an absolute value ε of the ratio of the primary Fourier coefficient of the function g(h(x)) with respect to the second Fourier coefficient can be substantially a minimum.

30. An apparatus for preparing distortion compensation data according to claim 29, wherein an amplitude of the intermodulation wave is determined according to the maximum value of the input amplitude of the power amplifier.

* * * * *